US008645145B2

(12) United States Patent
Subbaraman et al.

(10) Patent No.: US 8,645,145 B2
(45) Date of Patent: Feb. 4, 2014

(54) AUDIO ENCODER, AUDIO DECODER, METHOD FOR ENCODING AND AUDIO INFORMATION, METHOD FOR DECODING AN AUDIO INFORMATION AND COMPUTER PROGRAM USING A HASH TABLE DESCRIBING BOTH SIGNIFICANT STATE VALUES AND INTERVAL BOUNDARIES

(75) Inventors: Vignesh Subbaraman, Germering (DE); Guillaume Fuchs, Erlangen (DE); Markus Multrus, Nuremberg (DE); Nikolaus Rettelbach, Nuremberg (DE); Marc Gayer, Erlangen (DE); Oliver Weiss, Nuremberg (DE); Christian Griebel, Nuremberg (DE); Patrick Warmbold, Emskirchen (DE)

(73) Assignee: Fraunhoffer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 13/547,600

(22) Filed: Jul. 12, 2012

(65) Prior Publication Data

US 2013/0013301 A1 Jan. 10, 2013

Related U.S. Application Data

(63) Continuation of application No. PCT/EP2011/050272, filed on Jan. 11, 2011.

(60) Provisional application No. 61/294,357, filed on Jan. 12, 2010.

(51) Int. Cl.

| | |
|---|---|
| ***G10L 21/00*** | (2013.01) |
| ***G10L 21/04*** | (2013.01) |
| ***H03M 7/34*** | (2006.01) |
| ***H03M 7/08*** | (2006.01) |
| ***H03M 7/00*** | (2006.01) |
| ***G06F 17/00*** | (2006.01) |
| ***G06F 9/26*** | (2006.01) |

(52) U.S. Cl.

USPC ........... 704/500; 704/211; 704/219; 704/220; 704/229; 704/230; 704/501; 704/502; 704/503; 704/504; 341/51; 341/106; 341/107; 700/94; 711/202; 711/203

(58) Field of Classification Search

USPC ............. 704/229, 230, 500–504; 341/51, 107

See application file for complete search history.

(56) References Cited

U.S. PATENT DOCUMENTS 5,222,189 A 6/1993 Fielder
5,388,181 A 2/1995 Anderson et al.

(Continued)

FOREIGN PATENT DOCUMENTS

CN 101015216 8/2007
CN 101160618 4/2008

(Continued)

OTHER PUBLICATIONS

Quackenbush, et al., "Revised Report on Complexity of MPEG-2 AAC Tools", ISO/IEC JTC1/SC29/WG11 N2005, MPEG98, Feb. 1998, San José.

(Continued)

*Primary Examiner* — Paras D Shah

(74) *Attorney, Agent, or Firm* — Michael A. Glenn; Perkins Coie LLP

(57) ABSTRACT

An audio decoder includes an arithmetic decoder for providing a plurality of decoded spectral values on the basis of an arithmetically encoded representation of the spectral values, and a frequency-domain-to-time-domain converter for providing a time-domain audio representation using the decoded spectral values. The arithmetic decoder selects a mapping rule describing a mapping of a code value onto a symbol code in dependence on a context state described by a numeric current context value. The arithmetic decoder determines the numeric current context value in dependence on a plurality of previously decoded spectral values. The arithmetic decoder evaluates a hash table, entries of which define both significant state values and boundaries of intervals of numeric context values, in order to select the mapping rule. A mapping rule index value is individually associated to a numeric context value being a significant state value.

18 Claims, 59 Drawing Sheets

(56) References Cited

U.S. PATENT DOCUMENTS

| | | | | |
|---|---|---|---|---|
| 5,659,659 | A | 8/1997 | Kolesnik et al. | |
| 6,029,126 | A | 2/2000 | Malvar | |
| 6,061,398 | A | 5/2000 | Satoh et al. | |
| 6,075,471 | A * | 6/2000 | Kimura et al. | 341/107 |
| 6,217,234 | B1 | 4/2001 | Dewar et al. | |
| 6,424,939 | B1 | 7/2002 | Herre et al. | |
| 6,538,583 | B1 | 3/2003 | Hallmark et al. | |
| 6,646,578 | B1 | 11/2003 | Au | |
| 6,864,813 | B2 * | 3/2005 | Horie | 341/107 |
| 7,079,057 | B2 * | 7/2006 | Kim et al. | 341/107 |
| 7,088,271 | B2 * | 8/2006 | Marpe et al. | 341/107 |
| 7,132,964 | B2 * | 11/2006 | Tsuru | 341/67 |
| 7,262,721 | B2 * | 8/2007 | Jeon et al. | 341/107 |
| 7,283,073 | B2 * | 10/2007 | Chen | 341/107 |
| 7,304,590 | B2 * | 12/2007 | Park | 341/107 |
| 7,330,139 | B2 | 2/2008 | Kim et al. | |
| 7,365,659 | B1 * | 4/2008 | Hoffmann et al. | 341/107 |
| 7,516,064 | B2 | 4/2009 | Vinton et al. | |
| 7,528,749 | B2 * | 5/2009 | Otsuka | 341/107 |
| 7,528,750 | B2 * | 5/2009 | Kim et al. | 341/107 |
| 7,554,468 | B2 * | 6/2009 | Xu | 341/107 |
| 7,617,110 | B2 * | 11/2009 | Kim et al. | 704/501 |
| 7,656,319 | B2 * | 2/2010 | Yu et al. | 341/107 |
| 7,660,720 | B2 | 2/2010 | Oh et al. | |
| 7,714,753 | B2 * | 5/2010 | Lu | 341/107 |
| 7,777,654 | B2 * | 8/2010 | Chang | 341/107 |
| 7,808,406 | B2 * | 10/2010 | He et al. | 341/107 |
| 7,821,430 | B2 * | 10/2010 | Sakaguchi | 341/107 |
| 7,839,311 | B2 * | 11/2010 | Bao et al. | 341/107 |
| 7,840,403 | B2 * | 11/2010 | Mehrotra et al. | 704/222 |
| 7,864,083 | B2 * | 1/2011 | Mahoney | 341/87 |
| 7,903,824 | B2 | 3/2011 | Faller et al. | |
| 7,932,843 | B2 * | 4/2011 | Demircin et al. | 341/107 |
| 7,948,409 | B2 * | 5/2011 | Wu et al. | 341/120 |
| 7,979,271 | B2 | 7/2011 | Bessette | |
| 7,982,641 | B1 * | 7/2011 | Su et al. | 341/107 |
| 7,991,621 | B2 | 8/2011 | Oh et al. | |
| 8,018,996 | B2 * | 9/2011 | Chiba | 375/240.02 |
| 8,149,144 | B2 | 4/2012 | Mittal et al. | |
| 8,224,658 | B2 | 7/2012 | Lei et al. | |
| 8,301,441 | B2 | 10/2012 | Vos | |
| 8,321,210 | B2 | 11/2012 | Grill et al. | |
| 2002/0016161 | A1 | 2/2002 | Dellien et al. | |
| 2003/0093451 | A1 | 5/2003 | Chuang et al. | |
| 2003/0206582 | A1 | 11/2003 | Srinivasan et al. | |
| 2004/0044527 | A1 | 3/2004 | Thumpudi et al. | |
| 2004/0044534 | A1 | 3/2004 | Chen et al. | |
| 2004/0114683 | A1 | 6/2004 | Schwarz et al. | |
| 2004/0184544 | A1 | 9/2004 | Kondo et al. | |
| 2005/0088324 | A1 * | 4/2005 | Fuchigami et al. | 341/107 |
| 2005/0117652 | A1 | 6/2005 | Schwarz et al. | |
| 2005/0192799 | A1 | 9/2005 | Kim et al. | |
| 2005/0203731 | A1 | 9/2005 | Oh et al. | |
| 2005/0231396 | A1 | 10/2005 | Dunn | |
| 2005/0289063 | A1 | 12/2005 | Lecomte et al. | |
| 2006/0047704 | A1 | 3/2006 | Gopalakrishnan | |
| 2006/0173675 | A1 | 8/2006 | Ojanpera et al. | |
| 2006/0232452 | A1 * | 10/2006 | Cha | 341/50 |
| 2006/0238386 | A1 | 10/2006 | Huang et al. | |
| 2006/0284748 | A1 | 12/2006 | Kim et al. | |
| 2007/0016427 | A1 | 1/2007 | Thumpudi et al. | |
| 2007/0036228 | A1 | 2/2007 | Tseng | |
| 2007/0094027 | A1 | 4/2007 | Vasilache | |
| 2007/0126853 | A1 | 6/2007 | Ridge et al. | |
| 2007/0282603 | A1 | 12/2007 | Bessette et al. | |
| 2008/0094259 | A1 | 4/2008 | Yu et al. | |
| 2008/0133223 | A1 | 6/2008 | Son et al. | |
| 2008/0243518 | A1 | 10/2008 | Oraevsky et al. | |
| 2008/0267513 | A1 | 10/2008 | Sankaran | |
| 2009/0157785 | A1 | 6/2009 | Reznik et al. | |
| 2009/0190780 | A1 | 7/2009 | Nagaraja et al. | |
| 2009/0192790 | A1 | 7/2009 | El-Maleh et al. | |
| 2009/0192791 | A1 | 7/2009 | El-Maleh et al. | |
| 2009/0234644 | A1 | 9/2009 | Reznik et al. | |
| 2009/0299756 | A1 | 12/2009 | Davis et al. | |
| 2009/0299757 | A1 | 12/2009 | Guo et al. | |
| 2010/0007534 | A1 | 1/2010 | Girardeau, Jr. | |
| 2010/0070284 | A1 | 3/2010 | Oh et al. | |
| 2010/0088090 | A1 | 4/2010 | Ramabadran | |
| 2010/0256980 | A1 | 10/2010 | Oshikiri et al. | |
| 2010/0262420 | A1 | 10/2010 | Herre et al. | |
| 2010/0324912 | A1 | 12/2010 | Choo et al. | |
| 2011/0137661 | A1 | 6/2011 | Morii et al. | |
| 2011/0153333 | A1 | 6/2011 | Bessette et al. | |
| 2011/0238426 | A1 | 9/2011 | Fuchs et al. | |
| 2011/0320196 | A1 | 12/2011 | Choo et al. | |
| 2012/0033886 | A1 | 2/2012 | Balster et al. | |
| 2012/0069899 | A1 | 3/2012 | Mehrotra et al. | |
| 2012/0195375 | A1 | 8/2012 | Wuebbolt | |
| 2012/0207400 | A1 | 8/2012 | Sasai et al. | |
| 2012/0215525 | A1 | 8/2012 | Jiang et al. | |
| 2012/0245947 | A1 | 9/2012 | Neuendorf et al. | |
| 2012/0265540 | A1 | 10/2012 | Fuchs et al. | |
| 2012/0278086 | A1 | 11/2012 | Fuchs et al. | |
| 2012/0330670 | A1 | 12/2012 | Fuchs et al. | |
| 2013/0010983 | A1 | 1/2013 | Disch et al. | |
| 2013/0013301 | A1 | 1/2013 | Subbaraman et al. | |
| 2013/0013322 | A1 | 1/2013 | Fuchs et al. | |
| 2013/0013323 | A1 | 1/2013 | Subbaraman et al. | |

FOREIGN PATENT DOCUMENTS

| | | |
|---|---|---|
| JP | 2005223533 | 8/2005 |
| JP | 2008506987 | 3/2008 |
| JP | 2009518934 | 5/2009 |
| JP | 2013507808 | 3/2013 |
| TW | 200746871 | 12/2007 |
| TW | I302664 | 11/2008 |
| TW | 200947419 | 11/2009 |
| WO | WO-2006006936 | 1/2006 |
| WO | WO-2007066970 | 6/2007 |
| WO | WO-2008150141 | 12/2008 |
| WO | WO 2011/048098 | 4/2011 |
| WO | WO 2011/048099 | 4/2011 |
| WO | WO 2011/048100 | 4/2011 |
| WO | WO-2011042366 | 4/2011 |

OTHER PUBLICATIONS

Sayood, K., "Introduction to Data Compression", Third Edition, 2006, Elsevier Inc.

Meine, Nikolaus et al.: "Improved Quantization and lossless coding for subband audio coding", May 31, 2005, XP008071322.

Neuendorf, Max et al.: "A Novel Scheme for Low Bitrate Unified Speech and Audio Coding—MPEG RMO", May 1, 2009, XP040508995.

Neuendorf, Max et al., "Detailed Technical Description of Reference Model 0 of the CfP on Unified Speech and Audio Coding (USAC)", ISO/IEC JTC1/SC29/WG11, MPEG2008/M15867, Busan, South Korea, Oct. 2008, 100 pp.

Wubbolt, Oliver , "Spectral Noiseless Coding CE: Thomson Proposal", ISO/IEC JTC1/SC29/WG11, MPEG2009/M16953, Xian, China, Oct. 2009, 20 pp.

"Subpart 4: General Audio Coding (GA)—AAC, TwinVQ, BSAC", ISO/IEC 14496-3:2005, Dec. 2005, pp. 1-344.

Imm, et al., "Lossless Coding of Audio Spectral Coeeficients using Selective Bitplane Coding", Proc. 9th Int'l Symposium on Communications and Information Technology, IEEE, Sep. 2009, pp. 525-530.

Lu, M. et al., "Dual-mode switching used for unified speech and audio codec", Int'l Conference on Audio Language and Image Processing 2010 (ICALIP), Nov. 23-25, 2010, pp. 700-704.

Neuendorf, et al., "Detailed Technical Description of Reference Model 0 of the CfP on Unified Speech and Audio Coding (USAC)", Int'l Organisation for Standardisation ISO/IEC JTC1/SC29/WG11 Coding of Moving Pictures and Audio, MPEG2008/M15867, Busan, South Korea, Oct. 2008, 95 pages.

Neuendorf, et al., "Unified Speech and Audio Coding Scheme for High Quality at Low Bitrates", IEEE Int'l Conference on Acoustics, Speech and Signal Processing, Apr. 19-24, 2009, 4 pages.

(56) References Cited

OTHER PUBLICATIONS

Oger, M. et al., “Transform Audio Coding with Arithmetic-Coding Scalar Quantization and Model-Based Bit Allocation”, IEEE Int’l Conference on Acoustics, Speech and Signal Processing 2007 (ICASSP 2007); vol. 4, Apr. 15-20, 2007, pp. IV-545-IV-548.
Shin, Sang-Wook et al., “Designing a unified speech/audio codec by adopting a single channel harmonic source separation module”, Acoustics, Speech and Signal Processing, 2008. ICASSP 2008. IEEE International Conference, IEEE, Piscataway, NJ, USA, Mar. 31-Apr. 4, 2008, pp. 185-188.
Yang, D et al., “High-Fidelity Multichannel Audio Coding”, EURASIP Book Series on Signal Processing and Communications. Hindawi Publishing Corporation., 2006, 12 Pages.
Yu, , “MPEG-4 Scalable to Lossless Audio Coding”, 117th AES Convention, Oct. 31, 2004, XP040372512, 1-14.

* cited by examiner

AUDIO ENCODER

AUDIO ENCODER

| FIG 2 | |
|---|---|
| FIG 2A | FIG 2B |

AUDIO DECODER

AUDIO DECODER

| FIG 2 | |
|---|---|
| FIG 2A | FIG 2B |

```
values_decode()
{
310 →   c = arith_map_context(N, arith_reset_flag);

        for (i=0; i<lg/2; i++) {
312         /* MSB decoding */
312a        c = arith_get_context (c,i,N);
312b        for (lev=esc_nb=0;;) {
312ba           pki = arith_get_pk(c+esc_nb<<17)

                cum_freq = table_start_position (pki);
                cfl = table_lengh (pki);
                m = arith_decode ();                      use between
                                                          1 and 20 bits
                                                          of bits acod_m

                if ( m != ARITH_ESCAPE)
                    break;
                lev += 1;
                if ( (esc_nb=lev)>7 )
                    esc_nb=7;
            }
312bb       b = m>>2
            a = m-(b<<2)

312c        /* ARITH_STOP symbol detection */
            if (m==0 && lev>0)
                break;

312d        /* LSB decoding */
            for (l=lev; l>0; l--) {
312da           cum_freq = arith_cf_r;
                cfl = 4i
                r = arith_decode ();
                a=(a<<1)|(r&1);
                b=(b<<1)|((r>>1)&1);
            }
312e        x_ac_dec[2*i] = a;
            x_ac_dec[2*i+1] = b;
313 →       arith_update_context(i,a,b);
        }
315 →   arith_finish (x_ac_dec,i,N);

314     /* Signs decoding */
        for (i=0; i<lg; i++) {
            if (x_ac_dec[i] != 0) {
                s = read_bitstream;
                if (s==1) {x_ac_dec[i] *= -1; }
            }
        }
}
```

FIG 3

CONTEXT FOR THE STATE CALCULATION

```
/*Input variables*/
N /*Length of the current window*/
arith_reset_flag /*Arithmetic coder reset flag*/

/*Global variables*/
previous_N /*Length of the previous window */

c = arith_map_context(N,arith_reset_flag)
{
    if (arith_reset_flag) {
500a    for (j=0; j<N/4; j++) {
            q[0][j]=0;
        }
    } else {
        ratio = ((float)previous_N) / ((float)N);
500b    for (j=0; j<N/4; j++) {
            k = (int) ((float) j * ratio);
            q[0][j] = q[1][k];
        }
    }

    previous_N=N;

    return(q[0][0]<<12);
}
```

FIG 5A

```
/*Input variables*/
lg /*Number of sepctral coefficients to decode in the frame*/
arith_reset_flag /*Arithmetic coder reset flag*/
/*Global variables*/
previous_lg /*Previous number of spectral lines of the previous frame*/

c=arith_map_context (lg,arith_reset_flag)
{
   v=w=0

   if(arith_reset_flag){
      for(j=0; j<lg/2; j++){
         q[0][v++]=0;
      }
   else{
      ratio= ((float)previous_lg)/((float)lg);
      for(j=0; j<lg/2; j++){
         k = (int) ((float)) ((j)*ratio);
         q[0][v++] = qs[w+k];
      }
   }

   previous_lg=lg;

   return(q[0][0]<<12);
}
```

FIG 5B

504

```
/*Input variables*/
c /*old state context*/
i /*Index of the 2-tuple to decode in the vector*/
N /*Window Length*/

/*Output value*/
c /*updated state context*/

c = arith_get_context(c,i,N)
{
504a    c = c>>4;
        if(i<N/4-1)
504b        c = c + (q[0][i+1]<<12);
504c    c = (c&0xFFF0);

        if(i>0)
504d        c = c + (q[1][i-1]);

        if (i > 3) {
            if ((q[1][i-3] + q[1][i-2] + q[1][i-1]) < 5)
504e            return(c+0x10000);
        }

504f    return (c);
}
```

FIG 5C

```
/*Input variables*/
c /*old state context*/
i /*Index of the 2-tuple to decode in the vector*/
/*Output value*/
c /*updated state context*/


c=arith_get_context(c,i)
{
    c=c>>4;
    c=(c)+(q[0][i+1]<<12);
    c=(c&0xFFF0)+(q[1][i-1]);

    if(i > 3) {
        if((q[1][i-3] + q[1][i-2] + q[1][i-1]) < 5)
            return(c+0x10000);
    }

    return(c);
}
```

FIG 5D

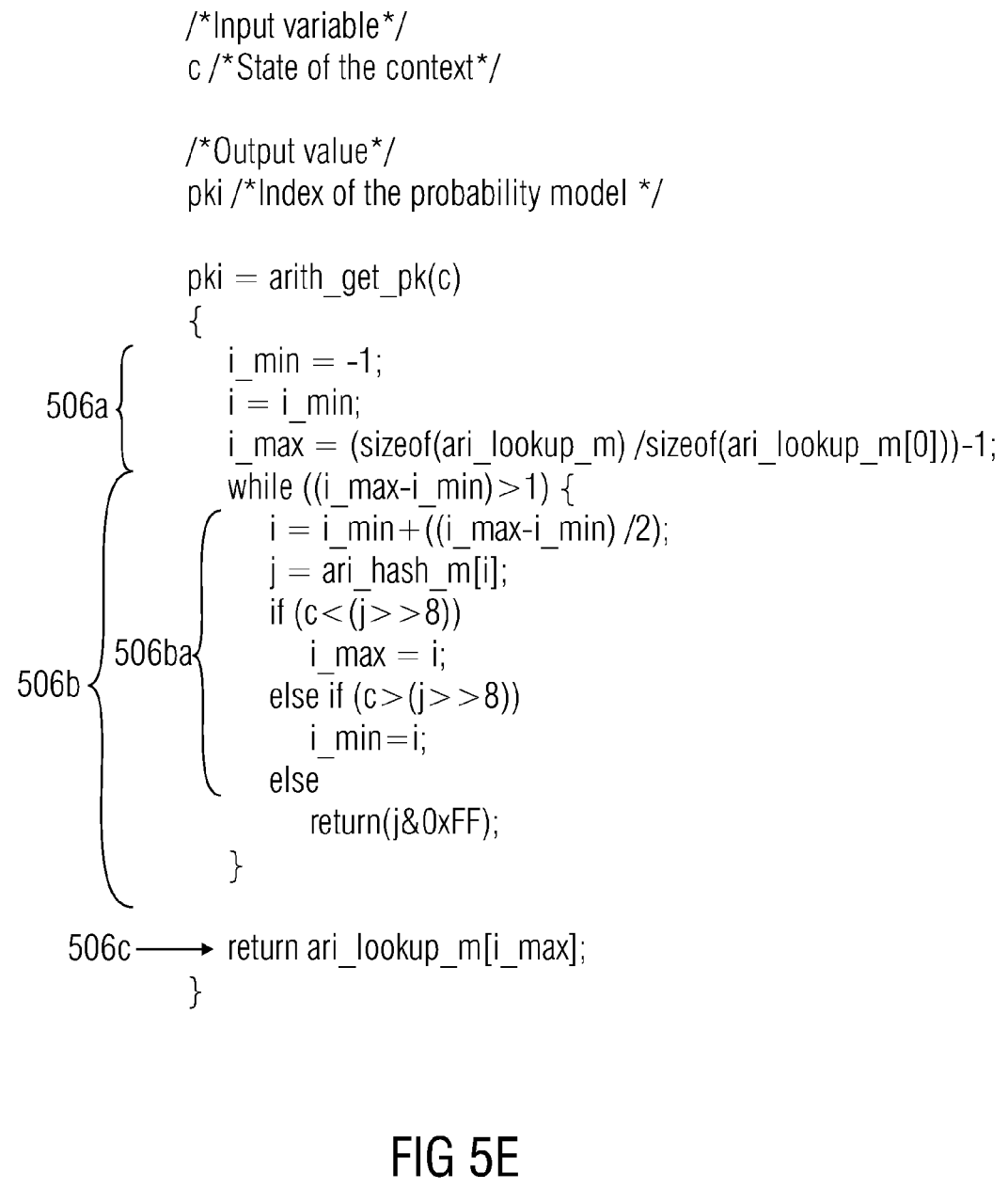

```
/*Input variable*/
c /*State of the context*/

/*Output value*/
pki /*Index of the probability model */

pki = arith_get_pk(c)
{
    i_min = -1;
    i = i_min;
    i_max = (sizeof(ari_lookup_m) /sizeof(ari_lookup_m[0]))-1;
    while ((i_max-i_min)>1) {
        i = i_min+((i_max-i_min) /2);
        j = ari_hash_m[i];
        if (c<(j>>8))
            i_max = i;
        else if (c>(j>>8))
            i_min=i;
        else
            return(j&0xFF);
    }
    return ari_lookup_m[i_max];
}
```

FIG 5E

```
/*Input variable*/
c /*State of the context*/
/*Output value*/
pki /*Index of the probability model */
/*constants*/
i_diff[]={ 299, 149, 74, 37, 18, 9, 4, 2, 1};

pki=arith_get_pk(c) {
    i_min=0;
508a    s=c<<8;
    for(k=0;k<9;k++) {
        i=i_min+i_diff[k];
        j=ari_hash_m[i];
508b 508ba  if(s>j) {
            i_min=i+1;
        }
    }

    j=ari_hash_m[i_min];
    if(s>j)
        return(ari_lookup_m[i_min+1]);
508c else if(c<(j>>8))
        return(ari_lookup_m[i_min]);
    else
        return(j&0xFF);
}
```

FIG 5F

```
/*helper functions*/
bool arith_first_symbol(void);
    /* Return TRUE if it is the first symbol of the sequence,
        FALSE otherwise */
Ushort arith_get_next_bit(void);
    /* Get the next bit of the bitstream */

/* global variables */
low
high
value

/* input variables */
cum_freq[]; /* cumulative frequencies table */
cfl; /* length of cum_freq[] */

symbol = arith_decode(cum_freq, cfl)
{
    if (arith_first_symbol()) {
        value = 0;
        for (i=1; i<=16; i++) {
            value = (val<<1) | arith_get_next_bit();          570a
        }
        low   = 0;
        high  = 65535;
    }

    range = high-low+1;
    cum =((((int) (value-low+1))<<14)-((int) 1))/range;       570b
    p = cum_freq-1;
```

FIG 5G(1)

| FIG 5G(1) | FIG 5G |
|---|---|
| FIG 5G(2) | |

```
570c    do {
            q = p + (cfl>>1);
            if ( *q > cum ) {p=q; cfl++; }
            cfl>>=1;
        }
        while ( cfl>1 );

570d    symbol = p-cum_freq+1;
570e    if (symbol)
            high = low + (range*cum_freq[symbol-1])>>14 - 1;

        low += (range * cum_freq[symbol])>>14;

570f    for (;;) {
570fa       if (high<32768) {}
            else if (low>=32768) {
                value -= 32768;
                low   -= 32768;
                high  -= 32768;
            }
            else if (low>=16384 && high<49152) {
                value -= 16384;
                low   -= 16384;
                high  -= 16384;
            }
            else break;

570fb       low += low;
            high += high+1;
            value = (value<<1) | arith_get_next_bit();
        }
        return symbol;
    }
```

FIG 5G(2)

| FIG 5G(1) | FIG 5G |
|---|---|
| FIG 5G(2) | |

```
/*helper functions*/
bool arith_first_symbol(void);
    /* Return TRUE if it is the first symbol of the sequence,
    FALSE otherwise */
Ushort arith_get_next_bit(void);
    /* Get the next bit of the bitstream */

/* global variables */
low
high
value

/* input variables */
cum_freq[]; /* cumulative frequencies table */
cfl; /* length of cum_freq[] */

symbol = arith_decode(cum_freq, cfl)
{
    if (arith_first_symbol()) {
        value = 0;
        for (i=1; i<=16; i++) {
            value = (val<<1) | arith_get_next_bit();
        }
        low   = 0;
        high  = 65535;
    }

    range = high-low+1;
    cum =((((int) (value-low+1))<<14)-((int) 1));
    p = cum_freq-1;

    do {
        q = p + (cfl>>1);
        if ( *q *range > cum ) {p=q; cfl++; }
        cfl>>=1;
    }
```

<CONTINUED IN FIG 5I>

FIG 5H

<CONTINUATION FROM FIG 5H>

```
    while ( cfl>1 );

    symbol = p-cum_freq+1;
    if (symbol)
        high = low + (range*cum_freq[symbol-1])>>14 - 1;

    low += (range * cum_freq[symbol])>>14;

    for (;;) {
        if (high<32768) {}
        else if (low>=32768) {
            value -= 32768;
            low   -= 32768;
            high  -= 32768;
        }
        else if (low>=16384 && high<49152) {
            value -= 16384;
            low   -= 16384;
            high  -= 16384;
        }
        else break;

        low += low;
        high += high+1;
        value = (value<<1) | arith_get_next_bit();
    }
    return symbol;
}
```

FIG 5I

```
b = m>>2;
a = m-(b<<2);
for (j=0;j<lev;j++) {
    r = arith_decode(arith_cf_r,4);
    a = (a<<1) | (r&1);
    b = (b<<1) | ((r>>1)&1);
}
```

FIG 5J

```
x_ac_dec[2*i]   = a
x_ac_dec[2*i+1] = b;
```

FIG 5K

```
/*input variables*/
a,b /* Decoded unsigned quantized spectralcoefficients of the 2-tuple */
i /* Index of the quantized spectral coefficient to decode */

arith_update_context(i, a, b)
{
    q[1][i] = a+b+1;
    if (q[1][i]>0xF)
        q[1][i] = 0xF;
}
```

FIG 5L

FIG 5M

```
/*input variables*/
offset /*number of decoded 2-tuple */
N /*Window length */
x_ac_dec  /*vector of decoded spectal coefficients*/

arith_finish(x_ac_dec,offset,N)
{
    for(i=offset ;i<N/4;i++) {
        x_ac_dec[2*i] = 0;
        x_ac_dec[2*i+1] = 0;
        q[1][i] = 1;
    }
}
```

FIG 5N

```
b= m>>2
a = m&0x03;
for(j=0;j<lev;j++){
    r = arith_decode(arith_cf_r,4);
    a = (a<<1) | (r&1);
    b = (b<<1) |((r>>1)&1);

}
```

FIG 5O

```
/*input variables*/
a,b /*Decoded unsigned quantized spectralcoefficients of the 2-tuple*/
i /*Index of the quantized spectral coefficient to decode*/

arith_update_context (){
    qdec[2*i]=a
    qdec[2*i+1]=b;
    q[1][i]=a+b+1;

    if(q[1][i]>0xF)
        q[1][i]=0xF;
}
```

```
/*input variables*/
i /*Index of the quantized spectral coefficient to decode*/
lg /*number of coefficients in the frame*/

arith_save_context(i,lg){

    for(;i<N/4;i++){
        qdec[2*i]=0;
        qdec[2*i+1]=0;
        q[1][i]=1;
    }

    if(core_mode==1){
        ratio= ((float) lg)/((float)1024);
        for(j=0; j<512; j++){
            k = (int) ((float) j*ratio);
            qs[j] = q[1][k];
        }
        previous_lg = 512;
    }
    else{
        for(j=0; j<512; j++){
            qs[j] = q[1][j];
        }
        previous_lg = MIN(1024,lg);
    }
}
```

FIG 5P

Definitions

| | |
|---|---|
| a,b | 2-tuple to decode (2-tuple quantized coefficient to decode) |
| m | The most significant 2-bits wise plane of the quantized spectral coefficient to decode. |
| r | The least significant bit planes of the quantized spectral coefficient to decode. |
| lev | Level of the remaining bit-planes. It corresponds to the number of less significant bit planes. |
| arith_hash_m[] | Hash table mapping context states to a cumulative frequencies table index pki. |
| arith_lookup_m[] | Look-up table mapping group of context states to a cumulative frequencies table index pki. |
| arith_cf_m[pki][17] | Models of the cumulative frequencies for the most significant 2-bits wise plane m and the ARITH_ESCAPE symbol. |
| arith_cf_r [lsbidx][] | Cumulative frequencies for the least significant bit-planes symbol r. |
| arith_cf_r [] | Cumulative frequencies for the least significant bit-planes symbol r |
| q[2][] | 2-tuple context elements of the previous and current frame. |
| x_ace_dec[] | The decoded quantized spectral coefficients. |
| arith_reset_flag | Flag which indicates if the spectral noiseless context must be reset. |
| ARITH_STOP | Stop symbol consisting of the succession of ARITH_ESCAPE symbol and m=0. When it occurs, the rest of the frame is decoded with zero values. |
| N | Window length. For FD mode it is deduced from the window_sequence and for TCX N=2*lg. |
| previous_N | Length of the previous window. |

FIG 5Q

Definitions

| | |
|---|---|
| a,b | The 2-tuple quantized coefficient to decode |
| m | The most significant 2-bits wise plane of the quantized spectral coefficient to decode. |
| r | The most significant 2-bits wise plane of the quantized spectral coefficient to decode. |
| lev | Level of the remaining bit-planes. It corresponds to number the bit planes less significant than the most significant 2 bits-wise plane. |
| arith_hash_m[] | Hash table mapping context states to a cumulative frequencies table index pki. |
| arith_lookup_m[] | Look-up table mapping group of context states to a cumulative frequencies table index pki. |
| arith_cf_m[pki][17] | Models of the cumulative frequencies for the most significant 2-bits wise plane m and the ARITH_ESCAPE symbol. |
| arith_cf_r [] | Cumulative frequencies for the least significant bit-planes symbol r |
| previous_lg | number of transmitted spectral coefficients previously decoded by the arithmetic decoder |
| q[2][] | The current context of 2-tuples uses for decoding the current frame. |
| qs[] | The past context stored for the next frame. |
| qdec[] | The decoded quantized spectral coefficients. |
| arith_reset_flag | Flag which indicates if the spectral noiseless context must be reset. |
| ARITH_STOP | Stop symbol consisting of the succession of ARITH_ESCAPE symbol and m=0. When it occurs, the rest of the frame is decoded with zero values. |
| N | Window length. For AAC it is deduced from the window_sequence (see section 6.8.3.1) and for TCX N=2.lg. |

FIG 5R

```
usac_raw_data_block ()
{
    single_channel_element (); and/or
    channel_pair_element ();
}
```

FIG 6A

Syntax of single_channel_element()

| Syntax | No. of bits | Mnemonic |
|---|---|---|
| single_channel_element() | | |
| { | | |
| **core_mode** | **1** | **uimsbf** |
| if ( core_mode == 1 ) { | | |
| lpd_channel_stream(); | | |
| } | | |
| else { | | |
| fd_channel_stream(); | | |
| } | | |
| } | | |

FIG 6B

Syntax of channel_pair_element()

| Syntax | No. of bits | Mnemonic |
|---|---|---|
| channel_pair_element() | | |
| { | | |
| **core_mode0** | **1** | **uimsbf** |
| **core_mode1** | **1** | **uimsbf** |
| ics_info(); optional: common ics_info for two channels | | |
| if ( core_mode0 == 1 ) { | | |
| lpd_channel_stream(); | | |
| } | | |
| else { | | |
| fd_channel_stream(); | | |
| } | | |
| if ( core_mode1 == 1 ) { | | |
| lpd_channel_stream(); | | |
| } | | |
| else { | | |
| fd_channel_stream(); | | |
| } | | |
| } | | |

FIG 6C

Syntax of ics_info()

| Syntax | No. of bits | Mnemonic |
|---|---|---|
| ics_info() | | |
| { | | |
| **window_length;** | **1** | **uimsbf** |
| if(window_length != 0) { | | |
| **transform_length;** | **1** | **uimsbf** |
| } | | |
| else { | | |
| transform_length = 0; | | |
| } | | |
| **window_shape;** | **1** | **uimsbf** |
| if (window_length != 0 && transform_length != 0){ | | |
| **max_sfb;** | **4** | **uimsbf** |
| **scale_factor_grouping;** | **7** | **uimsbf** |
| } | | |
| else { | | |
| **max_sfb;** | **6** | **uimsbf** |
| } | | |
| } | | |

optional (window_shape through the else branch)

FIG 6D

Syntax of fd_channel_stream()

| Syntax | No. of bits | Mnemonic |
|---|---|---|
| fd_channel_stream() | | |
| { | | |
| **global_gain;** | **8** | **uimsbf** |
| ics_info(); (unless included in channel pair element) | | |
| scale_factor_data (); | | |
| ac_spectral_data (); | | |
| } | | |

FIG 6E

Syntax of ac_spectral_data()

| Syntax | No. of bits | Mnemonic |
|---|---|---|
| ac_spectral_data() | | |
| { | | |
| **arith_reset_flag** | **1** | **uimsbf** |
| for (win=0; win<num_windows; win++){ | | |
| arith_data(num_bands, arith_reset_flag) | | |
| } | | |
| } | | |

FIG 6F

FIG 6G

Syntax of arith_data()

| Syntax | No. of bits | Mnemonic |
|---|---|---|
| arith_data(lg, arith_reset_flag) | | |
| { | | |
|   c = arith_map_context(N, arith_reset_flag); | | |
| | | |
|   for (i=0; i<lg/2; i++) { | | |
|     /* MSB decoding */ | | |
|     c = arith_get_context (c,i,N); | | |
|     for (lev=esc_nb=0;;) { | | |
| 662       pki = arith_get_pk(c+esc_nb<<17) | | |
| 663       **acod_m**[pki][m] | 1..20 | vlclbf |
| 664       if ( m != ARITH_ESCAPE) | | |
|         break; | | |
|       lev += 1; | | |
|       if ( (esc_nb=lev)>7 ) | | |
|         esc_nb=7; | | |
|     } | | |
|     b = m>>2; | | |
|     a = m – (b<<2); | | |
| | | |
|     /* ARITH_STOP symbol detection */ | | |
|     if (m==0 && lev>0) | | |
|       break; | | |
| | | |
|     /* LSB decoding */ | | |
|     for (l=lev; l>0; l--) { | | |
| | | |
|       **acod_r**[r] | 1..20 | vlclbf |
|       a=(a<<1) \| (r&1); | | |
|       b=(b<<1) \| ((r>>1)&1); | | |
|     } | | |
|     x_ac_dec[2*i] = a; | | |
|     x_ac_dec[2*i+1] = b; | | |
| 668     arith_update_context(i,a,b); | | |
|   } | | |
|   arith_finish (x_ac_dec,lg,N); | | |
| | | |
|   /* Signs decoding */ | | |
|   for (i=0; i<lg; i++) { | | |
|     if (x_ac_dec[i] != 0) { | | |
|       **s**; | 1 | uimsbf |
|       if (s==1) {x_ac_dec[i] *= -1; } | | |
|     } | | |
|   } | | |
| } | | |

Table Syntax of arith_data()

| Syntax | No. of bits | Mnemonic |
|---|---|---|
| Arith_data(lg, arith_reset_flag){ | | |
|   c=arith_map_context(lg, arith_reset_flag); | | |
|   for (i=0; i<lg/2; i++) { | | |
|     /*MSBs decoding*/ | | |
|     c = arith_get_context (c,i); | | |
|     for (lev=esc_nb=0;;) { | | |
|       pki = arith_get_pk(c+esc_nb<<17) | | |
|       **acod_m**[pki][m] | 1..20 | vlclbf |
|       if ( m != ARITH_ESCAPE) | | |
|         break; | | |
|       lev += 1; | | |
|       if((esc_nb=lev)>7) | | |
|         esc_nb=7; | | |
|     } | | |
|     b=m>>2; | | |
|     a=m-(b<<2); | | |
|     /*ARITH_STOP symbol detection*/ | | |
|     if(m==0 && lev>0) | | |
|       break; | | |
|     /*LSBs decoding*/ | | |
|     for (l=lev; l>0; l--) { | | |
|       **acod_r**[r] | 1..20 | vlclbf |
|       a=(a<<1)\|(r&1); | | |
|       b=(b<<1)\|((r>>1)&1); | | |
|     } | | |
|     arith_update_context(a,b,i); | | |
|   } | | |
|   arith_save_arith (l,lg); | | |
|   /*Signs decoding*/ | | |
|   for (i=0; i<lg/2; i++) { | | |
|     if(a!=0){ | | |
|       s; | 1 | uimsbf |
|       If(s) a=-a; | | |
|     } | | |
|     if(b!=0){ | | |
|       s; | 1 | uimsbf |
|       if(s) b=-b; | | |
|     } | | |
|   } | | |
| } | | |

FIG 6H

Definitions

| | |
|---|---|
| arith_data() | Data element to decode the spectral noiseless coder data |
| **arith_reset_flag** | Flag which indicates if the spectral noiseless context must be reset. |
| **acod _m[pki][m]** | Arithmetic codeword necessary for decoding of the most significant 2-bits wise plane m of the quantized spectral coefficients of a 2-tuple. |
| **acod_r[lsbidx][]** | Arithmetic codeword necessary for decoding of the residual bit-planes r of the quantized spectral coefficient of a 2-tuple. |
| **s** | The coded sign of the non-null spectral quantized coefficient. |

Help elements

| | |
|---|---|
| a,b | 2-tuple corresponding to quantized spectral coefficients |
| m | The most significant 2-bits wise plane of the 2-tuple to decode. |
| r | The least significant bit planes of the 2-tuple to decode. |
| lg | Number of quantized coefficients to decode. |
| N | Window length. For FD mode it is deduced from the window_sequence and for TCX N=2*lg. |
| i | Index of 2-tuples to decode within the frame. |
| pki | Index of the cumulative frequencies table used by the arithmetic decoder for decoding m. |
| arith_get_pk () | Function that returns the index pki of cumulative frequencies table necessary to decode the codeword **acod_m[pki][m]**. |
| c | State of context |
| lsbidx | Index to the cumulative frequencies tables used by the arithmetic coder for decoding r. |
| lev | Level of bit-planes to decode beyond the most significant 2-bits wise plane. |
| ARITH_ESCAPE | Escape symbol that indicates additional bit-planes to decode beyond the two most significant bit planes. |
| esc_nb | Number of ARITH_ESCAPE symbol already decoded for the present 2-tuple. The value is bounded to 7. |
| x_ac_dec[] | Element holding the decoded spectral coefficients |
| arith_map_context() | Initializes the contexts needed for decoding the present frame. |
| arith_get_context() | Computes the context state for decoding the present 2-tuple m symbols. |
| arith_update_context() | Updates the context for the next 2-tuple. |
| arith_finish () | Finish the noiseless decoding. |

FIG 6I

Definitions

| | |
|---|---|
| arith_data() | Data element to decode the spectral noiseless coder data |
| **arith_reset_flag** | Flag which indicates if the spectral noiseless context must be reset. |
| **acod _m[pki][m]** | Arithmetic codeword necessary for decoding of the most significant 2-bits wise plane m of the quantized spectral coefficients of a 2-tuple. |
| **arith_r[]** | Arithmetic codeword necessary for decoding of the residual bit-planes r of the quantized spectral coefficient of a 2-tuple. |
| **s** | The coded sign of the non-null spectral quantized coefficient. |

Help elements

| | |
|---|---|
| a,b | The 2-tuple quantized coefficients to decode |
| m | The most significant 2-bits wise plane of the 2-tuple to decode. |
| r | The least significant bit wise plane of the 2-tuple to decode. |
| lg | Number of quantized coefficients to decode. |
| i | Index of 2-tuple to decode within the frame. |
| pki | Index of the cumulative frequencies table used by the arithmetic decoder for decoding m. |
| arith_get_pk () | Function that returns the index pki of cumulative frequencies table necessary to decode the codeword acod_m[pki][m]. |
| c | State of context |
| lev | Level of bit-planes to decode beyond the most significant 2-bits wise plane. |
| ARITH_ESCAPE | Escape symbol that indicates additional bit-planes to decode beyond the two most significant bit planes. |
| esc_nb | Number of ARITH_ESCAPE symbol already decoded for the present 2-tuple. The value is bounded to 7. |
| arith_map_context() | Initializes the contexts needed for decoding the present frame. |
| arith_get_context() | Computes the context state for decoding the present 2-tuple m symbols. |
| arith_update_context() | Updates the context for the next 2-tuple. |
| arith_save_context() | Save the context for the next frame to decode. |

FIG 6J

TABLES AS USED IN USAC WD4 ARITHMETIC CODING SCHEME

| table name | description | unit of data | memory (words of 32 Bit) |
|---|---|---|---|
| arith_cf_ng_hash[128] | Hash table mapping context to a probability model index. | word | 128 |
| arith_cf_ng[32][545] | Cumulative frequencies of groups for each probability distribution mode ,l | 1/2 word | 8720 |
| egroups[8][8][8][8] | Group index of 4 tuple. | 1/2 word | 2048 |
| dgvectors[4*4096] | Map group index and element index to 4-tuple. | 1/4 word | 4096 |
| dgroups[544] | Map group index to cardinal of the group and offset in dgvectors | word | 544 |
| arith_cf_ne[2701] | Cumulative frequencies of the element index symbol | 1/2 word | 1350.5 |
| arith_cf_r[16] | Cumulative frequencies of least significant bit planes | 1/2 word | 8 |
| **total** | | | **16894.5** |

FIG 14B context for state calculation,
as used in the proposed scheme

TABLES AS USED IN THE PROPOSED CODING SCHEME

| table name | description | unit of data | memory (words of 32 Bit) |
|---|---|---|---|
| arith_hash[600] | Hash table mapping states of the context to a group of states | 1 word | 600 |
| arith_lookup[600] | Look-up table mapping | 1/4 word | 150 |
| arith_cf_msb[96][16] | groups of states to a cumulative frequencies table<br>Models of the cumulative frequencies for the most significant 2-bits wise plane m and the ARITH_ESCAPE symbol | 1/2 word | 768 |
| **total** | | | **1518** |

FIG 15B

ROM demand noiseless coding scheme as proposed and in WD4 total USAC decoder data ROM demand,
WD4 and scheme as proposed comparison of WD3/WD5 noiseless coding with proposed coding scheme Table: Average bitrates produced by the WD3 arithemtic coder and the new proposal. Net bitrates do not include bits for byte alignment or fill bits

| operating mode | WD3 (kbit/s) | new proposal (kbit/s) | difference after transcoding (kbit/s) | difference after transcoding (% of total bitrate) |
|---|---|---|---|---|
| Test 1, 64s | 64.00 | 62.78 | -1.22 | -1.90 |
| Test 2, 32s | 32.00 | 31.47 | -0.53 | -1.66 |
| Test 3, 24s | 24.00 | 23.61 | -0.39 | -1.64 |
| Test 4, 20s | 20.00 | 19.65 | -0.35 | -1.74 |
| Test 5, 16s | 16.00 | 15.72 | -0.28 | -1.75 |
| Test 6, 24m | 24.00 | 23.56 | -0.44 | -1.83 |
| Test 7, 20m | 20.00 | 19.61 | -0.39 | -1.95 |
| Test 8, 16m | 16.00 | 15.70 | -0.30 | -1.87 |
| Test 9, 12m | 12.00 | 11.77 | -0.23 | -1.92 |

FIG 18

Table: minimum and maximum bitreservoir levels for WD3 arithemtic coder and proposal

| operating mode | bitreservoir control | | | | | |
|---|---|---|---|---|---|---|
| | new proposal | | | WD3 | | |
| | min | max | avg | min | max | avg |
| Test 1, 64kbps stereo | 3739 | 9557 | 8874 | 2314 | 9557 | 7018 |
| Test 2, 32kbps stereo | 2335 | 4505 | 4293 | 582 | 4505 | 3529 |
| Test 3, 24kbps stereo | 2184 | 4704 | 4472 | 957 | 4704 | 3871 |
| Test 4, 20kbps stereo | 2688 | 4864 | 4660 | 712 | 4864 | 3854 |
| Test 5, 16kbps stereo | 2965 | 5006 | 4859 | 724 | 5006 | 4234 |
| Test 6, 24kbps mono | 2185 | 4704 | 4457 | 1002 | 4704 | 3927 |
| Test 7, 20kbps mono | 2782 | 4864 | 4690 | 1192 | 4864 | 3935 |
| Test 8, 16kbps mono | 2916 | 5006 | 4905 | 1434 | 5006 | 4450 |
| Test 9, 12kbps mono | 3645 | 5184 | 5107 | 2256 | 5184 | 4787 |

FIG 19

Table: average complexity numbers for decoding the 32 kbit/s WD3 bitstream for the different version of the arithmetic coder.

| | WD3 | base version |
|---|---|---|
| PCU (MHz) | 0.953 | 0.823 |

FIG 20

```
static unsigned short ari_lookup_m[600] = {
0x02,0x01,0x03,0x38,0x3C,0x44,0x45,0x05,
0x07,0x37,0x41,0x08,0x0A,0x07,0x38,0x44,
0x0B,0x14,0x3E,0x3B,0x0C,0x14,0x3E,0x0C,
0x2B,0x5F,0x0F,0x42,0x3B,0x44,0x11,0x36,
0x42,0x41,0x13,0x2B,0x3E,0x3B,0x0C,0x14,
0x3E,0x14,0x2B,0x3E,0x15,0x07,0x3B,0x11,
0x25,0x42,0x41,0x16,0x36,0x3A,0x41,0x25,
0x36,0x3A,0x14,0x3E,0x36,0x42,0x36,0x3A,
0x2B,0x3E,0x42,0x38,0x41,0x17,0x19,0x42,
0x3B,0x44,0x19,0x1C,0x42,0x3B,0x44,0x1D,
0x2B,0x38,0x12,0x2B,0x1E,0x20,0x42,0x41,
0x22,0x36,0x37,0x41,0x24,0x36,0x42,0x41,
0x26,0x07,0x3A,0x2B,0x3E,0x01,0x3E,0x27,
0x07,0x37,0x44,0x3F,0x29,0x42,0x3B,0x44,
0x2A,0x07,0x37,0x41,0x29,0x07,0x38,0x2B,
0x3E,0x36,0x3E,0x39,0x42,0x34,0x07,0x3B,
0x26,0x36,0x42,0x41,0x36,0x42,0x3B,0x36,
0x3A,0x02,0x3A,0x03,0x38,0x07,0x37,0x07,
0x37,0x39,0x3A,0x3F,0x3B,0x41,0x44,0x57,
0x2C,0x07,0x3C,0x03,0x31,0x42,0x3C,0x22,
0x36,0x38,0x2A,0x07,0x27,0x2E,0x07,0x38,
0x44,0x2F,0x07,0x37,0x41,0x03,0x32,0x42,
0x3B,0x44,0x32,0x07,0x38,0x26,0x07,0x3A,
0x26,0x3E,0x02,0x2A,0x07,0x3B,0x33,0x03,
0x42,0x3B,0x44,0x1B,0x36,0x42,0x41,0x32,
0x07,0x3B,0x26,0x36,0x42,0x3B,0x36,0x3E,
0x39,0x42,0x39,0x42,0x3B,0x26,0x07,0x42,
0x41,0x36,0x42,0x37,0x41,0x36,0x42,0x3B,
0x07,0x3A,0x03,0x3B,0x07,0x42,0x3C,0x39,
0x42,0x3C,0x07,0x38,0x07,0x38,0x37,0x38,
0x3C,0x41,0x44,0x57,0x3B,0x3A,0x33,0x37,
0x33,0x03,0x02,0x33,0x07,0x3C,0x33,0x07,
0x3B,0x2A,0x34,0x42,0x41,0x34,0x07,0x38,
0x36,0x3E,0x26,0x07,0x3C,0x39,0x42,0x41,
0x33,0x36,0x42,0x3C,0x26,0x07,0x42,0x41,
0x07,0x38,0x07,0x3A,0x39,0x37,0x39,0x42,
0x3B,0x26,0x07,0x37,0x41,0x01,0x07,0x42,
0x3C,0x39,0x42,0x3B,0x03,0x3F,0x03,0x3B,
```

FIG 21(1)

```
0x39,0x42,0x3B,0x39,0x37,0x3C,0x39,0x37,
0x3C,0x03,0x38,0x3A,0x3B,0x3C,0x41,0x44,
0x57,0x03,0x33,0x03,0x26,0x37,0x34,0x42,
0x41,0x39,0x3F,0x34,0x42,0x39,0x37,0x39,
0x42,0x3B,0x26,0x07,0x37,0x41,0x07,0x3B,
0x07,0x3A,0x03,0x42,0x41,0x39,0x42,0x3C,
0x39,0x42,0x3C,0x07,0x3F,0x03,0x3B,0x03,
0x3B,0x39,0x37,0x3C,0x02,0x42,0x3C,0x03,
0x3D,0x40,0x3C,0x41,0x44,0x57,0x03,0x39,
0x3D,0x03,0x3B,0x39,0x42,0x41,0x39,0x3A,
0x03,0x3F,0x39,0x3F,0x02,0x3E,0x3F,0x02,
0x40,0x3C,0x41,0x44,0x27,0x03,0x03,0x03,
0x3D,0x3F,0x40,0x39,0x41,0x44,0x03,0x3D,
0x42,0x43,0x03,0x3C,0x44,0x03,0x3D,0x40,
0x3C,0x02,0x3C,0x44,0x3D,0x43,0x3C,0x02,
0x41,0x44,0x3D,0x43,0x3C,0x03,0x44,0x3D,
0x43,0x41,0x02,0x44,0x3D,0x41,0x44,0x43,
0x41,0x44,0x43,0x41,0x44,0x03,0x3C,0x44,
0x46,0x47,0x49,0x4B,0x50,0x4D,0x4F,0x0B,
0x56,0x0C,0x0C,0x2B,0x03,0x52,0x0D,0x10,
0x1A,0x56,0x56,0x57,0x58,0x58,0x0C,0x26,
0x01,0x01,0x02,0x3D,0x1A,0x1E,0x56,0x5A,
0x5B,0x5B,0x00,0x27,0x15,0x0C,0x39,0x39,
0x26,0x01,0x02,0x02,0x3D,0x57,0x57,0x27,
0x57,0x00,0x39,0x39,0x02,0x02,0x03,0x27,
0x27,0x02,0x27,0x02,0x02,0x3D,0x5E,0x5D,
0x5F,0x5E,0x5D,0x5D,0x5D,0x5D,0x5C,0x5C,
0x5F,0x5D,0x5D,0x5D,0x5E,0x5D,0x5D,0x5C,
0x5C,0x5C,0x5C,0x5F,0x5D,0x5D,0x5D,0x5E,
0x5D,0x5C,0x5C,0x5E,0x5C,0x5E,0x5C,0x5C,
0x5F,0x5D,0x5C,0x5D,0x5F,0x5D,0x5D,0x5F,
0x5E,0x5F,0x5D,0x5F,0x5D,0x5F,0x5F,0x5D,
0x5F,0x5D,0x5F,0x5D,0x5F,0x5F,0x5F,0x5F,
0x5F,0x5F,0x5F,0x5F,0x44,0x5F,0x5E,0x5D,
0x5D,0x5C,0x5C,0x5D,0x5C,0x5C,0x5C,0x5F,
0x5E,0x5D,0x5E,0x5D,0x5E,0x5D,0x5E,0x5F,
0x5E,0x5F,0x5E,0x5C,0x5E,0x5C,0x5E,0x5E,

};
```

FIG 21(2)

```
static unsigned long ari_hash_m[600] = {
0x00000100UL,0x00000302UL,0x0000053AUL,0x0000073BUL,0x00000A41UL,0x00000F44UL,
0x00111104UL,0x00111306UL,
0x00111542UL,0x0011173BUL,0x00111F44UL,0x00112209UL,0x0011242BUL,0x0011263EUL,
0x0011293CUL,0x00113105UL,
0x0011330CUL,0x0011352BUL,0x0011383AUL,0x00113F44UL,0x0011440CUL,0x0011462BUL,
0x00114F41UL,0x0011530CUL,
0x0012110DUL,0x0012120EUL,0x00121436UL,0x00121637UL,0x00121941UL,0x00122110UL,
0x00122312UL,0x00122507UL,
0x00122738UL,0x00123156UL,0x00123314UL,0x00123507UL,0x0012373AUL,0x00123F44UL,
0x00124212UL,0x0012452BUL,
0x00124F44UL,0x00125314UL,0x0012762BUL,0x00131121UL,0x00131323UL,0x00131542UL,
0x0013211DUL,0x00132216UL,
0x00132436UL,0x00132738UL,0x0013311DUL,0x00133329UL,0x00133507UL,0x00133838UL,
0x00134115UL,0x0013432BUL,
0x0013463EUL,0x00134F44UL,0x0013532BUL,0x0013FF3BUL,0x00142307UL,0x00143126UL,
0x00143407UL,0x00143E44UL,
0x00144307UL,0x0014FF3BUL,0x0015633EUL,0x0017863BUL,0x0021005AUL,0x00211218UL,
0x00211407UL,0x00211637UL,
0x00211941UL,0x0021211AUL,0x0021221BUL,0x00212436UL,0x00212637UL,0x00212941UL,
0x00213118UL,0x00213320UL,
0x00213507UL,0x00213F44UL,0x00214314UL,0x00220001UL,0x0022121FUL,0x00221407UL,
0x0022173BUL,0x00222121UL,
0x00222323UL,0x00222542UL,0x0022283BUL,0x0022311DUL,0x00223325UL,0x00223507UL,
0x00223737UL,0x00224115UL,
0x00224436UL,0x0022463EUL,0x00224F44UL,0x00225436UL,0x00225F44UL,0x0022622BUL,
0x0023112DUL,0x00231330UL,
0x00231542UL,0x0023183CUL,0x0023212DUL,0x00232228UL,0x00232407UL,0x00232637UL,
0x00232941UL,0x00233115UL,
0x0023332BUL,0x00233542UL,0x0023383BUL,0x0023412AUL,0x00234336UL,0x00234642UL,
0x00234F44UL,0x00235407UL,
0x00235F44UL,0x0023653EUL,0x0023FF3BUL,0x00241307UL,0x00241F44UL,0x00242336UL,
0x00242542UL,0x00242F44UL,
0x00243234UL,0x00243407UL,0x00243738UL,0x00244126UL,0x00244307UL,0x0024463AUL,
0x00244F44UL,0x00245442UL,
0x00245F44UL,0x00246236UL,0x0024FF3CUL,0x00252442UL,0x00252F44UL,0x00253303UL,
0x00253F44UL,0x00254303UL,
0x00254F44UL,0x00255303UL,0x0025FF41UL,0x0026733EUL,0x0027FF44UL,0x002AF203UL,
0x002FFF44UL,0x0031115BUL,
0x00311331UL,0x00311542UL,0x00312121UL,0x0031222DUL,0x00312436UL,0x00312637UL,
0x00312F44UL,0x00313335UL,
```

FIG 22(1)

0x00313507UL,0x00313F44UL,0x00314332UL,0x0031FF3CUL,0x0032112CUL,0x00321335UL,
0x00321542UL,0x0032183CUL,
0x0032212CUL,0x00322330UL,0x00322542UL,0x0032273BUL,0x0032312DUL,0x00323231UL,
0x00323407UL,0x00323637UL,
0x00323A41UL,0x0032412AUL,0x00324407UL,0x00324642UL,0x00324F44UL,0x00325336UL,
0x00325507UL,0x00325F44UL,
0x00326234UL,0x0032FF3CUL,0x00331127UL,0x00331332UL,0x00331542UL,0x0033212EUL,
0x00332334UL,0x00332407UL,
0x00332637UL,0x00332941UL,0x00333115UL,0x00333235UL,0x00333407UL,0x00333738UL,
0x0033412AUL,0x00334336UL,
0x00334637UL,0x00334F44UL,0x00335234UL,0x00335407UL,0x0033573AUL,0x00335F44UL,
0x00336407UL,0x0033FF3CUL,
0x00341307UL,0x00341F44UL,0x00342307UL,0x00342542UL,0x00342F44UL,0x00343234UL,
0x00343442UL,0x0034373BUL,
0x00344126UL,0x00344307UL,0x00344542UL,0x0034483BUL,0x00345126UL,0x00345307UL,
0x00345637UL,0x00345F44UL,
0x00346442UL,0x0034FF3CUL,0x00352442UL,0x00353139UL,0x00353303UL,0x00353637UL,
0x00353F44UL,0x00354303UL,
0x00354637UL,0x00354F44UL,0x00355442UL,0x00356102UL,0x00356303UL,0x0035FF41UL,
0x00366203UL,0x0037733DUL,
0x0039E43AUL,0x003BF641UL,0x003FFF44UL,0x00411227UL,0x00411334UL,0x0041212CUL,
0x00412407UL,0x0041312EUL,
0x00413334UL,0x0041FF3CUL,0x00421127UL,0x00421334UL,0x00421542UL,0x00422127UL,
0x00422334UL,0x00422542UL,
0x00422F44UL,0x00423232UL,0x00423407UL,0x0042373BUL,0x00424126UL,0x00424336UL,
0x00424542UL,0x00424F44UL,
0x00425407UL,0x0042FF3CUL,0x00431339UL,0x00431542UL,0x00432133UL,0x00432407UL,
0x0043273BUL,0x00432F44UL,
0x00433234UL,0x00433407UL,0x00433637UL,0x00433F44UL,0x00434234UL,0x00434442UL,
0x00434738UL,0x00435126UL,
0x00435542UL,0x00435F44UL,0x00436442UL,0x0043FF41UL,0x00441303UL,0x00442126UL,
0x00442307UL,0x00442542UL,
0x00442F44UL,0x00443239UL,0x00443442UL,0x0044373BUL,0x00443F44UL,0x00444234UL,
0x00444442UL,0x00444637UL,
0x00444F44UL,0x00445307UL,0x00445637UL,0x00445F44UL,0x00446537UL,0x0044FF41UL,
0x00452442UL,0x00452F44UL,
0x00453303UL,0x00453537UL,0x00453F44UL,0x00454303UL,0x00454638UL,0x00454F44UL,
0x00455303UL,0x00455638UL,
0x00455F44UL,0x00456437UL,0x0045FF41UL,0x00466203UL,0x00478438UL,0x0049FF44UL,
0x004CF741UL,0x004FFF44UL,

FIG 22(2)

0x00511226UL,0x00512127UL,0x00512339UL,0x00521127UL,0x00521339UL,0x00522127UL,
0x00522339UL,0x00522637UL,
0x00523126UL,0x00523403UL,0x00524126UL,0x00524307UL,0x00531126UL,0x00531307UL,
0x00532126UL,0x00532307UL,
0x00532537UL,0x00532F44UL,0x00533239UL,0x00533442UL,0x0053373BUL,0x00534126UL,
0x00534542UL,0x00534F44UL,
0x00535442UL,0x0053FF3CUL,0x00542303UL,0x00542638UL,0x00543102UL,0x00543307UL,
0x00543638UL,0x00543F44UL,
0x00544307UL,0x00544537UL,0x00545102UL,0x00545303UL,0x0054FF41UL,0x00552437UL,
0x00552F44UL,0x00553437UL,
0x00553F44UL,0x00554303UL,0x0055463BUL,0x00554F44UL,0x00555307UL,0x00555537UL,
0x00556102UL,0x00556342UL,
0x00566203UL,0x00577342UL,0x0059733AUL,0x005CF53CUL,0x005FFF44UL,0x00611239UL,
0x00621127UL,0x00623307UL,
0x00631126UL,0x00632442UL,0x00632F44UL,0x00633303UL,0x00633638UL,0x00634102UL,
0x00634303UL,0x0063FF41UL,
0x00642303UL,0x00642F44UL,0x00643303UL,0x00643F44UL,0x00644207UL,0x00655203UL,
0x00665F44UL,0x00666303UL,
0x00677203UL,0x0069A53BUL,0x006DF841UL,0x006FFF44UL,0x00711239UL,0x00721127UL,
0x00722239UL,0x00733239UL,
0x00744437UL,0x00755203UL,0x00776F44UL,0x00777437UL,0x007BF33FUL,0x007FFF44UL,
0x00822239UL,0x00833203UL,
0x00854540UL,0x00888102UL,0x00888538UL,0x008BF23DUL,0x008FFF44UL,0x00922239UL,
0x0094333DUL,0x0096533DUL,
0x00998F44UL,0x00999303UL,0x009BF53BUL,0x009FFF44UL,0x00A44203UL,0x00A6633FUL,
0x00AA9F44UL,0x00AAA303UL,
0x00ADF33DUL,0x00AFFF44UL,0x00B33203UL,0x00B55440UL,0x00BBAC44UL,0x00BBB53BUL,
0x00BFFF44UL,0x00C33203UL,
0x00C6423DUL,0x00CCBF44UL,0x00CCC303UL,0x00CFFF44UL,0x00D4423DUL,0x00DDD303UL,
0x00DFFF44UL,0x00E6453CUL,
0x00EEE342UL,0x00EFFF44UL,0x00F55343UL,0x00F7FF44UL,0x00FFEF44UL,0x00FFF33DUL,
0x00FFF744UL,0x01000145UL,
0x01011147UL,0x01111248UL,0x0111224AUL,0x0111324DUL,0x0112114CUL,0x0112214EUL,
0x01123108UL,0x01131150UL,
0x01132150UL,0x01133150UL,0x01141126UL,0x01144100UL,0x01211151UL,0x01212153UL,
0x01213108UL,0x01221154UL,
0x01222155UL,0x01223117UL,0x01224212UL,0x01231215UL,0x01232215UL,0x01233215UL,
0x01241126UL,0x01242239UL,
0x0124322BUL,0x01251103UL,0x01255100UL,0x01311159UL,0x01312155UL,0x01313117UL,
0x01315201UL,0x0132122CUL,

FIG 22(3)

```
0x0132222CUL,0x0132321DUL,0x01331157UL,0x01332158UL,0x01333150UL,0x01341126UL,
0x01342127UL,0x01343100UL,
0x01344100UL,0x01351103UL,0x01355100UL,0x01369100UL,0x0141115AUL,0x01421227UL,
0x01422227UL,0x01431226UL,
0x01432226UL,0x01441127UL,0x01442127UL,0x01443100UL,0x01444100UL,0x01458100UL,
0x01511157UL,0x01531239UL,
0x01555100UL,0x01611157UL,0x01631239UL,0x01777100UL,0x01D33102UL,0x01FFF203UL,
0x0200055DUL,0x0200085DUL,
0x02000F5FUL,0x0211155DUL,0x02111F44UL,0x02112F5FUL,0x02121F44UL,0x02122F44UL,
0x02133F5FUL,0x0217FF5FUL,
0x021FFF44UL,0x02211F44UL,0x02212F44UL,0x02221F44UL,0x0222245EUL,0x02222F5FUL,
0x02223F5FUL,0x02232F5FUL,
0x02233F5FUL,0x02243F5FUL,0x022BFF5FUL,0x022FFF44UL,0x02322F44UL,0x02323F5FUL,
0x02332F5FUL,0x0233355CUL,
0x02333F5FUL,0x02334F5FUL,0x0233FF5CUL,0x02343F5FUL,0x0234FF5CUL,0x02353F5FUL,
0x02364F5FUL,0x0239655CUL,
0x023FFF44UL,0x02433F5FUL,0x0246445CUL,0x024A955DUL,0x024FFF44UL,0x0257435EUL,
0x025AC55CUL,0x025FFF44UL,
0x0267565DUL,0x026FFF44UL,0x0278655DUL,0x027FFF44UL,0x0288875DUL,0x028CC95DUL,
0x028FFF44UL,0x029A965DUL,
0x029FFF44UL,0x02ABA65DUL,0x02AFFF44UL,0x02BAFF5FUL,0x02BFFF44UL,0x02CCC45DUL,
0x02CFFF44UL,0x02DFFF44UL,
0x02EEE65DUL,0x02EFFF44UL,0x02F7335EUL,0x02FF0044UL,0x02FFEF44UL,0x02FFFF44UL,
0x0400045EUL,0x04000F5FUL,
0x04111F5DUL,0x04234F5DUL,0x042DFF5CUL,0x04343F5DUL,0x043FFF5FUL,0x044FFF5FUL,
0x045ED75CUL,0x045FFF5FUL,
0x046DFF5FUL,0x046FFF5FUL,0x047B5C5CUL,0x047FFF5FUL,0x048B435EUL,0x048FFF5FUL,
0x0499FF5CUL,0x04EFFF5FUL,
0x04FDFE5DUL,0x04FFFF5FUL,0x0600075EUL,0x06DFFF5FUL,0x06FFFF5FUL,0x08BFFF5CUL,
0x08FFFF5CUL,0x7FFFFFFF4FUL,

};
```

FIG 22(4)

```
unsigned short ari_cf_m [96][17] = {
{ 7529, 5263, 5173, 5162, 2636, 825, 674, 653, 511, 281, 210, 195, 173, 130, 105,
96,
  0
},
{ 10351, 7392, 7203, 7178, 4327, 1620, 1279, 1230, 1008, 606, 436, 399, 362, 288, 233,
212,
  0
},
{ 12505, 9566, 9216, 9157, 6631, 3220, 2541, 2418, 2086, 1404, 1024, 922, 858, 721,
597, 535,
  0
},
{ 14710,12600,11956,11801,10114, 7056, 5723, 5381, 4870, 3724, 2870, 2566, 2437, 2122,
1809, 1609,
  0
},
{ 4186, 2623, 2608, 2607, 939, 109, 86, 84, 63, 23, 14, 13, 11, 8, 5, 4,
  0
},
{ 7310, 4598, 4547, 4544, 2079, 354, 264, 259, 204, 90, 42, 38, 34, 25, 14, 11,
  0
},
{ 9998, 6785, 6641, 6630, 4087, 1058, 770, 746, 621, 339, 166, 143, 131, 104, 67,
49,
  0
},
{ 13801,11125,10550,10472, 8498, 5030, 3694, 3509, 3101, 2141, 1247, 1038, 975, 821,
623, 440,
  0
},
{ 5784, 3557, 3523, 3521, 1359, 164, 122, 119, 85, 29, 16, 14, 12, 8, 5, 4,
  0
},
{ 7617, 4716, 4649, 4645, 2129, 361, 258, 252, 191, 80, 39, 34, 30, 22, 13, 10,
  0
},
{ 9553, 6223, 6064, 6052, 3524, 912, 643, 620, 501, 262, 132, 112, 102, 79, 52, 39,
  0
},
{ 8423, 5300, 5186, 5179, 2629, 539, 375, 362, 276, 119, 61, 53, 46, 33, 21, 17,
  0
},
{ 9570, 6162, 5952, 5936, 3574, 1016, 702, 670, 538, 282, 152, 129, 117, 90, 63,
50,
  0
},
```

2310

2312

FIG 23(1)

```
{ 7355, 4678, 4630, 4628, 1834, 252, 190, 187, 124, 38, 21, 19, 16, 10, 6, 5,
  0
},
{ 8916, 5717, 5627, 5622, 2647, 471, 340, 332, 242, 97, 46, 41, 36, 25, 15, 12,
  0
},
{ 10839, 7394, 7198, 7184, 4273, 1169, 832, 803, 643, 327, 167, 143, 130, 100, 66,
49,
  0
},
{ 8036, 5132, 5045, 5040, 2207, 350, 250, 243, 167, 56, 31, 28, 23, 15, 10, 8,
  0
},
{ 9663, 6256, 6110, 6101, 3064, 633, 441, 426, 311, 127, 65, 57, 49, 34, 22, 18,
  0
},
{ 11237, 7629, 7361, 7339, 4460, 1302, 898, 859, 675, 333, 178, 152, 136, 104, 73,
57,
  0
},
{ 10436, 6930, 6718, 6703, 3735, 902, 619, 595, 446, 189, 98, 85, 74, 51, 34, 28,
  0
},
{ 11678, 7933, 7574, 7541, 4826, 1560, 1057, 1002, 796, 406, 218, 184, 165, 124, 88,
70,
  0
},
{ 10597, 7265, 7057, 7039, 3904, 1071, 768, 738, 541, 227, 127, 111, 93, 60, 40,
34,
  0
},
{ 11298, 7892, 7596, 7566, 4416, 1276, 873, 832, 611, 261, 141, 122, 103, 70, 47,
40,
  0
},
{ 6435, 4238, 4210, 4208, 1558, 216, 174, 172, 116, 39, 24, 22, 18, 11, 7, 6,
  0
},
{ 8744, 5744, 5671, 5667, 2636, 496, 375, 368, 273, 113, 58, 52, 45, 32, 19, 15,
  0
},
{ 10899, 7632, 7457, 7444, 4488, 1270, 942, 914, 737, 383, 204, 177, 161, 122, 80,
62,
  0
},
```

FIG 23(2)

```
{ 7929, 5176, 5119, 5116, 2169, 307, 230, 226, 155, 51, 28, 25, 21, 13, 8, 7,
  0
},
{ 9520, 6304, 6204, 6199, 3044, 585, 424, 415, 304, 118, 59, 52, 45, 31, 19, 15,
  0
},
{ 11187, 7805, 7600, 7586, 4554, 1292, 928, 896, 703, 342, 178, 153, 138, 103, 68,
52,
  0
},
{ 10371, 7037, 6881, 6871, 3721, 860, 613, 596, 440, 176, 88, 77, 67, 46, 28, 23,
  0
},
{ 8562, 5804, 5738, 5734, 2472, 467, 374, 369, 233, 76, 48, 44, 34, 20, 13, 11,
  0
},
{ 10078, 6838, 6713, 6705, 3407, 782, 591, 578, 407, 164, 92, 83, 69, 46, 29, 24,
  0
},
{ 11694, 8342, 8108, 8089, 4999, 1559, 1143, 1105, 858, 424, 240, 210, 185, 135, 92,
73,
  0
},
{ 9115, 6191, 6084, 6077, 2924, 604, 455, 445, 304, 109, 64, 58, 47, 29, 20, 17,
  0
},
{ 10786, 7434, 7256, 7244, 3968, 1006, 734, 712, 517, 213, 118, 104, 88, 60, 40,
34,
  0
},
{ 12216, 8840, 8535, 8507, 5492, 1860, 1342, 1289, 1007, 505, 289, 249, 221, 163, 115,
94,
  0
},
{ 11473, 8085, 7843, 7825, 4602, 1304, 931, 898, 669, 283, 153, 135, 116, 80, 53,
44,
  0
},
{ 12650, 9279, 8908, 8872, 5924, 2160, 1539, 1470, 1162, 585, 329, 282, 251, 184, 130,
107,
  0
},
{ 12597, 9310, 8859, 8806, 6019, 2457, 1741, 1643, 1310, 684, 401, 343, 304, 225, 164,
137,
  0
},
```

FIG 23(3)

```
{ 11509, 8255, 8030, 8012, 4706, 1489, 1135, 1103,  793,  347,  212,  192,  154,   98,   68,
59,
  0
},
{ 11946, 8648, 8370, 8344, 5106, 1628, 1185, 1142,  842,  366,  206,  183,  153,  100,   68,
57,
  0
},
{ 13088, 9856, 9444, 9397, 6468, 2535, 1831, 1745, 1384,  700,  407,  352,  310,  224,  160,
132,
  0
},
{ 12262, 9021, 8683, 8647, 5519, 1929, 1405, 1342, 1024,  481,  280,  245,  210,  146,  104,
89,
  0
},
{ 13353,10225, 9742, 9678, 6908, 2945, 2133, 2017, 1619,  875,  524,  450,  401,  298,  218,
183,
  0
},
{ 10055, 6990, 6879, 6872, 3544,  882,  687,  675,  490,  209,  121,  112,   95,   63,   41,   36,
  0
},
{ 10647, 7427, 7278, 7270, 3911,  968,  723,  705,  513,  203,  109,   98,   83,   55,   34,   28,
  0
},
{ 11221, 8027, 7861, 7851, 4397, 1264,  981,  961,  689,  293,  174,  159,  132,   83,   54,
46,
  0
},
{ 11700, 8429, 8209, 8192, 4825, 1451, 1079, 1049,  767,  327,  186,  167,  140,   92,   61,
52,
  0
},
{ 12949, 9762, 9414, 9379, 6351, 2418, 1786, 1717, 1351,  686,  398,  345,  301,  216,  152,
125,
  0
},
{ 12208, 8979, 8703, 8682, 5437, 1780, 1303, 1261,  955,  422,  231,  204,  175,  120,   77,
63,
  0
},
{ 13277,10148, 9741, 9698, 6807, 2800, 2047, 1960, 1563,  808,  463,  398,  352,  255,  174,
140,
  0
},
```

FIG 23(4)

```
{ 12426, 9284, 8976, 8947, 5753, 2124, 1609, 1555, 1166,  548,  333,  298,  247,  162,  113,
99,
  0
},
{ 13492,10473,10042, 9988, 7177, 3133, 2347, 2244, 1797,  970,  594,  520,  457,  331,
241,  204,
  0
},
{ 12407, 9334, 9013, 8977, 5920, 2276, 1708, 1642, 1284,  642,  392,  348,  299,  211,  153,
132,
  0
},
{ 13579,10631,10182,10121, 7466, 3396, 2542, 2420, 1975, 1112,  691,  604,  542,  408,
300,  256,
  0
},
{ 15415,14163,13591,13335,12111, 9885, 8640, 8070, 7541, 6363, 5413, 4919, 4688, 4157,
3662, 3364,
  0
},
{ 15645,14640,14124,13838,12910,11112, 9969, 9338, 8909, 7923, 7060, 6507, 6315, 5841,
5365, 5003,
  0
},
{ 13803,11130,10691,10636, 7807, 3900, 3070, 2956, 2343, 1300,  866,  781,  667,  462,
337,  292,
  0
},
{ 15381,14112,13568,13348,12083, 9783, 8595, 8105, 7565, 6347, 5408, 4945, 4704, 4158,
3671, 3377,
  0
},
{ 15595,14555,14062,13813,12830,10944, 9820, 9259, 8813, 7769, 6872, 6351, 6149, 5655,
5160, 4798,
  0
},
{ 15855,15124,14719,14487,13812,12440,11517,10975,10628, 9802, 9036, 8493, 8312,
7869,7383, 6992,
  0
},
{ 15484,14324,13800,13578,12460,10325, 9149, 8632, 8118, 6954, 6030, 5548, 5320, 4797,
4296, 3961,
  0
},
{ 15407,14130,13600,13402,12107, 9730, 8527, 8059, 7475, 6205, 5245, 4803, 4563, 4022,
3557, 3260,
  0
},
```

FIG 23(5)

```
{ 15475,14322,13830,13621,12482,10384, 9270, 8779, 8266, 7125, 6200, 5730, 5493, 4962,
4469, 4140,
  0
},
{ 15596,14601,14153,13948,12948,11040, 9997, 9517, 9048, 7949, 7054, 6560, 6325, 5785,
5280, 4913,
  0
},
{ 15871,15158,14789,14602,13921,12540,11660,11198,10847,10009, 9224, 8719, 8532,
8078, 7594, 7190,
  0
},
{ 15474,14312,13843,13669,12397,10171, 9109, 8697, 8063, 6764, 5886, 5470, 5181, 4574,
4090, 3790,
  0
},
{ 15720,14858,14443,14249,13373,11680,10700,10226, 9779, 8747, 7881, 7386, 7156,
6611, 6097, 5712,
  0
},
{ 16133,15786,15587,15472,15104,14369,13854,13555,13314,12738,12214,11861,11701,
11314,10905,10579,
  0
},
{  2594, 1645, 1633, 1631,  535,  108,   92,   89,   64,   34,   27,   25,   21,   15,   12,   11,
  0
},
{  7130, 4521, 4444, 4431, 2088,  598,  489,  469,  378,  235,  185,  173,  153,  120,  100,
94,
  0
},
{  1326,  780,  778,  777,  173,   17,   15,   14,   11,    7,    6,    5,    4,    3,    2,    1,
  0
},
{  4974, 2832, 2814, 2812,  945,  102,   78,   76,   56,   26,   16,   15,   13,    9,    6,    5,
  0
},
{  3593, 2051, 2043, 2042,  530,   36,   28,   27,   18,    8,    6,    5,    4,    3,    2,    1,
  0
},
{  5521, 3055, 3028, 3026, 1052,  102,   72,   69,   49,   20,   12,   11,    9,    6,    4,    3,
  0
},
{  4294, 2539, 2520, 2518,  812,   83,   61,   59,   41,   17,   12,   11,    9,    6,    4,    3,
  0
},
```

FIG 23(6)

```
{ 4456, 2667, 2653, 2652, 724, 67, 54, 53, 31, 11, 8, 7, 5, 3, 2, 1,
  0
},
{ 6684, 3922, 3872, 3869, 1425, 186, 133, 129, 86, 35, 21, 19, 15, 9, 6, 5,
  0
},
{ 5087, 3024, 2988, 2985, 965, 99, 71, 69, 43, 15, 10, 9, 7, 4, 3, 2,
  0
},
{ 7587, 4403, 4297, 4289, 1806, 279, 181, 171, 118, 49, 30, 27, 22, 15, 11, 10,
  0
},
{ 6242, 4036, 3962, 3957, 1604, 337, 256, 251, 154, 49, 31, 28, 20, 10, 6, 5,
  0
},
{ 3727, 2352, 2346, 2345, 568, 53, 46, 45, 27, 9, 7, 6, 5, 3, 2, 1,
  0
},
{ 6369, 3904, 3876, 3874, 1372, 186, 150, 147, 101, 42, 27, 25, 20, 13, 9, 8,
  0
},
{ 5012, 3060, 3046, 3045, 921, 76, 60, 59, 37, 13, 9, 8, 6, 4, 3, 2,
  0
},
{ 5471, 3590, 3569, 3568, 1118, 176, 153, 151, 83, 26, 19, 18, 13, 7, 5, 4,
  0
},
{ 5866, 3774, 3736, 3733, 1366, 204, 163, 159, 101, 37, 26, 24, 19, 11, 8, 7,
  0
},
{ 8648, 5538, 5437, 5427, 2527, 521, 397, 382, 269, 121, 81, 75, 60, 40, 30, 27,
  0
},
{ 7300, 5124, 5049, 5043, 2284, 682, 582, 574, 341, 124, 90, 86, 59, 29, 20, 18,
  0
},
{ 7183, 4913, 4817, 4808, 2167, 517, 404, 393, 252, 92, 63, 59, 43, 24, 17, 15,
  0
},
{ 4749, 3285, 3273, 3272, 938, 157, 141, 140, 81, 27, 21, 20, 15, 8, 6, 5,
  0
},
{ 6602, 4705, 4676, 4674, 1689, 388, 347, 344, 192, 63, 49, 47, 33, 16, 11, 10,
  0
},
```

FIG 23(7)

```
{ 6849, 4648, 4599, 4596, 1868, 367, 304, 299, 187, 68, 49, 46, 34, 19, 14, 13,
  0
},
{ 16383,16382,14098,13672,13671,13670,11058,10499, 8080, 5456, 4230, 3829, 3412,
2876, 2494, 2264,
  0
},
{ 16383,16382,14436,14062,14061,14060,11574,11038, 8597, 5905, 4621, 4204, 3720,
3106, 2674, 2430,
  0
},
{ 16383,16382,14635,14264,14263,14262,11898,11372, 8910, 6216, 4935, 4506, 3962,
3287, 2835, 2578,
  0
},
{ 16383,16382,14851,14380,14379,14378,12610,12032, 9670, 7609, 6543, 6085, 5335,
4590, 4112, 3825,
  0
}
};
```

2396

FIG 23(8)

```
unsigned short ari_cf_r [4] ={(3<<14)/4,(2<<14)/4,(1<<14)/4, 0};
```

FIG 24

AUDIO ENCODER, AUDIO DECODER, METHOD FOR ENCODING AND AUDIO INFORMATION, METHOD FOR DECODING AN AUDIO INFORMATION AND COMPUTER PROGRAM USING A HASH TABLE DESCRIBING BOTH SIGNIFICANT STATE VALUES AND INTERVAL BOUNDARIES

CROSS-REFERENCE TO RELATED APPLICATIONS

This application is a continuation of copending International Application No. PCT/EP2011/050272, filed Jan. 11, 2011, which is incorporated herein by reference in its entirety, and additionally claims priority from U.S. Application No. 61/294,357, filed Jan. 12, 2010, which is also incorporated herein by reference in its entirety.

Embodiments according to the invention are related to an audio decoder for providing a decoded audio information on the basis of an encoded audio information, an audio encoder for providing an encoded audio information on the basis of an input audio information, a method for providing a decoded audio information on the basis of an encoded audio information, a method for providing an encoded audio information on the basis of an input audio information and a computer program.

Embodiments according to the invention are related to an improved spectral noiseless coding, which can be used in an audio encoder or decoder, like, for example, a so-called unified-speech-and-audio coder (USAC).

BACKGROUND OF THE INVENTION

In the following, the background of the invention will be briefly explained in order to facilitate the understanding of the invention and the advantages thereof. During the past decade, big efforts have been put on creating the possibility to digitally store and distribute audio contents with good bitrate efficiency. One important achievement on this way is the definition of the International Standard ISO/IEC 14496-3. Part 3 of this Standard is related to an encoding and decoding of audio contents, and subpart 4 of part 3 is related to general audio coding. ISO/IEC 14496 part 3, subpart 4 defines a concept for encoding and decoding of general audio content. In addition, further improvements have been proposed in order to improve the quality and/or to reduce the bit rate that may be used.

According to the concept described in said Standard, a time-domain audio signal is converted into a time-frequency representation. The transform from the time-domain to the time-frequency-domain is typically performed using transform blocks, which are also designated as "frames", of time-domain samples. It has been found that it is advantageous to use overlapping frames, which are shifted, for example, by half a frame, because the overlap allows to efficiently avoid (or at least reduce) artifacts. In addition, it has been found that a windowing should be performed in order to avoid the artifacts originating from this processing of temporally limited frames.

By transforming a windowed portion of the input audio signal from the time-domain to the time-frequency domain, an energy compaction is obtained in many cases, such that some of the spectral values comprise a significantly larger magnitude than a plurality of other spectral values. Accordingly, there are, in many cases, a comparatively small number of spectral values having a magnitude, which is significantly above an average magnitude of the spectral values. A typical example of a time-domain to time-frequency domain transform resulting in an energy compaction is the so-called modified-discrete-cosine-transform (MDCT).

The spectral values are often scaled and quantized in accordance with a psychoacoustic model, such that quantization errors are comparatively smaller for psychoacoustically more important spectral values, and are comparatively larger for psychoacoustically less-important spectral values. The scaled and quantized spectral values are encoded in order to provide a bitrate-efficient representation thereof.

For example, the usage of a so-called Huffman coding of quantized spectral coefficients is described in the International Standard ISO/IEC 14496-3:2005(E), part 3, subpart 4.

However, it has been found that the quality of the coding of the spectral values has a significant impact on the bitrate that may be used. Also, it has been found that the complexity of an audio decoder, which is often implemented in a portable consumer device, and which should therefore be cheap and of low power consumption, is dependent on the coding used for encoding the spectral values.

In view of this situation, there is a need for a concept for an encoding and decoding of an audio content, which provides for an improved trade-off between bitrate-efficiency and resource efficiency.

SUMMARY

According to an embodiment, an audio decoder for providing a decoded audio information on the basis of an encoded audio information may have: an arithmetic decoder for providing a plurality of decoded spectral values on the basis of an arithmetically encoded representation of the spectral values included in the encoded audio information; and a frequency-domain-to-time-domain converter for providing a time-domain audio representation using the decoded spectral values, in order to acquire the decoded audio information; wherein the arithmetic decoder is configured to select a mapping rule describing a mapping of a code value of the arithmetically-encoded representation of spectral values onto a symbol code representing one or more of the decoded spectral values, or at least a portion of one or more of the decoded spectral values in dependence on a context state described by a numeric current context value; wherein the arithmetic decoder is configured to determine the numeric current context value in dependence on a plurality of previously decoded spectral values; wherein the arithmetic decoder is configured to evaluate a hash table, entries of which define both significant state values amongst the numeric context values and boundaries of intervals of non-significant state values amongst the numeric context values, in order to select the mapping rule, wherein a mapping rule index value is individually associated to a numeric context value being a significant state value, and wherein a common mapping rule index value is associated to different numeric context values laying within one of said intervals bounded by said interval boundaries.

According to another embodiment, an audio encoder for providing an encoded audio information on the basis of an input audio information may have: an energy-compacting time-domain-to-frequency-domain converter for providing a frequency-domain audio representation on the basis of a time-domain representation of the input audio information, such that the frequency-domain audio representation includes a set of spectral values; and an arithmetic encoder configured to encode a spectral value or a preprocessed version thereof using a variable length codeword, wherein the arithmetic encoder is configured to map one or more spectral values, or a value of a most significant bit-plane of one or more spectral values, onto a code value, wherein the arithmetic encoder is configured to select a mapping rule describing a mapping of one or more spectral values, or of a most significant bit-plane of one or more spectral values, onto a code value, in dependence on a context state described by a numeric current context value; and wherein the arithmetic encoder is configured to determine the numeric current context value in dependence on a plurality of previously-encoded spectral values; and wherein the arithmetic encoder is configured to evaluate a hash table, entries of which define both significant state values amongst the numeric context values and boundaries of intervals of non-significant state values amongst the numeric context values, wherein a mapping rule index value is individually associated to a numeric context value being a significant state value, and wherein a common mapping rule index value is associated to different numeric context values laying within one of said intervals bounded by said interval boundaries; wherein the encoded audio information includes a plurality of variable-length codewords.

According to another embodiment, a method for providing a decoded audio information on the basis of an encoded audio information may have the steps of: providing a plurality of decoded spectral values on the basis of an arithmetically-encoded representation of the spectral values included in the encoded audio information; and providing a time-domain audio representation using the decoded spectral values, in order to acquire the decoded audio information; wherein providing the plurality of decoded spectral values includes selecting a mapping rule describing a mapping of a code value of the arithmetically-encoded representation of spectral values onto a symbol code representing one or more of the decoded spectral values, or a most significant bit-plane of one or more of the decoded spectral values in dependence on a context state described by a numeric current context value; and wherein the numeric current context value is determined in dependence on a plurality of previously decoded spectral values; wherein a hash table, entries of which define both significant state values amongst the numeric context values and boundaries of intervals of non-significant state values amongst the numeric context values, is evaluated, wherein a mapping rule index value is individually associated to a numeric context value being a significant state value, and wherein a common mapping rule index value is associated to different numeric context values laying within one of said intervals bounded by said interval boundaries.

According to another embodiment, a method for providing an encoded audio information on the basis of an input audio information may have the steps of: providing a frequency-domain audio representation on the basis of a time-domain representation of the input audio information using an energy-compacting time-domain-to-frequency-domain conversion, such that the frequency-domain audio representation includes a set of spectral values; and arithmetically encoding a spectral value, or a preprocessed version thereof, using a variable-length codeword, wherein one or more spectral values or a value of a most significant bit-plane of one or more spectral values is mapped onto a code value; wherein a mapping rule describing a mapping of one or more spectral values, or of a most significant bit-plane of one or more spectral values, onto a code value is selected in dependence on a context state described by a numeric current context value; wherein the numeric current context value is determined in dependence on a plurality of previously-encoded adjacent spectral values; wherein a hash table, entries of which define both significant state values amongst the numeric context values and boundaries of intervals of non-significant state values amongst the numeric context values, is evaluated, wherein a mapping rule index value is individually associated to a numeric current context value being a significant state value, and wherein a common mapping rule index value is associated to different numeric context values laying within one of said intervals bounded by said interval boundaries; wherein the encoded audio information includes a plurality of variable length codewords.

Another embodiment may have a computer program for performing the method according to claim 15, when the computer program runs on a computer.

Another embodiment may have a computer program for performing the method according to claim 16, when the computer program runs on a computer.

An embodiment according to the invention creates an audio decoder for providing a decoded audio information on the basis of an encoded audio information. The audio decoder comprises an arithmetic decoder for providing a plurality of decoded spectral values on the basis of an arithmetically-encoded representation of the spectral values. The audio decoder also comprises a frequency-domain-to-time-domain converter for providing a time-domain audio representation using the decoded spectral values, in order to obtain the decoded audio information. The arithmetic decoder is configured to select a mapping rule describing a mapping of a code value onto a symbol code (which symbol code typically describes a spectral value or a plurality of spectral values or a most-significant bit plane of a spectral value or of a plurality of spectral values) in dependence on a context state described by a numeric current context value. The arithmetic decoder is configured to determine the numeric current context value in dependence on a plurality of previously decoded spectral values. The arithmetic decoder is further configured to evaluate a hash table, entries of which define both, significant state values amongst the numeric context values and boundaries of intervals of numeric context values, in order to select the mapping rule. A mapping rule index value is individually associated to a numeric context value being a significant state value. A common mapping rule index value is associated to different numeric context values laying within an interval bounded by interval boundaries (wherein the interval boundaries are described by the entries of the hash table).

This embodiment according to the invention is based on the finding that a computational efficiency when mapping a numeric current context value onto a mapping rule index value can be improved over conventional solutions by using a single hash table, entries of which define both significant state values amongst the numerical context values and boundaries of intervals of the numeric context values. Accordingly, a table search through a single table is sufficient in order to map a comparatively large number of possible values of the numeric current context value onto a comparatively small number of different mapping rule index values. Associating a double meaning to the entries of the hash table, and advantageously to a single entry of the hash table, allows to keep the number of table accesses small, which, in turn, reduces the computational resources that may be used for the selection of the mapping rule. Moreover, it has been found that the usage of hash table entries which define both significant state values amongst the numeric context values and boundaries of intervals of the numeric context values is typically well-adapted to an efficient context mapping, because typically there are comparatively large intervals of numeric context values, for which a common mapping rule index value should be used, wherein such intervals of numeric context values are typically separated by significant state values of the numeric context value. However, it has been found that the inventive concept, in which the entries of the hash-table define both significant state values and boundaries of intervals of the numeric context values is even well-suited in these cases in which two intervals of numeric context values, to which different mapping rule index values are associated, are directly adjacent without a significant state value in between.

To summarize, the usage of a hash-table, entries of which define both significant state values amongst the numeric context values and boundaries of intervals of the numeric context values, provides for a good trade-off between coding efficiency, computational complexity and memory demand.

In an embodiment, the arithmetic decoder is configured to compare the numeric current context value, or a scaled version of the numeric current context value, with a plurality of numerically ordered entries of the hash-table to obtain a hash-table index value of a hash-table entry, such that the numeric current context value lies within an interval defined by the hash table entry designated by the obtained hash-table index value and an adjacent hash-table entry. The arithmetic decoder is advantageously configured to determine whether the numeric current context value comprises a value defined by an entry of the hash-table designated by the obtained hash-table index value, and to selectively provide, in dependence on a result of the determination, a mapping rule index value individually associated to a numeric (current) context value defined by the entry of the hash-table designated by the obtained hash-table index value, or a mapping rule index value designated by the obtained hash-table index value and associated to different numeric (current) context values within an interval bounded, at one side, by a state value (also designated as context value) defined by the entry of the hash-table designated by the obtained hash-table index value. Accordingly, the entries of the hash-table can define both significant state values (also designated as significant context values) and intervals of the numeric (current) context value. A final decision, whether a numeric current context value is a significant state value or lies within an interval of state values, to which a common mapping rule index value is associated, is made by comparing the numeric current context value with the state value represented by the finally obtained entry of the hash-table. Accordingly, an efficient mechanism is created to make use of the double-meaning of the entries of the hash-table.

In an embodiment, the arithmetic decoder is configured to determine, using the hash-table, whether the numeric current context value is equal to an interval boundary state value (which is typically, but not necessarily, a significant state value) defined by an entry of the hash-table, or lies within an interval defined by two (advantageously adjacent) entries of the hash-table. Accordingly, the arithmetic decoder is advantageously configured to provide a mapping rule index value associated with an entry of the hash-table, if it is found that the numeric current context value is equal to an interval boundary state value, and to provide a mapping rule index value associated with an interval between state values defined by two adjacent entries of the hash-table, if it is found that the numeric current context value lies within an interval between boundary state values defined by two adjacent entries of the hash-table. The arithmetic decoder is further configured to select a cumulative frequencies table for the arithmetic decoder in dependence on the mapping rule index value. Accordingly, the arithmetic decoder is configured to provide a "dedicated" mapping rule index value for a numeric current context value which is equal to an interval boundary state value, while providing an "interval-related" mapping rule index value otherwise. Accordingly, it is possible to handle both significant states and transitions between two intervals using a common and computationally efficient mechanism.

In an embodiment, a mapping rule index value associated with the first given entry of the hash-table is different from a mapping rule index value associated with a first interval of numeric context values, an upper boundary of which is defined by the first given entry of the hash-table, and also different from a mapping rule index value associated with a second interval of the numeric context values, a lower boundary of which is defined by the first given entry of the hash-table, such that the first given entry of the hash-table defines, by a single value, boundaries of two intervals of numeric (current) context values and a significant state of the numeric (current) context value. In this case, the first interval is bounded by the state value defined by the first given entry of the hash-table, wherein the state value defined by the first given entry of the hash-table does not belong to the first interval. Similarly, the second interval is bounded by the state value defined by the first given entry of the hash-table, wherein the state value defined by the first given entry of the hash-table does not belong to the second interval. Moreover, it should be noted that using this mechanism, it is possible to "individually" associate a "dedicated" mapping index rule value to a single numeric current context state, which is numerically between the highest state value (also designated a context value) of the first interval and the lowest state value (also designated as context value) of the second interval (wherein there is typically one integer number between the highest numeric value of the first interval and the lowest numeric value of the second interval, namely the number defined by the first given entry of the hash-table. Thus, particularly characteristic numeric current context values can be mapped onto an individually associated mapping rule index value, while other less characteristic numeric current context values can be mapped to associated mapping rule index values on an interval-basis.

In an embodiment, the mapping rule index value associated with the first interval of context values is equal to the mapping rule index value associated with the second interval of context values, such that the first given entry of the hash-table defines an isolated significant state value within a two-sided environment of non-significant state values. In other words, it is possible to map a particularly characteristic numeric current context value to an associated mapping rule index value, while adjacent numeric current context values on both sides of said particularly characteristic numeric current context values are mapped to a common mapping rule index value, which is different from the mapping rule index value associated with the particularly characteristic numeric current context value.

In an embodiment, a mapping rule index value associated with a second given entry of the hash-table is identical to a mapping rule index value associated with a third interval of context values, a boundary of which is defined by the second given entry of the hash-table, and different from a mapping rule index value associated with a fourth interval of context values, a boundary of which is defined by the second given entry of the hash-table, such that the second given entry of the hash-table defines a boundary between two intervals of the numeric current context values without defining a significant state of the numeric context values. Thus, the concept according to the present invention also allows defining adjacent intervals of numeric (current) context values, to which different mapping rule index values are associated, without the presence of a significant state in between. This can be achieved using a relatively simple and computationally efficient mechanism.

In an embodiment, the arithmetic decoder is configured to evaluate a single hash-table, numerically ordered entries of which define both significant state values amongst the numeric context values and boundaries of intervals of the numeric context values, to obtain a hash-table index value designating an interval, out of the intervals defined by the entries of the hash-table, in which the numeric current context value lies, and to subsequently determine, using the table entry designated by the obtained hash-table index value, whether the numeric current context value takes a significant state value or a non-significant state value. By using such a concept, a complexity of computations which are performed iteratively can be kept reasonably small, such that a plurality of numerically ordered entries of the hash-table can be evaluated with low computational effort. Only in a final step, which may be performed only once per numeric current context value, the decision may be made whether the numeric current context value takes a significant state value or a non-significant state value.

In an embodiment, the arithmetic decoder is configured to selectively evaluate a mapping table, which maps interval index values onto mapping rule index values, if it is found that the numeric current context value does not take a significant state value, to obtain a mapping rule index value associated with an interval of non-significant state values (also designated as non-significant context values) within which the numeric current context value lies. Accordingly, a computationally efficient mechanism is created for obtaining a mapping rule index value for an interval of numeric current context values defined by entries of the hash-table.

In an embodiment, the entries of the hash-table are numerically ordered, and the arithmetic decoder is configured to evaluate a sequence of entries of the hash-table, to obtain a result hash-table index value of a hash-table entry, such that the numeric current context value lies within an interval defined by the hash-table entry designated by the obtained result hash-table index value and an adjacent hash-table entry. In this case, the arithmetic decoder is configured to perform a predetermined number of iterations in order to iteratively determine the result hash-table index value. Each iteration comprise only a single comparison between a state value represented by a current entry of the hash-table and a state value represented by the numeric current context value, and a selective update of a current hash-table index value in dependence on a result of said single comparison. Accordingly, a low computational complexity for evaluating the hash-table and for identifying a mapping rule index value is obtained.

In an embodiment, the arithmetic decoder is configured to distinguish between a numeric current context value comprising a significant state value, and a numeric current context value comprising a non-significant state value, only after the execution of the predetermined number of iterations. By doing so, the computational complexity is reduced, because the evaluation performed in each of the iterations is kept simple.

Another embodiment according to the invention relates to an audio encoder for providing encoded audio information on the basis of an input audio information. The audio encoder comprises an energy-compacting time-domain-to-frequency-domain converter for providing a frequency-domain audio representation on the basis of a time-domain representation of the input audio information, such that the frequency-domain audio representation comprises a set of spectral values. The audio encoder also comprises an arithmetic encoder configured to encode a spectral value, or a pre-processed version thereof, or—equivalently—a plurality of spectral values or a preprocessed version thereof, using a variable length codeword. The arithmetic encoder is configured to map a spectral value, or a value of a most significant bit-plane of a spectral value (or, equivalently, a plurality of spectral values, or a value of a most-significant bit-plane of a plurality of spectral values) onto a code value. The arithmetic encoder is configured to select a mapping rule describing a mapping of a spectral value, or of a most significant bit-plane of a spectral value, onto a code value, in dependence on a context state described by a numeric current context value. The arithmetic encoder is configured to determine the numeric current context value in dependence on a plurality of previously-encoded spectral values. The arithmetic encoder is configured to evaluate a hash-table, entries of which define both significant state values amongst the numeric context values and boundaries of intervals of the numeric context values, wherein a mapping rule index value is individually associated to a numeric (current) context value being a significant state value, and wherein a common mapping rule index value is associated to different numeric (current) context values laying within an interval bounded by interval boundaries (wherein the interval boundaries are described by the entries of the hash table).

This audio encoder is based on the same findings as the above discussed audio decoder and can be supplemented by the same features and functionalities as the above described audio decoder, wherein encoded spectral values take the place of decoded spectral values. In particular, the computation of the mapping rule index value can be made in the same manner as in the audio encoder.

An embodiment according to the invention creates a method for providing a decoded audio information on the basis of an encoded audio information. The method comprises providing a plurality of decoded spectral values on the basis of an arithmetically-encoded representation of the spectral values and providing a time-domain audio representation using the decoded spectral values, in order to obtain the decoded audio information. Providing the plurality of decoded spectral values comprises selecting a mapping rule describing a mapping of a code value representing a spectral value or a most significant bit-plane of a spectral value (or, equivalently, a plurality of spectral values, or a most-significant bit-plane of a plurality of spectral values), in an encoded form onto a symbol code representing a spectral value, or a most significant bit-plane of a spectral value (or, equivalently, a plurality of spectral values, or a most-significant bit-plane of a plurality of spectral values), in a decoded form, in dependence on a context state described by a numeric current context value. The numeric current context value is determined in dependence on a plurality of previously decoded spectral values. A hash-table, entries of which define both significant state values amongst the numeric context values and boundaries of intervals of the numeric context values, is evaluated. A mapping rule index value is individually associated to a numeric current context value being a significant state value, and a common mapping rule index value is associated with a numeric current context value laying within an interval bounded by interval boundaries (wherein the interval boundaries are described by the entries of the hash table).

An embodiment according to the invention creates a method for providing an encoded audio information on the basis of an input audio information. The method comprises providing a frequency-domain audio representation on the basis of a time-domain representation of the input audio information using an energy-compacting time-domain-to frequency-domain conversion, such that the frequency domain audio representation comprises a set of spectral values. The method also comprises arithmetically encoding a spectral value, or a pre-processed version thereof, using a variable length codeword, wherein a spectral value or a value of a most significant bit-plane of a spectral value (or, equivalently, a plurality of spectral values, or a most-significant bit-plane of a plurality of spectral values) is mapped onto a code value. A mapping rule describing a mapping of a spectral value or of a most significant bit-plane of a spectral value (or, equivalently, a plurality of spectral values, or a most-significant bit-plane of a plurality of spectral values) onto a code value is selected in dependence on a context state described by a numeric current context value. The numeric current context value is determined in dependence on a plurality of previously-encoded adjacent spectral values. A hash-table, entries of which define both significant state values amongst the numeric context values and boundaries of intervals of the numeric context values, is evaluated, wherein a mapping rule index value is individually associated to a numeric (current) context value being a significant state value, and wherein a common mapping rule index value is associated to different numeric (current) context values laying within an interval bounded by interval boundaries.

Another embodiment according to the invention relates to a computer program for performing one of the said methods.

BRIEF DESCRIPTION OF THE DRAWINGS

Embodiments of the present invention will be detailed subsequently referring to the appended drawings, in which:

FIG. 3 shows a pseudo-program-code representation of an algorithm "values_decode( )" for decoding spectral values;

FIG. 5*a* shows a pseudo-program-code representation of an algorithm "arith_map_context( )" for mapping a context;

FIG. 5*b* shows a pseudo-program-code representation of another algorithm "arith_map_context( )" for mapping a context;

FIG. 5*c* shows a pseudo-program-code representation of an algorithm "arith_get_context( )" for obtaining a context state value;

FIG. 5*d* shows a pseudo-program-code representation of another algorithm "arith_get_context( )" for obtaining a context state value;

FIG. 5*e* shows a pseudo-program-code representation of an algorithm "arith_get_pk( )" for deriving a cumulative-frequencies-table index value "pki" from a state value (or a state variable);

FIG. 5*f* shows a pseudo-program-code representation of another algorithm "arith_get_pk( )" for deriving a cumulative-frequencies-table index value "pki" from a state value (or a state variable);

FIG. 5*g* shows a pseudo-program-code representation of an algorithm "arith_decode( )" for arithmetically decoding a symbol from a variable length codeword;

FIG. 5*h* shows a first part of a pseudo-program-code representation of another algorithm "arith_decode( )" for arithmetically decoding a symbol from a variable length codeword;

FIG. 5*i* shows a second part of a pseudo-program-code representation of the other algorithm "arith_decode( )" for arithmetically decoding a symbol from a variable length codeword;

FIG. 5*j* shows a pseudo-program-code representation of an algorithm for deriving absolute values a,b of spectral values from a common value m;

FIG. 5*k* shows a pseudo-program-code representation of an algorithm for entering the decoded values a,b into an array of decoded spectral values;

FIG. 5*l* shows a pseudo-program-code representation of an algorithm "arith_update_context( )" for obtaining a context subregion value on the basis of absolute values a,b of decoded spectral values;

FIG. 5*m* shows a pseudo-program-code representation of an algorithm "arith_finish( )" for filling entries of an array of decoded spectral values and an array of context subregion values;

FIG. 5*n* shows a pseudo-program-code representation of another algorithm for deriving absolute values a,b of decoded spectral values from a common value m;

FIG. 5*o* shows a pseudo-program-code representation of an algorithm "arith_update_context( )" for updating an array of decoded spectral values and an array of context subregion values;

FIG. 5*p* shows a pseudo-program-code representation of an algorithm "arith_save_context( )" for filling entries of an array of decoded spectral values and entries of an array of context subregion values;

FIG. 5*q* shows a legend of definitions;

FIG. 5*r* shows another legend of definitions;

FIG. 6*a* shows a syntax representation of a unified-speech-and-audio-coding (USAC) raw data block;

FIG. 6*b* shows a syntax representation of a single channel element;

FIG. 6*c* shows a syntax representation of a channel pair element;

FIG. 6*d* shows a syntax representation of an "ICS" control information;

FIG. 6*e* shows a syntax representation of a frequency-domain channel stream;

FIG. 6*f* shows a syntax representation of arithmetically coded spectral data;

FIG. 6*g* shows a syntax representation for decoding a set of spectral values;

FIG. 6*h* shows another syntax representation for decoding a set of spectral values;

FIG. 6*i* shows a legend of data elements and variables;

FIG. 6*j* shows another legend of data elements and variables;

FIG. 14*b* shows an overview of the tables as used in the arithmetic coding scheme according to working draft 4 of the USAC Draft Standard;

FIG. 15*b* shows an overview of the tables as used in the arithmetic coding scheme according to the present invention;

FIG. 18 shows a table representation of average bit rates produced by a USAC arithmetic coder according to working draft 3 of the USAC Draft Standard and according to an embodiment of the present invention;

FIG. 19 shows a table representation of minimum and maximum bit reservoir levels for an arithmetic decoder according to working draft 3 of the USAC Draft Standard and for an arithmetic decoder according to an embodiment of the present invention;

FIG. 20 shows a table representation of average complexity numbers for decoding a 32-kbits bitstream according to working draft 3 of the USAC Draft Standard for different versions of the arithmetic coder;

FIGS. 21(1) and 21(2) show a table representation of a content of a table "ari_lookup_m[600]";

FIGS. 22(1) to 22(4) show a table representation of a content of a table "ari_hash_m[600]";

FIGS. 23(1) to 23(8) show a table representation of a content of a table "ari_cf_m[96][17]"; and FIG. 24 shows a table representation of a content of a table "ari_cf_r[ ]".

DETAILED DESCRIPTION OF THE INVENTION

1. Audio Encoder According to FIG. 7

Figure 7:
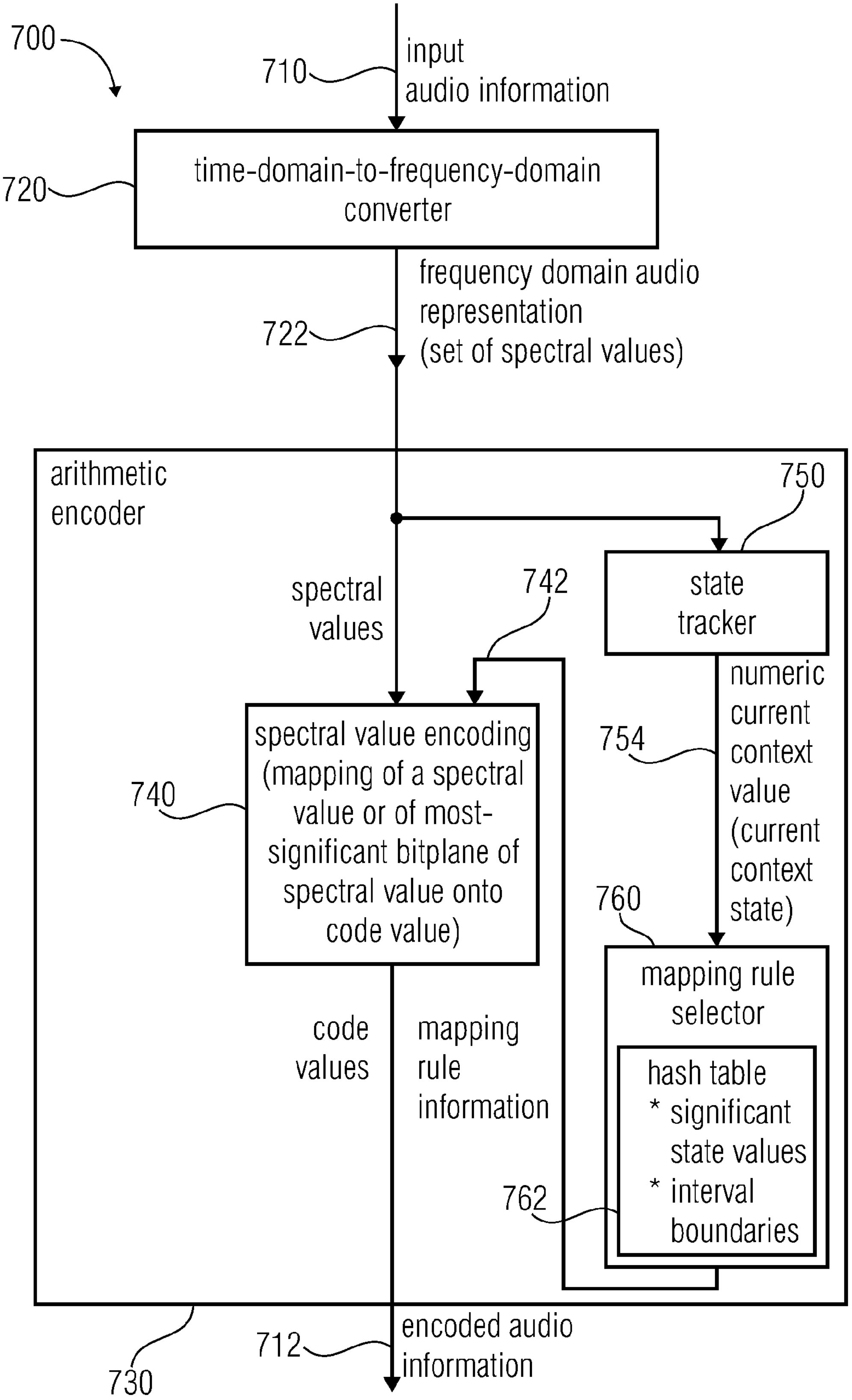
FIG. 7 shows a block schematic diagram of an audio encoder, according to the first aspect of the invention.

FIG. 7 shows a block schematic diagram of an audio encoder, according to an embodiment of the invention. The audio encoder 700 is configured to receive an input audio information 710 and to provide, on the basis thereof, an encoded audio information 712. The audio encoder comprises an energy-compacting time-domain-to-frequency-domain converter 720 which is configured to provide a frequency-domain audio representation 722 on the basis of a time-domain representation of the input audio information 710, such that the frequency-domain audio representation 722 comprises a set of spectral values. The audio encoder 700 also comprises an arithmetic encoder 730 configured to encode a spectral value (out of the set of spectral values forming the frequency-domain audio representation 722), or a pre-processed version thereof, using a variable-length codeword in order to obtain the encoded audio information 712 (which may comprise, for example, a plurality of variable-length codewords).

The arithmetic encoder 730 is configured to map a spectral value, or a value of a most-significant bit-plane of a spectral value, onto a code value (i.e. onto a variable-length codeword) in dependence on a context state. The arithmetic encoder is configured to select a mapping rule describing a mapping of a spectral value, or of a most-significant bit-plane of a spectral value, onto a code value, in dependence on a (current) context state. The arithmetic encoder is configured to determine the current context state, or a numeric current context value describing the current context state, in dependence on a plurality of previously-encoded (advantageously, but not necessarily, adjacent) spectral values. For this purpose, the arithmetic encoder is configured to evaluate a hash-table, entries of which define both significant state values amongst the numeric context values and boundaries of intervals of numeric context values, wherein a mapping rule index value is individually associated to a numeric (current) context value being a significant state value, and wherein a common mapping rule index value is associated to different numeric (current) context values lying within an interval bounded by interval boundaries (wherein the interval boundaries are advantageously defined by the entries of the hash table).

As can be seen, the mapping of a spectral value (of the frequency-domain audio representation 722), or of a most-significant bit-plane of a spectral value, onto a code value (of the encoded audio information 712), may be performed by a spectral value encoding 740 using a mapping rule 742. A state tracker 750 may be configured to track the context state. The state tracker 750 provides an information 754 describing the current context state. The information 754 describing the current context state may advantageously take the form of a numeric current context value. A mapping rule selector 760 is configured to select a mapping rule, for example, a cumulative-frequencies-table, describing a mapping of a spectral value, or of a most-significant bit-plane of a spectral value, onto a code value. Accordingly, the mapping rule selector 760 provides the mapping rule information 742 to the spectral value encoding 740. The mapping rule information 742 may take the form of a mapping rule index value or of a cumulative-frequencies-table selected in dependence on a mapping rule index value. The mapping rule selector 760 comprises (or at least evaluates) a hash-table 752, entries of which define both significant state values amongst the numeric context values and boundaries and intervals of numeric context values, wherein a mapping rule index value is individually associated to a numeric context value being a significant state value, and wherein a common mapping rule index value is associated to different numeric context values lying within an interval bounded by interval boundaries. The hash-table 762 is evaluated in order to select the mapping rule, i.e. in order to provide the mapping rule information 742.

To summarize the above, the audio encoder 700 performs an arithmetic encoding of a frequency-domain audio representation provided by the time-domain-to-frequency-domain converter. The arithmetic encoding is context-dependent, such that a mapping rule (e.g. a cumulative-frequencies-table) is selected in dependence on previously encoded spectral values. Accordingly, spectral values adjacent in time and/or frequency (or, at least, within a predetermined environment) to each other and/or to the currently-encoded spectral value (i.e. spectral values within a predetermined environment of the currently encoded spectral value) are considered in the arithmetic encoding to adjust the probability distribution evaluated by the arithmetic encoding. When selecting an appropriate mapping rule, numeric context current values 754 provided by a state tracker 750 are evaluated. As typically the number of different mapping rules is significantly smaller than the number of possible values of the numeric current context values 754, the mapping rule selector 760 allocates the same mapping rules (described, for example, by a mapping rule index value) to a comparatively large number of different numeric context values. Nevertheless, there are typically specific spectral configurations (represented by specific numeric context values) to which a particular mapping rule should be associated in order to obtain a good coding efficiency.

It has been found that the selection of a mapping rule in dependence on a numeric current context value can be performed with particularly high computational efficiency if entries of a single hash-table define both significant state values and boundaries of intervals of numeric (current) context values. It has been found that this mechanism is well-adapted to the requirements of the mapping rule selection, because there are many cases in which a single significant state value (or significant numeric context value) is embedded between a left-sided interval of a plurality of non-significant state values (to which a common mapping rule is associated) and a right-sided interval of a plurality of non-significant state values (to which a common mapping rule is associated). Also, the mechanism of using a single hash-table, entries of which define both significant state values and boundaries of intervals of numeric (current) context values can efficiently handle different cases, in which, for example, there are two adjacent intervals of non-significant state values (also designated as non-significant numeric context values) without a significant state value in between. A particularly high computational efficiency is achieved due to a number of table accesses being kept small. For example, a single iterative table search is sufficient in most embodiments in order to find out whether the numeric current context value is equal to any of the significant state values, or in which of the intervals of non-significant state values the numeric current context value lays. Consequently, the number of table accesses which are both, time-consuming and energy-consuming, can be kept small. Thus, the mapping rule selector 760, which uses the hash-table 762, may be considered as a particularly efficient mapping rule selector in terms of computational complexity, while still allowing to obtain a good encoding efficiency (in terms of bitrate).

Further details regarding the derivation of the mapping rule information 742 from the numeric current context value 754 will be described below.

2. Audio Decoder According to FIG. 8

Figure 8:
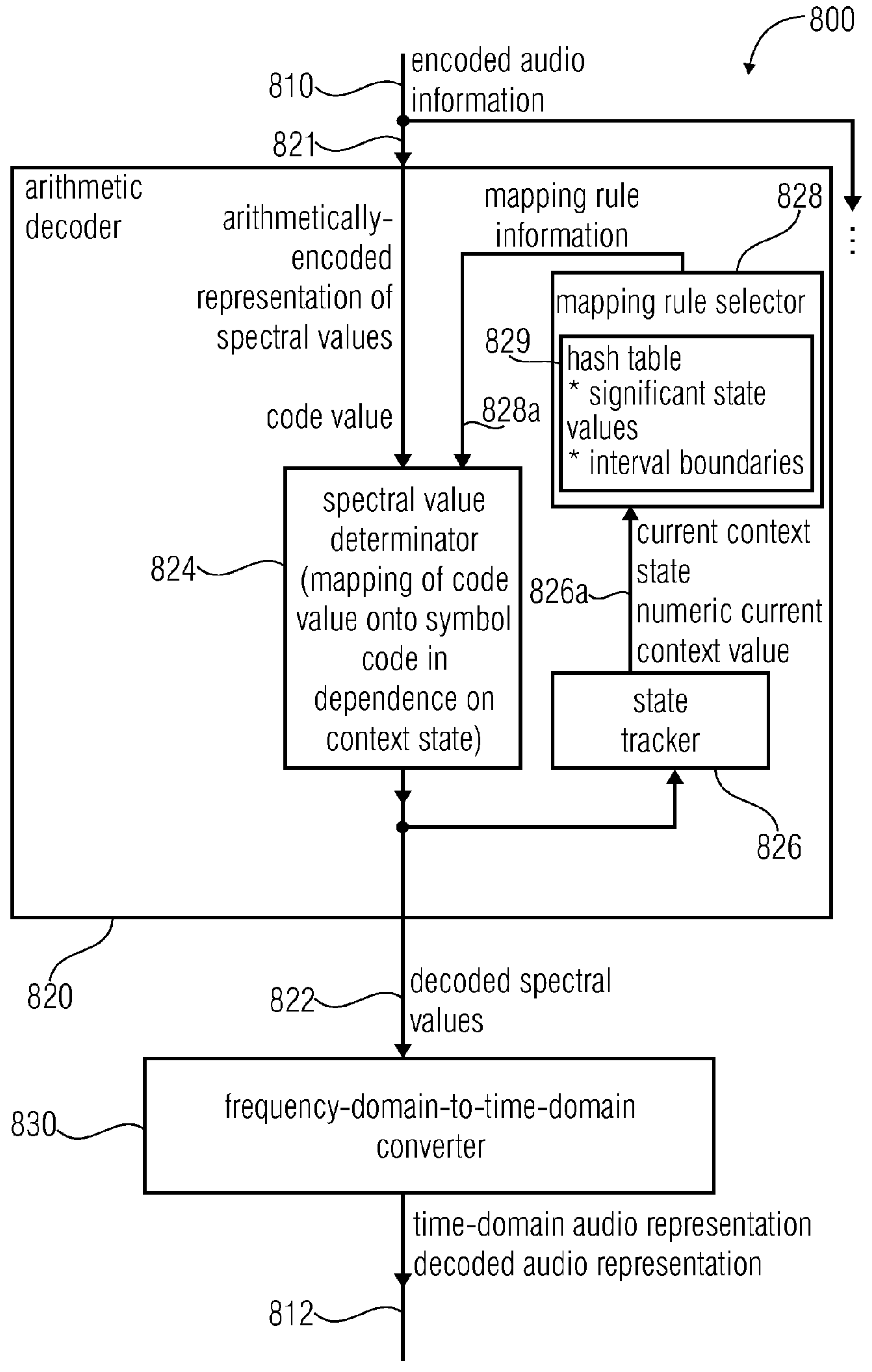
FIG. 8 shows a block schematic diagram of an audio decoder, according to the first aspect of the invention.

FIG. 8 shows a block schematic diagram of an audio decoder 800. The audio decoder 800 is configured to receive an encoded audio information 810 and to provide, on the basis thereof, a decoded audio information 812. The audio decoder 800 comprises an arithmetic decoder 820 which is configured to provide a plurality of spectral values 822 on the basis of an arithmetically encoded representation 821 of the spectral values. The audio decoder 800 also comprises a frequency-domain-to-time-domain converter 830 which is configured to receive the decoded spectral values 822 and to provide the time-domain audio representation 812, which may constitute the decoded audio information, using the decoded spectral values 822, in order to obtain a decoded audio information 812.

The arithmetic decoder 820 comprises a spectral value determinator 824, which is configured to map a code value of the arithmetically-encoded representation 821 of spectral values onto a symbol code representing one or more of the decoded spectral values, or at least a portion (for example, a most-significant bit-plane) of one or more of the decoded spectral values. The spectral value determinator 824 may be configured to perform a mapping in dependence on a mapping rule, which may be described by a mapping rule information 828*a*. The mapping rule information 828*a* may, for example, take the form of a mapping rule index value, or of a selected cumulative-frequencies-table (selected, for example, in dependence on a mapping rule index value).

The arithmetic decoder 820 is configured to select a mapping rule (e.g. a cumulative-frequencies-table) describing a mapping of code values (described by the arithmetically-encoded representation 821 of spectral values) onto a symbol code (describing one or more spectral values, or a most-significant bit-plane thereof) in dependence on a context state (which may be described by the context state information 826*a*). The arithmetic decoder 820 is configured to determine the current context state (described by the numeric current context value) in dependence on a plurality of previously-decoded spectral values. For this purpose, a state tracker 826 may be used, which receives an information describing the previously-decoded spectral values and which provides, on the basis thereof, a numeric current context value 826*a* describing the current context state.

The arithmetic decoder is also configured to evaluate a hash-table 829, entries of which define both significant state values amongst the numeric context values and boundaries of intervals of numeric context values, in order to select the mapping rule, wherein a mapping rule index value is individually associated to a numeric context value being a significant state value, and wherein a common mapping rule index value is associated to different numeric context values lying within an interval bounded by interval boundaries. The evaluation of the hash-table 829 may, for example, be performed using a hash-table evaluator which may be part of the mapping rule selector 828. Accordingly, a mapping rule information 828*a*, for example, in the form of a mapping rule index value, is obtained on the basis of the numeric current context value 826*a* describing the current context state. The mapping rule selector 828 may, for example, determine the mapping rule index value 828*a* in dependence on a result of the evaluation of the hash-table 829. Alternatively, the evaluation of the hash-table 829 may directly provide the mapping rule index value.

Regarding the functionality of the audio signal decoder 800, it should be noted that the arithmetic decoder 820 is configured to select a mapping rule (e.g. a cumulative-frequencies-table) which is, on average, well adapted to the spectral values to be decoded, as the mapping rule is selected in dependence on the current context state (described, for example, by the numeric current context value), which in turn is determined in dependence on a plurality of previously-decoded spectral values. Accordingly, statistical dependencies between adjacent spectral values to be decoded can be exploited. Moreover, the arithmetic decoder 820 can be implemented efficiently, with a good trade-off between computational complexity, table size, and coding efficiency, using the mapping rule selector 828. By evaluating a (single) hash-table 829, entries of which describe both significant state values and interval boundaries of intervals of non-significant state values, a single iterative table search may be sufficient in order to derive the mapping rule information 828*a* from the numeric current context value 826*a*. Accordingly, it is possible to map a comparatively large number of different possible numeric (current) context values onto a comparatively smaller number of different mapping rule index values. By using the hash-table 829, as described above, it is possible to exploit the finding that, in many cases, a single isolated significant state value (significant context value) is embedded between a left-sided interval of non-significant state values (non-significant context values) and a right-sided interval of non-significant state values (non-significant context values), wherein a different mapping rule index value is associated with the significant state value (significant context value), when compared to the state values (context values) of the left-sided interval and the state values (context values) of the right-sided interval. However, usage of the hash-table 829 is also well-suited for situations in which two intervals of numeric state values are immediately adjacent, without a significant state value in between.

To conclude, the mapping rule selector 828, which evaluates the hash-table 829, brings along a particularly good efficiency when selecting a mapping rule (or when providing a mapping rule index value) in dependence on the current context state (or in dependence on the numeric current context value describing the current context state), because the hashing mechanism is well-adapted to the typical context scenarios in an audio decoder.

Further details will be described below.

3. Context Value Hashing Mechanism According to FIG. 9

In the following, a context hashing mechanism will be disclosed, which may be implemented in the mapping rule selector 760 and/or the mapping rule selector 828. The hash-table 762 and/or the hash-table 829 may be used in order to implement said context value hashing mechanism.

Taking reference now to FIG. 9, which shows a numeric current context value hashing scenario, further details will be described. In the graphic representation of FIG. 9, an abscissa 910 describes values of the numeric current context value (i.e. numeric context values). An ordinate 912 describes mapping rule index values. Markings 914 describe mapping rule index values for non-significant numeric context values (describing non-significant states). Markings 916 describe mapping rule index values for "individual" (true) significant numeric context values describing individual (true) significant states. Markings 916 describe mapping rule index values for "improper" numeric context values describing "improper" significant states, wherein an "improper" significant state is a significant state to which the same mapping rule index value is associated as to one of the adjacent intervals of non-significant numeric context values.

As can be seen, a hash-table entry "ari_hash_m[i1]" describes an individual (true) significant state having a numeric context value of c1. As can be seen, the mapping rule index value mriv1 is associated to the individual (true) significant state having the numeric context value c1. Accordingly, both the numeric context value c1 and the mapping rule index value mriv1 may be described by the hash-table entry "ari_hash_m[i1]". An interval 932 of numeric context values is bounded by the numeric context value c1, wherein the numeric context value c1 does not belong to the interval 932, such that the largest numeric context value of interval 932 is equal to c1−1. A mapping rule index value of mriv4 (which is different from mriv1) is associated with the numeric context values of the interval 932. The mapping rule index value mriv4 may, for example, be described by the table entry "ari_lookup_m[i1−1]" of an additional table "ari_lookup_m".

Moreover, a mapping rule index value mriv2 may be associated with numeric context values lying within an interval 934. A lower bound of interval 934 is determined by the numeric context value c1, which is a significant numeric context value, wherein the numeric context value c1 does not belong to the interval 932. Accordingly, the smallest value of the interval 934 is equal to c1+1 (assuming integer numeric context values). Another boundary of the interval 934 is determined by the numeric context value c2, wherein the numeric context value c2 does not belong to the interval 934, such that the largest value of the interval 934 is equal to c2−1. The numeric context value c2 is a so-called "improper" numeric context value, which is described by a hash-table entry "ari_hash_m[i2]". For example, the mapping rule index value mriv2 may be associated with the numeric context value c2, such that the numeric context value associated with the "improper" significant numeric context value c2 is equal to the mapping rule index value associated with the interval 934 bounded by the numeric context value c2. Moreover, an interval 936 of numeric context value is also bounded by the numeric context value c2, wherein the numeric context value c2 does not belong to the interval 936, such that the smallest numeric context value of the interval 936 is equal to c2+1. A mapping rule index value mriv3, which is typically different from the mapping rule index value mriv2, is associated with the numeric context values of the interval 936.

As can be seen, the mapping rule index value mriv4, which is associated to the interval 932 of numeric context values, may be described by an entry "ari_lookup_m[i1−1]" of a table "ari_lookup_m", the mapping rule index mriv2, which is associated with the numeric context values of the interval 934, may be described by a table entry "ari_lookup_m[i1]" of the table "ari_lookup_m", and the mapping rule index value mriv3 may be described by a table entry "ari_lookup_m[i2]" of the table "ari_lookup_m". In the example given here, the hash-table index value i2, may be larger, by 1, than the hash-table index value i1.

Figure 9:
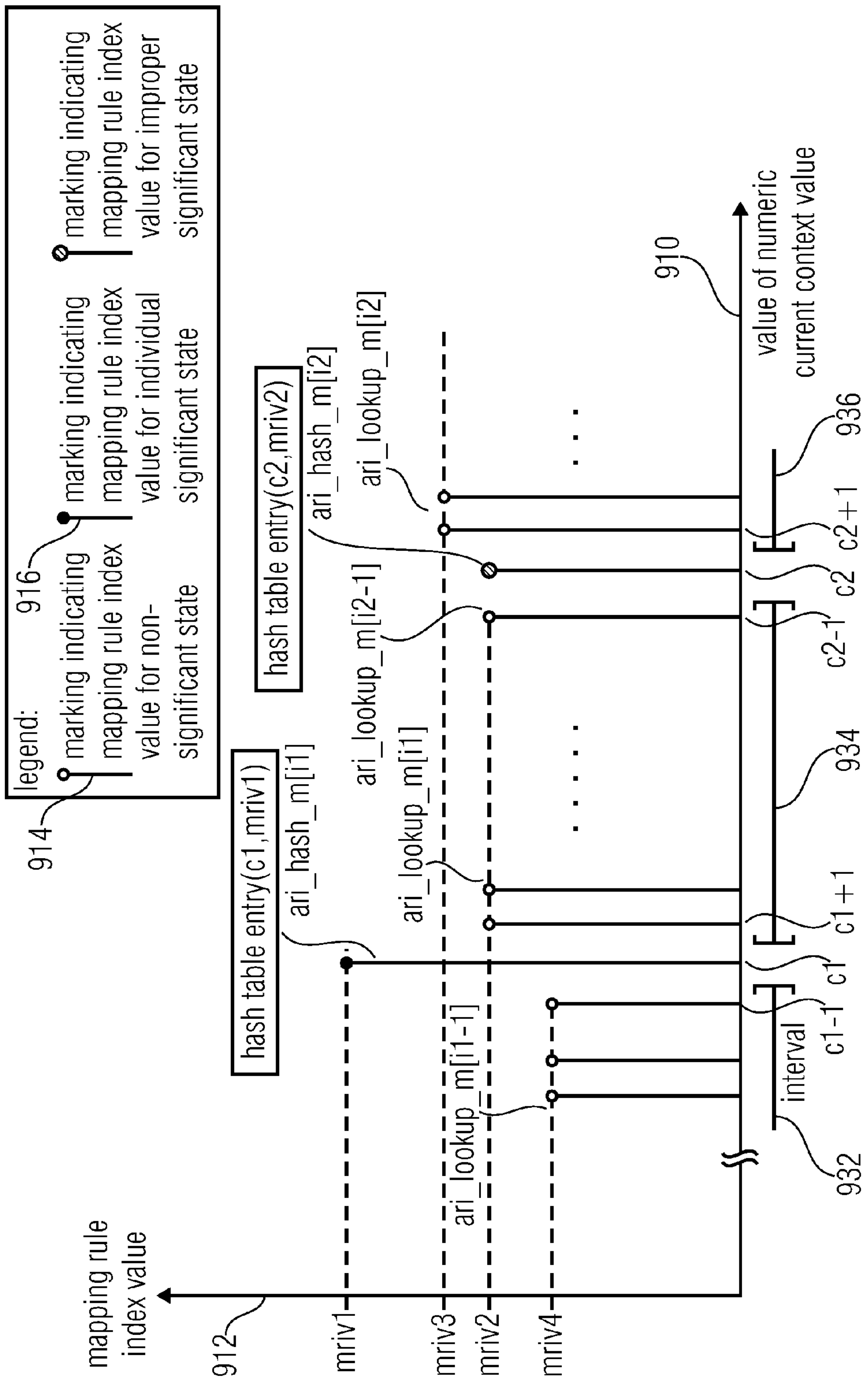
FIG. 9 shows a graphical representation of a mapping of a numeric current context value onto a mapping rule index value, according to the first aspect of the invention.

As can be seen from FIG. 9, the mapping rule selector 760 or the mapping rule selector 828 may receive a numeric current context value 764, 826*a*, and decide, by evaluating the entries of the table "ari_hash_m", whether the numeric current context value is a significant state value (irrespective of whether it is an "individual" significant state value or an "improper" significant state value), or whether the numeric current context value lies within one of the intervals 932, 934, 936, which are bounded by the ("individual" or "improper") significant state values c1, c2. Both the check whether the numeric current context value is equal to a significant state value c1, c2 and the evaluation in which of the intervals 932, 934, 936 the numeric current context value lies (in the case that the numeric current context value is not equal to a significant state value) may be performed using a single, common hash table search.

Moreover, the evaluation of the hash-table "ari_hash_m" may be used to obtain a hash-table index value (for example, i1−1, i1 or i2). Thus, the mapping rule selector 760, 828 may be configured to obtain, by evaluating a single hash-table 762, 829 (for example, the hash-table "ari_hash_m"), a hash-table index value (for example, i1−1, i1 or i2) designating a significant state value (e.g., c1 or c2) and/or an interval (e.g., 932,934,936) and an information as to whether the numeric current context value is a significant context value (also designated as significant state value) or not.

Moreover, if it is found in the evaluation of the hash-table 762, 829, "ari_hash_m", that the numeric current context value is not a "significant" context value (or "significant" state value), the hash-table index value (for example, i1−1, i1 or i2) obtained from the evaluation of the hash-table ("ari_hash_m") may be used to obtain a mapping rule index value associated with an interval 932, 934, 936 of numeric context values. For example, the hash-table index value (e.g., i1−1, i1 or i2) may be used to designate an entry of an additional mapping table (for example, "ari_lookup_m"), which describes the mapping rule index values associated with the interval 932, 934, 936 within which the numeric current context value lies.

For further details, reference is made to the detailed discussion below of the algorithm "arith_get_pk" (wherein there are different options for this algorithm "arith_get_pk( )", examples of which are shown in FIGS. 5*e* and 5*f*).

Moreover, it should be noted that the size of the intervals may differ from one case to another. In some cases, an interval of numeric context values comprises a single numeric context value. However, in many cases, an interval may comprise a plurality of numeric context values.

4. Audio Encoder According to FIG. 10

Figure 10:
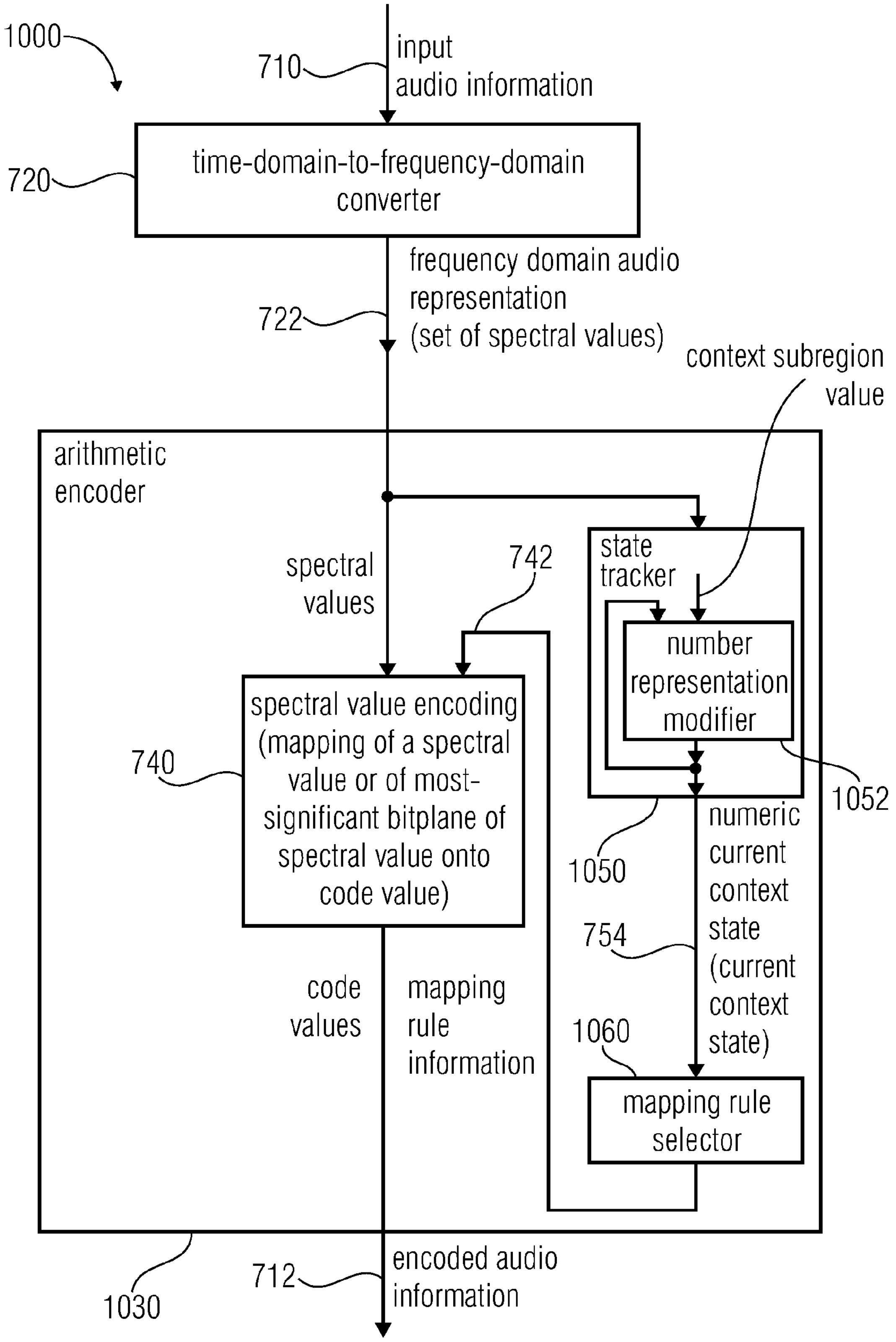
FIG. 10 shows a block schematic diagram of an audio encoder, according to a second aspect of the invention.

FIG. 10 shows a block schematic diagram of an audio encoder 1000 according to an embodiment of the invention. The audio encoder 1000 according to FIG. 10 is similar to the audio encoder 700 according to FIG. 7, such that identical signals and means are designated with identical reference numerals in FIGS. 7 and 10.

The audio encoder 1000 is configured to receive an input audio information 710 and to provide, on the basis thereof, an encoded audio information 712. The audio encoder 1000 comprises an energy-compacting time-domain-to-frequency-domain converter 720, which is configured to provide a frequency-domain representation 722 on the basis of a time-domain representation of the input audio information 710, such that the frequency-domain audio representation 722 comprises a set of spectral values. The audio encoder 1000 also comprises an arithmetic encoder 1030 configured to encode a spectral value (out of the set of spectral values forming the frequency-domain audio representation 722), or a pre-processed version thereof, using a variable-length codeword to obtain the encoded audio information 712 (which may comprise, for example, a plurality of variable-length codewords).

The arithmetic encoder 1030 is configured to map a spectral value, or a plurality of spectral values, or a value of a most-significant bit-plane of a spectral value or of a plurality of spectral values, onto a code value (i.e. onto a variable-length codeword) in dependence on a context state. The arithmetic encoder 1030 is configured to select a mapping rule describing a mapping of a spectral value, or of a plurality of spectral values, or of a most-significant bit-plane of a spectral value or of a plurality of spectral values, onto a code value in dependence on a context state. The arithmetic encoder is configured to determine the current context state in dependence on a plurality of previously-encoded (advantageously, but not necessarily adjacent) spectral values. For this purpose, the arithmetic encoder is configured to modify a number representation of a numeric previous context value, describing a context state associated with one or more previously-encoded spectral values (for example, to select a corresponding mapping rule), in dependence on a context sub-region value, to obtain a number representation of a numeric current context value describing a context state associated with one or more spectral values to be encoded (for example, to select a corresponding mapping rule).

As can be seen, the mapping of a spectral value, or of a plurality of spectral values, or of a most-significant bit-plane of a spectral value or of a plurality of spectral values, onto a code value may be performed by a spectral value encoding 740 using a mapping rule described by a mapping rule information 742. A state tracker 750 may be configured to track the context state. The state tracker 750 may be configured to modify a number representation of a numeric previous context value, describing a context state associated with an encoding of one or more previously-encoded spectral values, in dependence on a context sub-region value, to obtain a number representation of a numeric current context value describing a context state associated with an encoding of one or more spectral values to be encoded. The modification of the number representation of the numeric previous context value may, for example, be performed by a number representation modifier 1052, which receives the numeric previous context value and one or more context sub-region values and provides the numeric current context value. Accordingly, the state tracker 1050 provides an information 754 describing the current context state, for example, in the form of a numeric current context value. A mapping rule selector 1060 may select a mapping rule, for example, a cumulative-frequencies-table, describing a mapping of a spectral value, or of a plurality of spectral values, or of a most-significant bit-plane of a spectral value or of a plurality of spectral values, onto a code value. Accordingly, the mapping rule selector 1060 provides the mapping rule information 742 to the spectral encoding 740.

It should be noted that, in some embodiments, the state tracker 1050 may be identical to the state tracker 750 or the state tracker 826. It should also be noted that the mapping rule selector 1060 may, in some embodiments, be identical to the mapping rule selector 760, or the mapping rule selector 828.

To summarize the above, the audio encoder 1000 performs an arithmetic encoding of a frequency-domain audio representation provided by the time-domain-to-frequency-domain converter. The arithmetic encoding is context dependent, such that a mapping rule (e.g. a cumulative-frequencies-table) is selected in dependence on previously-encoded spectral values. Accordingly, spectral values adjacent in time and/or frequency (or at least within a predetermined environment) to each other and/or to the currently-encoded spectral value (i.e. spectral values within a predetermined environment of the currently-encoded spectral value) are considered in the arithmetic encoding to adjust the probability distribution evaluated by the arithmetic encoding.

When determining the numeric current context value, a number representation of a numeric previous context value, describing a context state associated with one or more previously-encoded spectral values, is modified in dependence on a context sub-region value, to obtain a number representation of a numeric current context value describing a context state associated with one or more spectral values to be encoded. This approach allows avoiding a complete re-computation of the numeric current context value, which complete re-computation consumes a significant amount of resources in conventional approaches. A large variety of possibilities exist for the modification of the number representation of the numeric previous context value, including a combination of a re-scaling of a number representation of the numeric previous context value, an addition of a context sub-region value or a value derived therefrom to the number representation of the numeric previous context value or to a processed number representation of the numeric previous context value, a replacement of a portion of the number representation (rather than the entire number representation) of the numeric previous context value in dependence on the context sub-region value, and so on. Thus, typically the numeric representation of the numeric current context value is obtained on the basis of the number representation of the numeric previous context value and also on the basis of at least one context sub-region value, wherein typically a combination of operations are performed to combine the numeric previous context value with a context sub-region value, such as for example, two or more operations out of an addition operation, a subtraction operation, a multiplication operation, a division operation, a Boolean-AND operation, a Boolean-OR operation, a Boolean- NAND operation, a Boolean NOR operation, a Boolean-negation operation, a complement operation or a shift operation. Accordingly, at least a portion of the number representation of the numeric previous context value is typically maintained unchanged (except for an optional shift to a different position) when deriving the numeric current context value from the numeric previous context value. In contrast, other portions of the number representation of the numeric previous context value are changed in dependence on one or more context sub-region values. Thus, the numeric current context value can be obtained with a comparatively small computational effort, while avoiding a complete re-computation of the numeric current context value.

Thus, a meaningful numeric current context value can be obtained, which is well-suited for the use by the mapping rule selector 1060.

Consequently, an efficient encoding can be achieved by keeping the context calculation sufficiently simple.

5. Audio Decoder According to FIG. 11

Figure 11:
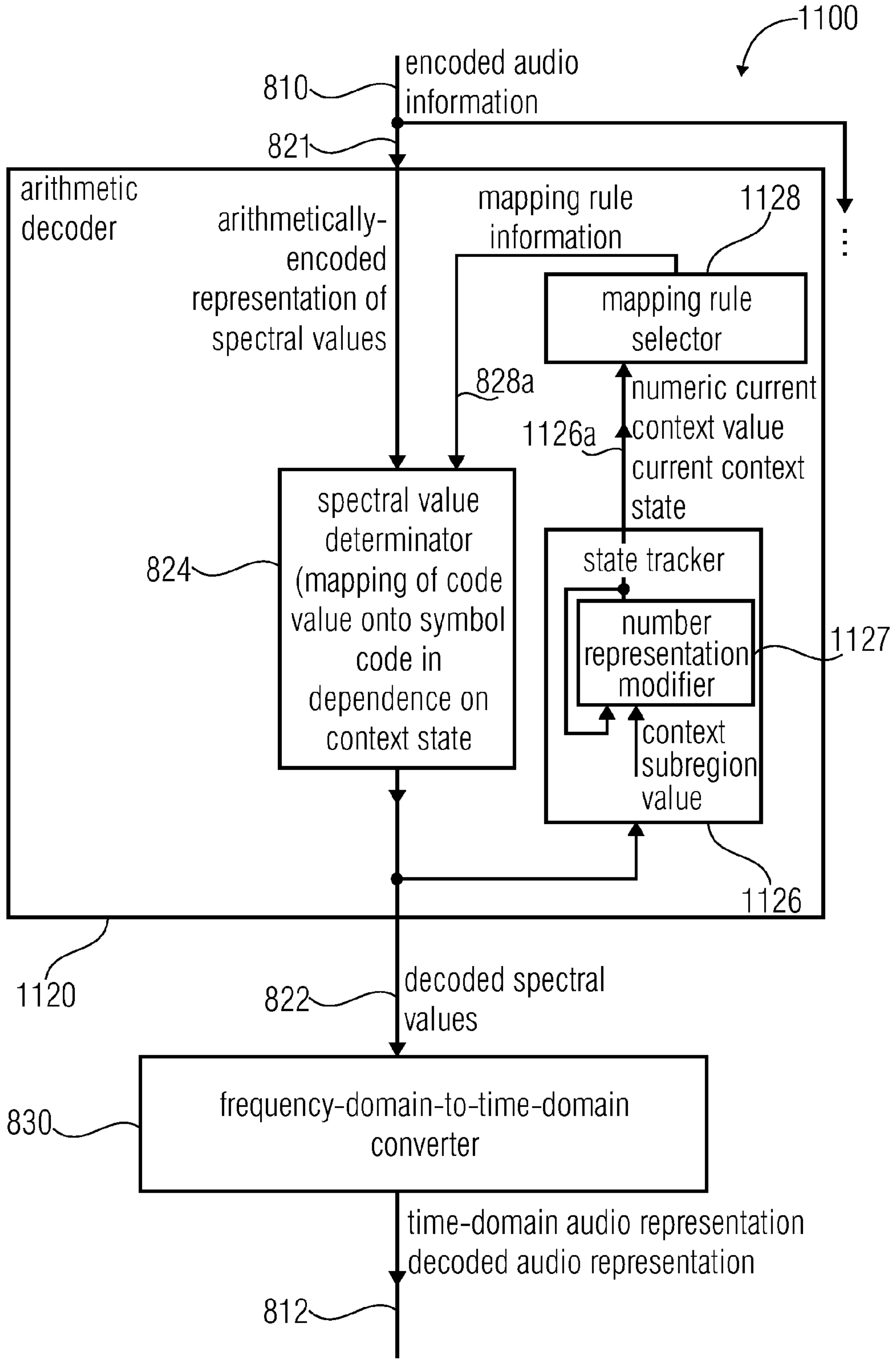
FIG. 11 shows a block schematic diagram of an audio decoder, according to the second aspect of the invention.

FIG. 11 shows a block schematic diagram of an audio decoder 1100. The audio decoder 1100 is similar to the audio decoder 800 according to FIG. 8, such that identical signals, means and functionalities are designated with identical reference numerals.

The audio decoder 1100 is configured to receive an encoded audio information 810 and to provide, on the basis thereof, a decoded audio information 812. The audio decoder 1100 comprises an arithmetic decoder 1120 that is configured to provide a plurality of decoded spectral values 822 on the basis of an arithmetically-encoded representation 821 of the spectral values. The audio decoder 1100 also comprises a frequency-domain-to-time-domain converter 830 which is configured to receive the decoded spectral values 822 and to provide the time-domain audio representation 812, which may constitute the decoded audio information, using the decoded spectral values 822, in order to obtain a decoded audio information 812.

The arithmetic decoder 1120 comprises a spectral value determinator 824, which is configured to map a code value of the arithmetically-encoded representation 821 of spectral values onto a symbol code representing one or more of the decoded spectral values, or at least a portion (for example, a most-significant bit-plane) of one or more of the decoded spectral values. The spectral value determinator 824 may be configured to perform the mapping in dependence on a mapping rule, which may be described by a mapping rule information 828*a*. The mapping rule information 828*a* may, for example, comprise a mapping rule index value, or may comprise a selected set of entries of a cumulative-frequencies-table.

The arithmetic decoder 1120 is configured to select a mapping rule (e.g., a cumulative-frequencies-table) describing a mapping of a code value (described by the arithmetically-encoded representation 821 of spectral values) onto a symbol code (describing one or more spectral values) in dependence on a context state, which context state may be described by the context state information 1126*a*. The context state information 1126*a* may take the form of a numeric current context value. The arithmetic decoder 1120 is configured to determine the current context state in dependence on a plurality of previously-decoded spectral values 822. For this purpose, a state tracker 1126 may be used, which receives an information describing the previously-decoded spectral values. The arithmetic decoder is configured to modify a number representation of numeric previous context value, describing a context state associated with one or more previously decoded spectral values, in dependence on a context sub-region value, to obtain a number representation of a numeric current context value describing a context state associated with one or more spectral values to be decoded. A modification of the number representation of the numeric previous context value may, for example, be performed by a number representation modifier 1127, which is part of the state tracker 1126. Accordingly, the current context state information 1126*a* is obtained, for example, in the form of a numeric current context value. The selection of the mapping rule may be performed by a mapping rule selector 1128, which derives a mapping rule information 828*a* from the current context state information 1126*a*, and which provides the mapping rule information 828*a* to the spectral value determinator 824.

Regarding the functionality of the audio signal decoder 1100, it should be noted that the arithmetic decoder 1120 is configured to select a mapping rule (e.g., a cumulative-frequencies-table) which is, on average, well-adapted to the spectral value to be decoded, as the mapping rule is selected in dependence on the current context state, which, in turn, is determined in dependence on a plurality of previously-decoded spectral values. Accordingly, statistical dependencies between adjacent spectral values to be decoded can be exploited.

Moreover, by modifying a number representation of a numeric previous context value describing a context state associated with a decoding of one or more previously decoded spectral values, in dependence on a context sub-region value, to obtain a number representation of a numeric current context value describing a context state associated with a decoding of one or more spectral values to be decoded, it is possible to obtain a meaningful information about the current context state, which is well-suited for a mapping to a mapping rule index value, with comparatively small computational effort. By maintaining at least a portion of a number representation of the numeric previous context value (possibly in a bit-shifted or a scaled version) while updating another portion of the number representation of the numeric previous context value in dependence on the context sub-region values which have not been considered in the numeric previous context value but which should be considered in the numeric current context value, a number of operations to derive the numeric current context value can be kept reasonably small. Also, it is possible to exploit the fact that contexts used for decoding adjacent spectral values are typically similar or correlated. For example, a context for a decoding of a first spectral value (or of a first plurality of spectral values) is dependent on a first set of previously-decoded spectral values. A context for decoding of a second spectral value (or a second set of spectral values), which is adjacent to the first spectral value (or the first set of spectral values) may comprise a second set of previously-decoded spectral values. As the first spectral value and the second spectral value are assumed to be adjacent (e.g., with respect to the associated frequencies), the first set of spectral values, which determine the context for the coding of the first spectral value, may comprise some overlap with the second set of spectral values, which determine the context for the decoding of the second spectral value. Accordingly, it can easily be understood that the context state for the decoding of the second spectral value comprises some correlation with the context state for the decoding of the first spectral value. A computational efficiency of the context derivation, i.e. of the derivation of the numeric current context value, can be achieved by exploiting such correlations. It has been found that the correlation between context states for a decoding of adjacent spectral values (e.g., between the context state described by the numeric previous context value and the context state described by the numeric current context value) can be exploited efficiently by modifying only those parts of the numeric previous context value which are dependent on context sub-region values not considered for the derivation of the numeric previous context state, and by deriving the numeric current context value from the numeric previous context value.

To conclude, the concepts described herein allow for a particularly good computational efficiency when deriving the numeric current context value.

Further details will be described below.

6. Audio Encoder According to FIG. 12

Figure 12:
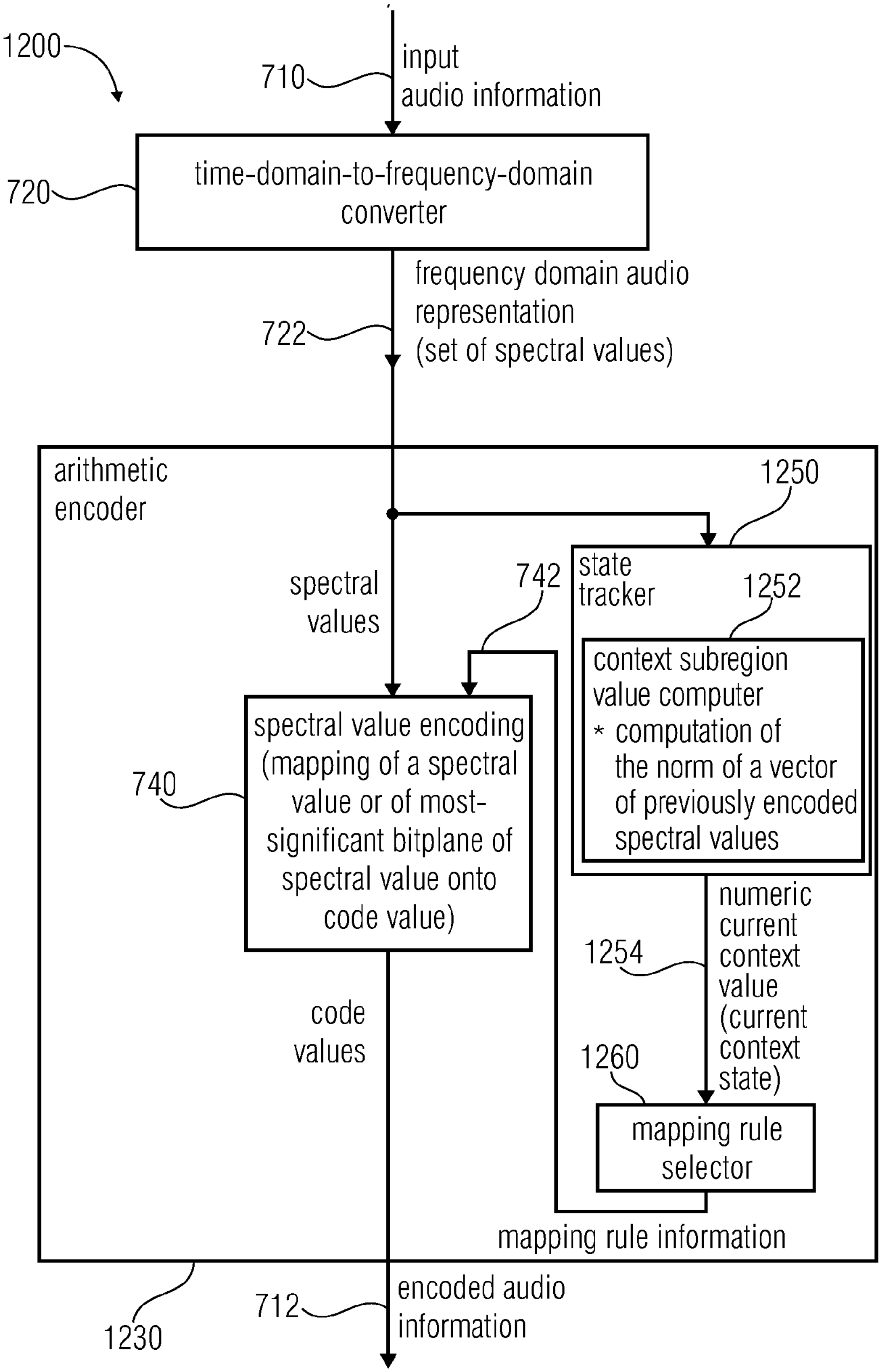
FIG. 12 shows a block schematic diagram of an audio encoder, according to a third aspect of the invention.

FIG. 12 shows a block schematic diagram of an audio encoder, according to an embodiment of the invention. The audio encoder 1200 according to FIG. 12 is similar to the audio encoder 700 according to FIG. 7, such that identical means, signals and functionalities are designated with identical reference numerals.

The audio encoder 1200 is configured to receive an input audio information 710 and to provide, on the basis thereof, an encoded audio information 712. The audio encoder 1200 comprises an energy-compacting time-domain-to-frequency-domain converter 720 which is configured to provide a frequency-domain audio representation 722 on the basis of a time-domain audio representation of the input audio information 710, such that the frequency-domain audio representation 722 comprises a set of spectral values. The audio encoder 1200 also comprises an arithmetic encoder 1230 configured to encode a spectral value (out of the set of spectral values forming the frequency-domain audio representation 722), or a plurality of spectral values, or a pre-processed version thereof, using a variable-length codeword to obtain the encoded audio information 712 (which may comprise, for example, a plurality of variable-length codewords.

The arithmetic encoder 1230 is configured to map a spectral value, or a plurality of spectral values, or a value of a most-significant bit-plane of a spectral value or of a plurality of spectral values, onto a code value (i.e. onto a variable-length codeword), in dependence on a context state. The arithmetic encoder 1230 is configured to select a mapping rule describing a mapping of a spectral value, or of a plurality of spectral values, or of a most-significant bit-plane of a spectral value or of a plurality of spectral values, onto a code value, in dependence on the context state. The arithmetic encoder is configured to determine the current context state in dependence on a plurality of previously-encoded (advantageously, but not necessarily, adjacent) spectral values. For this purpose, the arithmetic encoder is configured to obtain a plurality of context sub-region values on the basis of previously-encoded spectral values, to store said context sub-region values, and to derive a numeric current context value associated with one or more spectral values to be encoded in dependence on the stored context sub-region vales. Moreover, the arithmetic encoder is configured to compute the norm of a vector formed by a plurality of previously encoded spectral values, in order to obtain a common context sub-region value associated with the plurality of previously-encoded spectral values.

As can be seen, the mapping of a spectral value, or of a plurality of spectral values, or of a most-significant bit-plane of a spectral value or of a plurality of spectral values, onto a code value may be performed by a spectral value encoding 740 using a mapping rule described by a mapping rule information 742. A state tracker 1250 may be configured to track the context state and may comprise a context sub-region value computer 1252, to compute the norm of a vector formed by a plurality of previously encoded spectral values, in order to obtain a common context sub-region values associated with the plurality of previously-encoded spectral values. The state tracker 1250 is also advantageously configured to determine the current context state in dependence on a result of said computation of a context sub-region value performed by the context sub-region value computer 1252. Accordingly, the state tracker 1250 provides an information 1254, describing the current context state. A mapping rule selector 1260 may select a mapping rule, for example, a cumulative-frequencies-table, describing a mapping of a spectral value, or of a most-significant bit-plane of a spectral value, onto a code value. Accordingly, the mapping rule selector 1260 provides the mapping rule information 742 to the spectral encoding 740.

To summarize the above, the audio encoder 1200 performs an arithmetic encoding of a frequency-domain audio representation provided by the time-domain-to-frequency-domain converter 720. The arithmetic encoding is context-dependent, such that a mapping rule (e.g., a cumulative-frequencies-table) is selected in dependence on previously-encoded spectral values. Accordingly, spectral values adjacent in time and/or frequency (or, at least, within a predetermined environment) to each other and/or to the currently-encoded spectral value (i.e. spectral values within a predetermined environment of the currently encoded spectral value) are considered in the arithmetic encoding to adjust the probability distribution evaluated by the arithmetic encoding.

In order to provide a numeric current context value, a context sub-region value associated with a plurality of previously-encoded spectral values is obtained on the basis of a computation of a norm of a vector formed by a plurality of previously-encoded spectral values. The result of the determination of the numeric current context value is applied in the selection of the current context state, i.e. in the selection of a mapping rule.

By computing the norm of a vector formed by a plurality of previously-encoded spectral values, a meaningful information describing a portion of the context of the one or more spectral values to be encoded can be obtained, wherein the norm of a vector of previously encoded spectral values can typically be represented with a comparatively small number of bits. Thus, the amount of context information, which needs to be stored for later use in the derivation of a numeric current context value, can be kept sufficiently small by applying the above discussed approach for the computation of the context sub-region values. It has been found that the norm of a vector of previously encoded spectral values typically comprises the most significant information regarding the state of the context. In contrast, it has been found that the sign of said previously encoded spectral values typically comprises a subordinate impact on the state of the context, such that it makes sense to neglect the sign of the previously decoded spectral values in order to reduce the quantity of information to be stored for later use. Also, it has been found that the computation of a norm of a vector of previously-encoded spectral values is a reasonable approach for the derivation of a context sub-region value, as the averaging effect, which is typically obtained by the computation of the norm, leaves the most important information about the context state substantially unaffected. To summarize, the context sub-region value computation performed by the context sub-region value computer 1252 allows for providing a compact context sub-region information for storage and later re-use, wherein the most relevant information about the context state is preserved in spite of the reduction of the quantity of information.

Accordingly, an efficient encoding of the input audio information 710 can be achieved, while keeping the computational effort and the amount of data to be stored by the arithmetic encoder 1230 sufficiently small.

7. Audio Decoder According to FIG. 13

Figure 13:
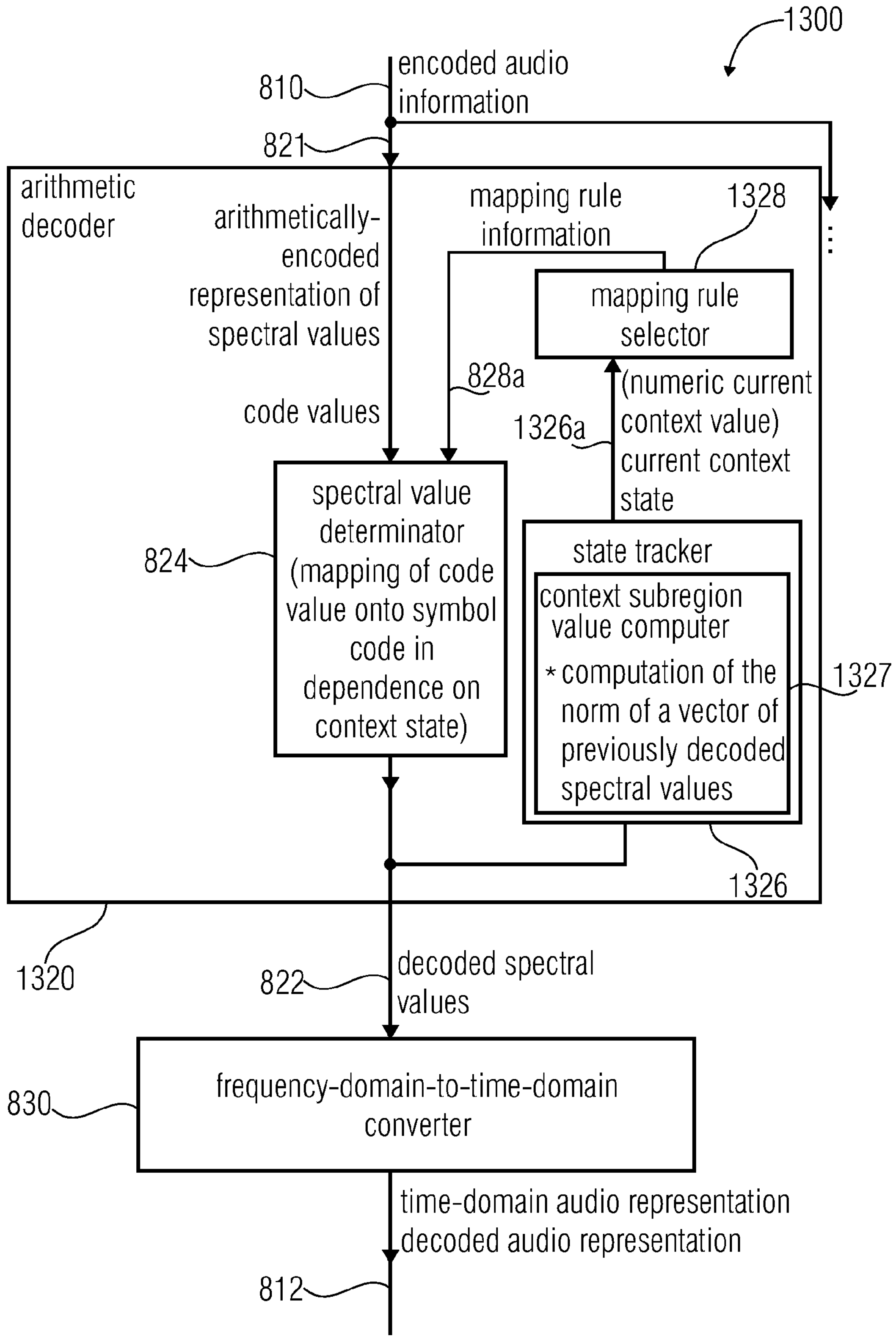
FIG. 13 shows a block schematic diagram of an audio decoder, according to the third aspect of the invention.

FIG. 13 shows a block schematic diagram of an audio decoder 1300. As the audio decoder 1300 is similar to the audio decoder 800 according to FIG. 8, and to the audio decoder 1100 according to FIG. 11, identical means, signals and functionalities are designated with identical numerals.

The audio decoder 1300 is configured to receive an encoded audio information 810 and to provide, on the basis thereof, a decoded audio information 812. The audio decoder 1300 comprises an arithmetic decoder 1320 that is configured to provide a plurality of decoded spectral values 822 on the basis of an arithmetically-encoded representation 821 of the spectral values. The audio decoder 1300 also comprises a frequency-domain-to-time-domain converter 830 which is configured to receive the decoded spectral values 822 and to provide the time-domain audio representation 812, which may constitute the decoded audio information, using the decoded spectral values 822, in order to obtain a decoded audio information 812.

The arithmetic decoder 1320 comprises a spectral value determinator 824 which is configured to map a code value of the arithmetically-encoded representation 821 of spectral values onto a symbol code representing one or more of the decoded spectral values, or at least a portion (e.g. a most-significant bit-plane) of one or more of the decoded spectral values. The spectral value determinator 824 may be configured to perform a mapping in dependence on a mapping rule, which is described by a mapping rule information 828*a*. The mapping rule information 828*a* may, for example, comprise a mapping rule index value, or a selected set of entries of a cumulative-frequencies-table.

The arithmetic decoder 1320 is configured to select a mapping rule (e.g., a cumulative-frequencies-table) describing a mapping of a code value (described by the arithmetically-encoded representation 821 of spectral values) onto a symbol code (describing one or more spectral values) in dependence on a context state (which may be described by the context state information 1326*a*). The arithmetic decoder 1320 is configured to determine the current context state in dependence on a plurality of previously-decoded spectral values 822. For this purpose, a state tracker 1326 may be used, which receives an information describing the previously-decoded spectral values. The arithmetic decoder is also configured to obtain a plurality of context sub-region values on the basis of previously-decoded spectral values and to store said context sub-region values. The arithmetic decoder is configured to derive a numeric current context value associated with one or more spectral values to be decoded in dependence on the stored context sub-region values. The arithmetic decoder 1320 is configured to compute the norm of a vector formed by a plurality of previously decoded spectral values, in order to obtain a common context sub-region value associated with the plurality of previously-decoded spectral values.

The computation of the norm of a vector formed by a plurality of previously-encoded spectral values, in order to obtain a common context sub-region value associated with the plurality of previously decoded spectral values, may, for example, be performed by the context sub-region value computer 1327, which is part of the state tracker 1326. Accordingly, a current context state information 1326*a* is obtained on the basis of the context sub-region values, wherein the state tracker 1326 advantageously provides a numeric current context value associated with one or more spectral values to be decoded in dependence on the stored context sub-region values. The selection of the mapping rules may be performed by a mapping rule selector 1328, which derives a mapping rule information 828*a* from the current context state information 1326*a*, and which provides the mapping rule information 828*a* to the spectral value determinator 824.

Regarding the functionality of the audio signal decoder 1300, it should be noted that the arithmetic decoder 1320 is configured to select a mapping rule (e.g., a cumulative-frequencies-table) which is, on average, well-adapted to the spectral value to be decoded, as the mapping rule is selected in dependence on the current context state, which, in turn, is determined in dependence on a plurality of previously-decoded spectral values. Accordingly, statistical dependencies between adjacent spectral values to be decoded can be exploited.

However, it has been found that it is efficient, in terms of memory usage, to store context sub-region values, which are based on the computation of a norm of a vector formed on a plurality of previously decoded spectral values, for later use in the determination of the numeric context value. It has also been found that such context sub-region values still comprise the most relevant context information. Accordingly, the concept used by the state tracker 1326 constitutes a good compromise between coding efficiency, computational efficiency and storage efficiency.

Further details will be described below.

8. Audio Encoder According to FIG. 1

Figure 1A:
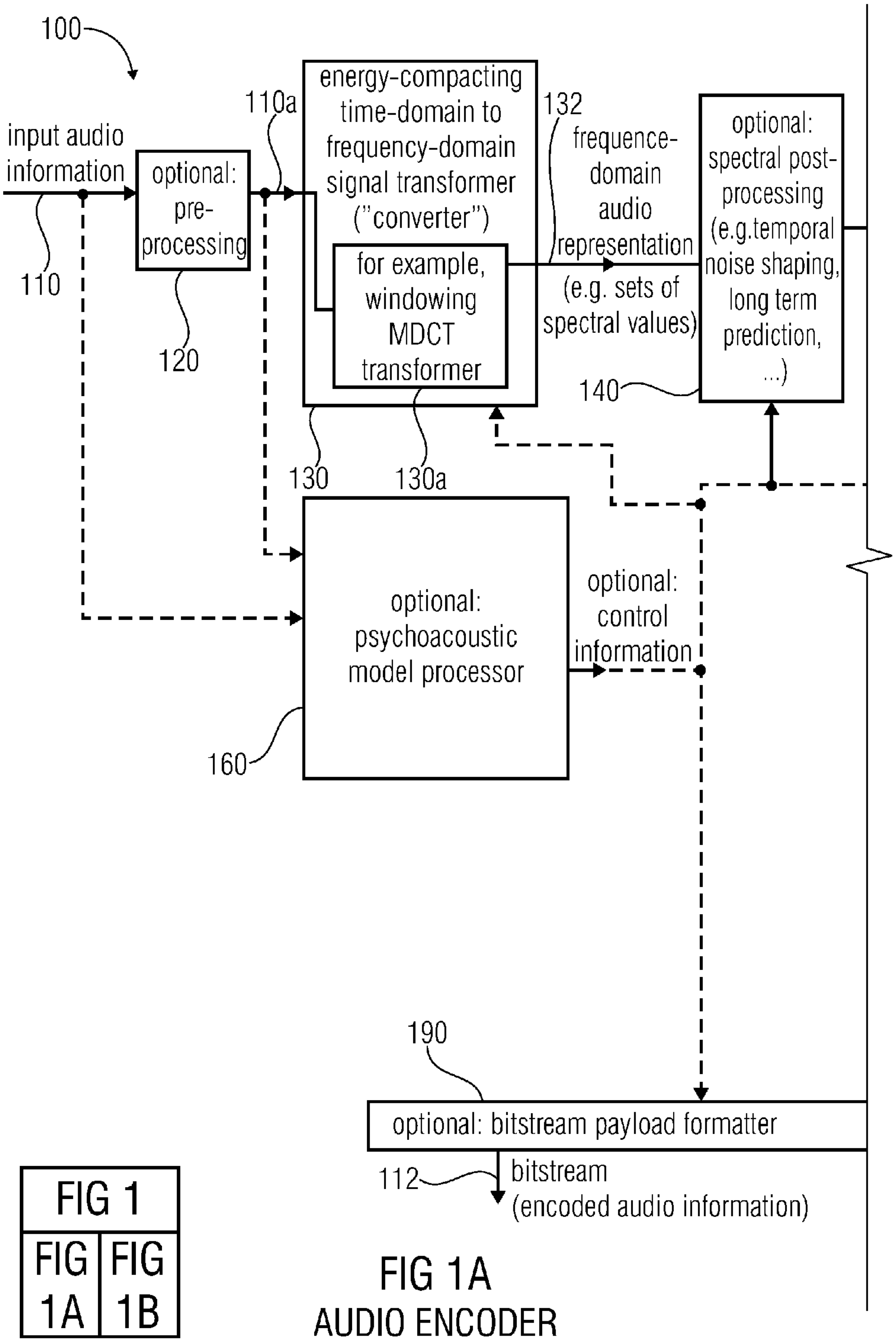
FIG. 1 shows a block schematic diagram of an audio encoder, according to an embodiment of the invention.
Figure 1B:
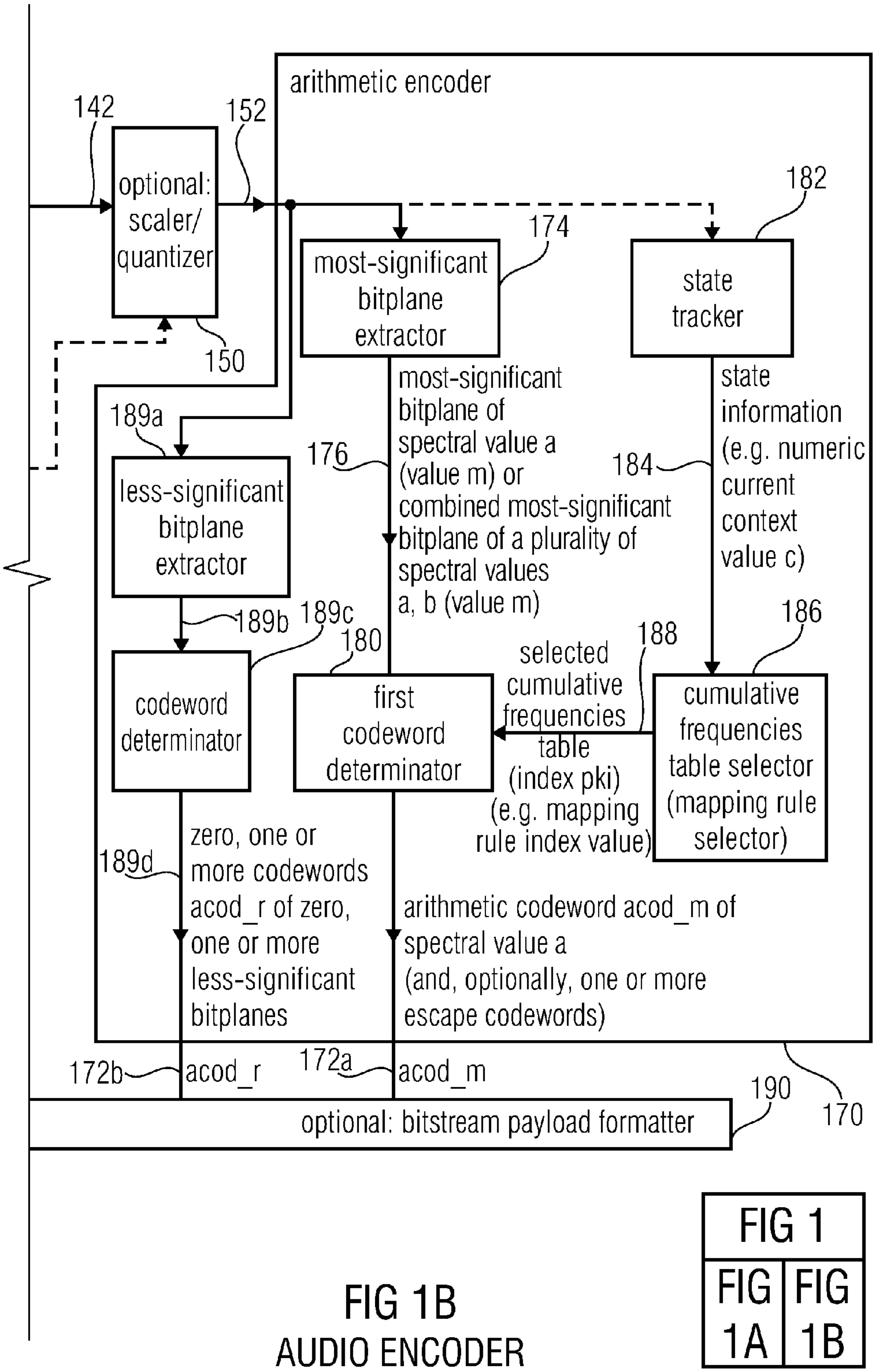

In the following, an audio encoder according to an embodiment of the present invention will be described. FIG. 1 shows a block schematic diagram of such an audio encoder 100.

The audio encoder 100 is configured to receive an input audio information 110 and to provide, on the basis thereof, a bitstream 112, which constitutes an encoded audio information. The audio encoder 100 optionally comprises a preprocessor 120, which is configured to receive the input audio information 110 and to provide, on the basis thereof, a pre-processed input audio information 110*a*. The audio encoder 100 also comprises an energy-compacting time-domain to frequency-domain signal transformer 130, which is also designated as signal converter. The signal converter 130 is configured to receive the input audio information 110, 110*a* and to provide, on the basis thereof, a frequency-domain audio information 132, which advantageously takes the form of a set of spectral values. For example, the signal transformer 130 may be configured to receive a frame of the input audio information 110, 110*a* (e.g. a block of time-domain samples) and to provide a set of spectral values representing the audio content of the respective audio frame. In addition, the signal transformer 130 may be configured to receive a plurality of subsequent, overlapping or non-overlapping, audio frames of the input audio information 110, 110*a* and to provide, on the basis thereof, a time-frequency-domain audio representation, which comprises a sequence of subsequent sets of spectral values, one set of spectral values associated with each frame.

The energy-compacting time-domain to frequency-domain signal transformer 130 may comprise an energy-compacting filterbank, which provides spectral values associated with different, overlapping or non-overlapping, frequency ranges. For example, the signal transformer 130 may comprise a windowing MDCT transformer 130*a*, which is configured to window the input audio information 110, 110*a* (or a frame thereof) using a transform window and to perform a modified-discrete-cosine-transform of the windowed input audio information 110, 110*a* (or of the windowed frame thereof). Accordingly, the frequency-domain audio representation 132 may comprise a set of, for example, 1024 spectral values in the form of MDCT coefficients associated with a frame of the input audio information.

The audio encoder 100 may further, optionally, comprise a spectral post-processor 140, which is configured to receive the frequency-domain audio representation 132 and to provide, on the basis thereof, a post-processed frequency-domain audio representation 142. The spectral post-processor 140 may, for example, be configured to perform a temporal noise shaping and/or a long term prediction and/or any other spectral post-processing known in the art. The audio encoder further comprises, optionally, a scaler/quantizer 150, which is configured to receive the frequency-domain audio representation 132 or the post-processed version 142 thereof and to provide a scaled and quantized frequency-domain audio representation 152.

The audio encoder 100 further comprises, optionally, a psycho-acoustic model processor 160, which is configured to receive the input audio information 110 (or the post-processed version 110*a* thereof) and to provide, on the basis thereof, an optional control information, which may be used for the control of the energy-compacting time-domain to frequency-domain signal transformer 130, for the control of the optional spectral post-processor 140 and/or for the control of the optional scaler/quantizer 150. For example, the psycho-acoustic model processor 160 may be configured to analyze the input audio information, to determine which components of the input audio information 110, 110*a* are particularly important for the human perception of the audio content and which components of the input audio information 110, 110*a* are less important for the perception of the audio content. Accordingly, the psycho-acoustic model processor 160 may provide control information, which is used by the audio encoder 100 in order to adjust the scaling of the frequency-domain audio representation 132, 142 by the scaler/quantizer 150 and/or the quantization resolution applied by the scaler/quantizer 150. Consequently, perceptually important scale factor bands (i.e. groups of adjacent spectral values which are particularly important for the human perception of the audio content) are scaled with a large scaling factor and quantized with comparatively high resolution, while perceptually less-important scale factor bands (i.e. groups of adjacent spectral values) are scaled with a comparatively smaller scaling factor and quantized with a comparatively lower quantization resolution. Accordingly, scaled spectral values of perceptually more important frequencies are typically significantly larger than spectral values of perceptually less important frequencies.

The audio encoder also comprises an arithmetic encoder 170, which is configured to receive the scaled and quantized version 152 of the frequency-domain audio representation 132 (or, alternatively, the post-processed version 142 of the frequency-domain audio representation 132, or even the frequency-domain audio representation 132 itself) and to provide arithmetic codeword information 172*a* on the basis thereof, such that the arithmetic codeword information represents the frequency-domain audio representation 152.

The audio encoder 100 also comprises a bitstream payload formatter 190, which is configured to receive the arithmetic codeword information 172*a*. The bitstream payload formatter 190 is also typically configured to receive additional information, like, for example, scale factor information describing which scale factors have been applied by the scaler/quantizer 150. In addition, the bitstream payload formatter 190 may be configured to receive other control information. The bitstream payload formatter 190 is configured to provide the bitstream 112 on the basis of the received information by assembling the bitstream in accordance with a desired bitstream syntax, which will be discussed below.

In the following, details regarding the arithmetic encoder 170 will be described. The arithmetic encoder 170 is configured to receive a plurality of post-processed and scaled and quantized spectral values of the frequency-domain audio representation 132. The arithmetic encoder comprises a most-significant-bit-plane-extractor 174, or even from two spectral values, which is configured to extract a most-significant bit-plane m from a spectral value. It should be noted here that the most-significant bit-plane may comprise one or even more bits (e.g. two or three bits), which are the most-significant bits of the spectral value. Thus, the most-significant bit-plane extractor 174 provides a most-significant bit-plane value 176 of a spectral value.

Alternatively, however, the most significant bit-plane extractor 174 may provide a combined most-significant bit-plane value m combining the most-significant bit-planes of a plurality of spectral values (e.g., of spectral values a and b). The most-significant bit-plane of the spectral value a is designated with m. Alternatively, the combined most-significant bit-plane value of a plurality of spectral values a,b is designated with m.

The arithmetic encoder 170 also comprises a first codeword determinator 180, which is configured to determine an arithmetic codeword acod_m [pki][m] representing the most-significant bit-plane value m. Optionally, the codeword determinator 180 may also provide one or more escape codewords (also designated herein with "ARITH_ESCAPE") indicating, for example, how many less-significant bit-planes are available (and, consequently, indicating the numeric weight of the most-significant bit-plane). The first codeword determinator 180 may be configured to provide the codeword associated with a most-significant bit-plane value m using a selected cumulative-frequencies-table having (or being referenced by) a cumulative-frequencies-table index pki.

In order to determine as to which cumulative-frequencies-table should be selected, the arithmetic encoder advantageously comprises a state tracker 182, which is configured to track the state of the arithmetic encoder, for example, by observing which spectral values have been encoded previously. The state tracker 182 consequently provides a state information 184, for example, a state value designated with "s" or "t" or "c". The arithmetic encoder 170 also comprises a cumulative-frequencies-table selector 186, which is configured to receive the state information 184 and to provide an information 188 describing the selected cumulative-frequencies-table to the codeword determinator 180. For example, the cumulative-frequencies-table selector 186 may provide a cumulative-frequencies-table index "pki" describing which cumulative-frequencies-table, out of a set of 96 cumulative-frequencies-tables, is selected for usage by the codeword determinator. Alternatively, the cumulative-frequencies-table selector 186 may provide the entire selected cumulative-frequencies-table or a sub-table to the codeword determinator. Thus, the codeword determinator 180 may use the selected cumulative-frequencies-table or sub-table for the provision of the codeword acod_m[pki][m] of the most-significant bit-plane value m, such that the actual codeword acod_m[pki][m] encoding the most-significant bit-plane value m is dependent on the value of m and the cumulative-frequencies-table index pki, and consequently on the current state information 184. Further details regarding the coding process and the obtained codeword format will be described below.

It should be noted, however, that in some embodiments, the state tracker 182 may be identical to, or take the functionality of, the state tracker 750, the state tracker 1050 or the state tracker 1250. It should also be noted that the cumulative-frequencies-table selector 186 may, in some embodiments, be identical to, or take the functionality of, the mapping rule selector 760, the mapping rule selector 1060, or the mapping rule selector 1260. Moreover, the first codeword determinator 180 may, in some embodiments, be identical to, or take the functionality of, the spectral value encoding 740.

The arithmetic encoder 170 further comprises a less-significant bit-plane extractor 189*a*, which is configured to extract one or more less-significant bit-planes from the scaled and quantized frequency-domain audio representation 152, if one or more of the spectral values to be encoded exceed the range of values encodeable using the most-significant bit-plane only. The less-significant bit-planes may comprise one or more bits, as desired. Accordingly, the less-significant bit-plane extractor 189*a* provides a less-significant bit-plane information 189*b*. The arithmetic encoder 170 also comprises a second codeword determinator 189*c*, which is configured to receive the less-significant bit-plane information 189*d* and to provide, on the basis thereof, 0, 1 or more codewords "acod_r" representing the content of 0, 1 or more less-significant bit-planes. The second codeword determinator 189*c* may be configured to apply an arithmetic encoding algorithm or any other encoding algorithm in order to derive the less-significant bit-plane codewords "acod_r" from the less-significant bit-plane information 189*b*.

It should be noted here that the number of less-significant bit-planes may vary in dependence on the value of the scaled and quantized spectral values 152, such that there may be no less-significant bit-plane at all, if the scaled and quantized spectral value to be encoded is comparatively small, such that there may be one less-significant bit-plane if the current scaled and quantized spectral value to be encoded is of a medium range and such that there may be more than one less-significant bit-plane if the scaled and quantized spectral value to be encoded takes a comparatively large value.

To summarize the above, the arithmetic encoder 170 is configured to encode scaled and quantized spectral values, which are described by the information 152, using a hierarchical encoding process. The most-significant bit-plane (comprising, for example, one, two or three bits per spectral value) of one or more spectral values, is encoded to obtain an arithmetic codeword "acod_m[pki][m]" of a most-significant bit-plane value m. One or more less-significant bit-planes (each of the less-significant bit-planes comprising, for example, one, two or three bits) of the one or more spectral values are encoded to obtain one or more codewords "acod_r". When encoding the most-significant bit-plane, the value m of the most-significant bit-plane is mapped to a codeword acod_m[pki][m]. For this purpose, 96 different cumulative-frequencies-tables are available for the encoding of the value m in dependence on a state of the arithmetic encoder 170, i.e. in dependence on previously-encoded spectral values. Accordingly, the codeword "acod_m[pki][m]" is obtained. In addition, one or more codewords "acod_r" are provided and included into the bitstream if one or more less-significant bit-planes are present.

Reset Description

The audio encoder 100 may optionally be configured to decide whether an improvement in bitrate can be obtained by resetting the context, for example by setting the state index to a default value. Accordingly, the audio encoder 100 may be configured to provide a reset information (e.g. named "arith_reset_flag") indicating whether the context for the arithmetic encoding is reset, and also indicating whether the context for the arithmetic decoding in a corresponding decoder should be reset.

Details regarding the bitstream format and the applied cumulative-frequency tables will be discussed below.

9. Audio Decoder According to FIG. 2

Figure 2A:
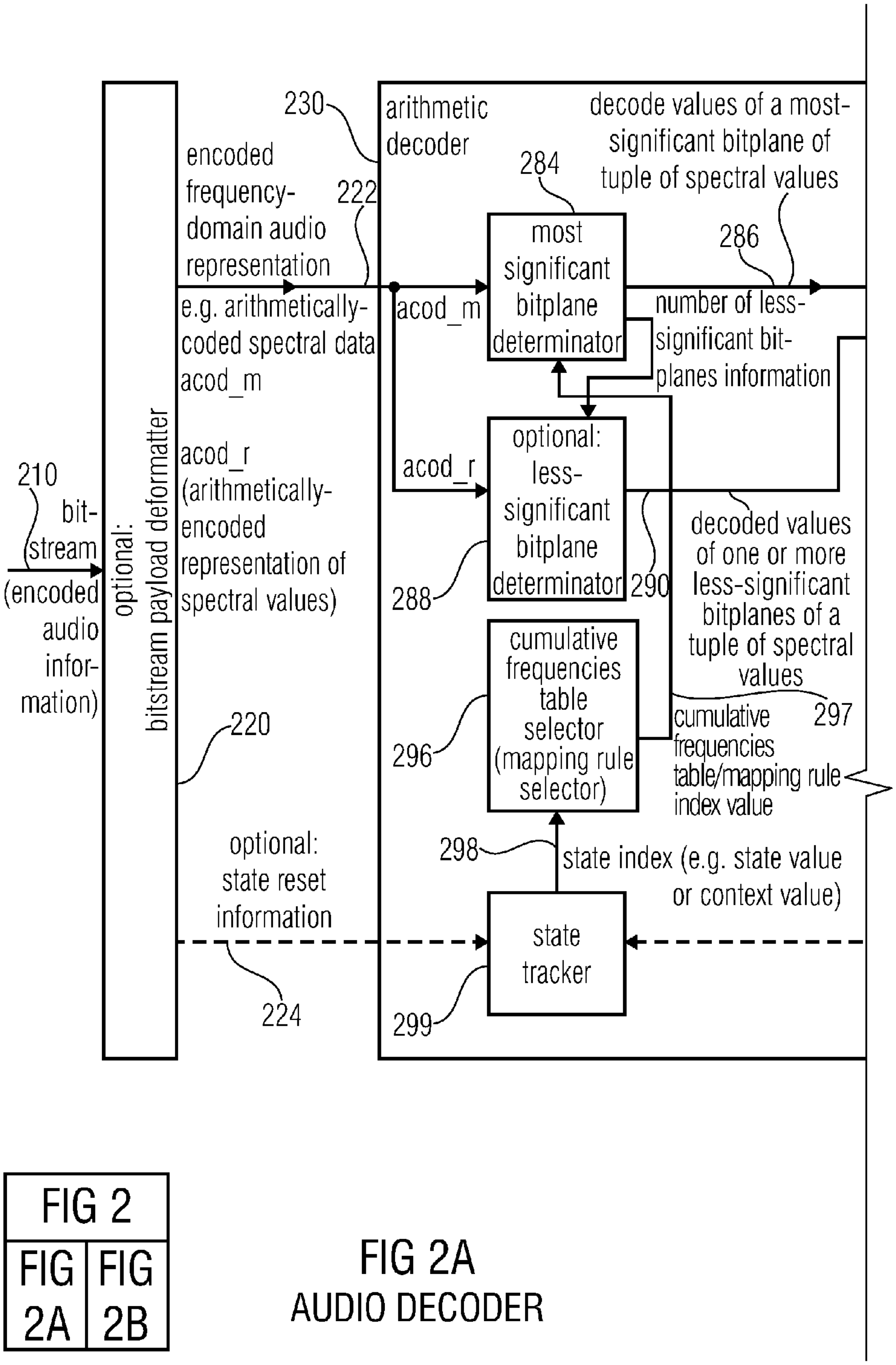
FIG. 2 shows a block schematic diagram of an audio decoder, according to an embodiment of the invention.
Figure 2B:
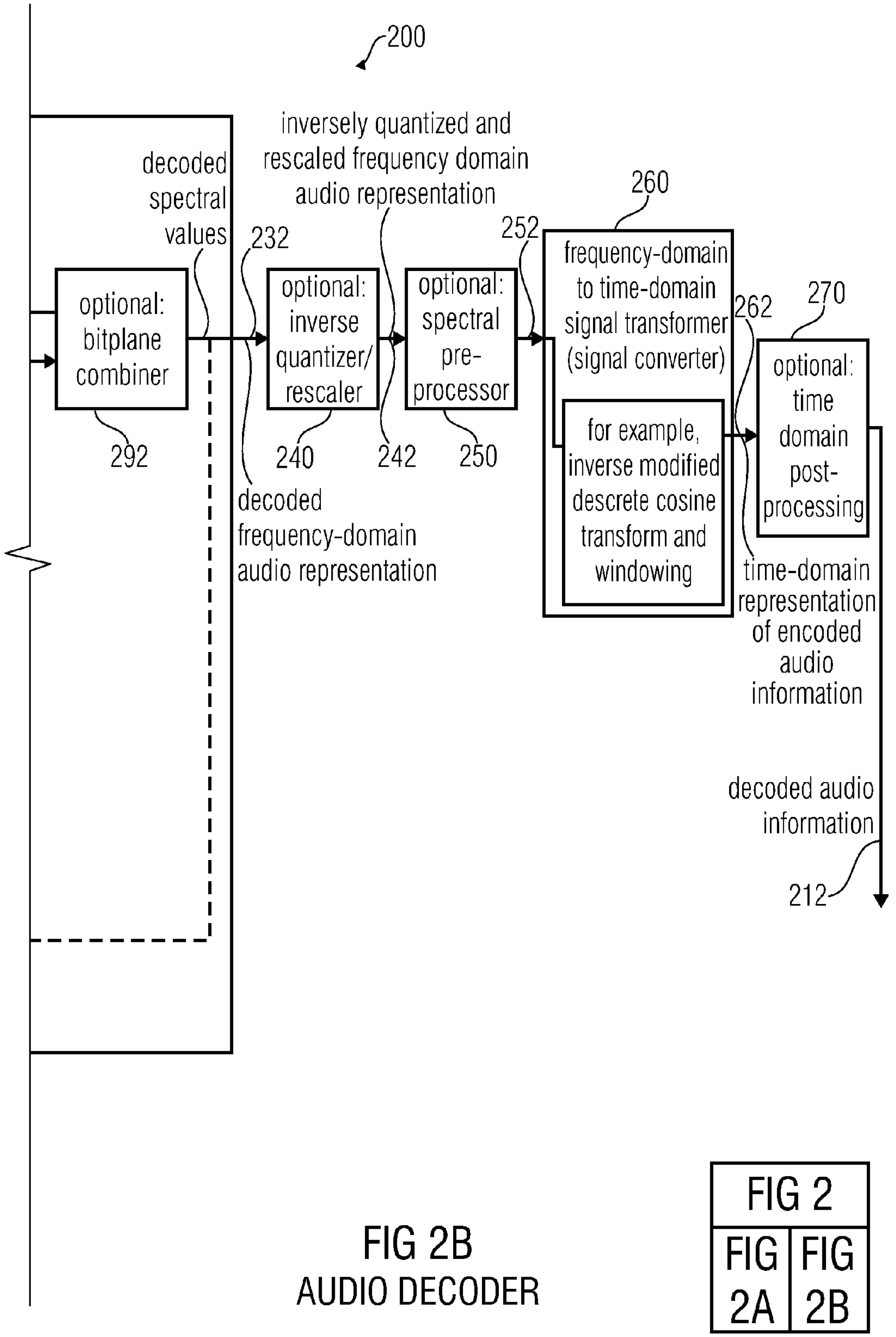

In the following, an audio decoder according to an embodiment of the invention will be described. FIG. 2 shows a block schematic diagram of such an audio decoder 200.

The audio decoder 200 is configured to receive a bitstream 210, which represents an encoded audio information and which may be identical to the bitstream 112 provided by the audio encoder 100. The audio decoder 200 provides a decoded audio information 212 on the basis of the bitstream 210.

The audio decoder 200 comprises an optional bitstream payload de-formatter 220, which is configured to receive the bitstream 210 and to extract from the bitstream 210 an encoded frequency-domain audio representation 222. For example, the bitstream payload de-formatter 220 may be configured to extract from the bitstream 210 arithmetically-coded spectral data like, for example, an arithmetic codeword "acod_m[pki][m]" representing the most-significant bit-plane value m of a spectral value a, or of a plurality of spectral values a, b, and a codeword "acod_r" representing a content of a less-significant bit-plane of the spectral value a, or of a plurality of spectral values a, b, of the frequency-domain audio representation. Thus, the encoded frequency-domain audio representation 222 constitutes (or comprises) an arithmetically-encoded representation of spectral values. The bitstream payload deformatter 220 is further configured to extract from the bitstream additional control information, which is not shown in FIG. 2. In addition, the bitstream payload deformatter is optionally configured to extract from the bitstream 210, a state reset information 224, which is also designated as arithmetic reset flag or "arith_reset_flag".

The audio decoder 200 comprises an arithmetic decoder 230, which is also designated as "spectral noiseless decoder". The arithmetic decoder 230 is configured to receive the encoded frequency-domain audio representation 220 and, optionally, the state reset information 224. The arithmetic decoder 230 is also configured to provide a decoded frequency-domain audio representation 232, which may comprise a decoded representation of spectral values. For example, the decoded frequency-domain audio representation 232 may comprise a decoded representation of spectral values, which are described by the encoded frequency-domain audio representation 220.

The audio decoder 200 also comprises an optional inverse quantizer/rescaler 240, which is configured to receive the decoded frequency-domain audio representation 232 and to provide, on the basis thereof, an inversely-quantized and resealed frequency-domain audio representation 242.

The audio decoder 200 further comprises an optional spectral pre-processor 250, which is configured to receive the inversely-quantized and resealed frequency-domain audio representation 242 and to provide, on the basis thereof, a pre-processed version 252 of the inversely-quantized and resealed frequency-domain audio representation 242. The audio decoder 200 also comprises a frequency-domain to time-domain signal transformer 260, which is also designated as a "signal converter". The signal transformer 260 is configured to receive the pre-processed version 252 of the inversely-quantized and resealed frequency-domain audio representation 242 (or, alternatively, the inversely-quantized and resealed frequency-domain audio representation 242 or the decoded frequency-domain audio representation 232) and to provide, on the basis thereof, a time-domain representation 262 of the audio information. The frequency-domain to time-domain signal transformer 260 may, for example, comprise a transformer for performing an inverse-modified-discrete-cosine transform (IMDCT) and an appropriate windowing (as well as other auxiliary functionalities, like, for example, an overlap-and-add).

The audio decoder 200 may further comprise an optional time-domain post-processor 270, which is configured to receive the time-domain representation 262 of the audio information and to obtain the decoded audio information 212 using a time-domain post-processing. However, if the post-processing is omitted, the time-domain representation 262 may be identical to the decoded audio information 212.

It should be noted here that the inverse quantizer/rescaler 240, the spectral pre-processor 250, the frequency-domain to time-domain signal transformer 260 and the time-domain post-processor 270 may be controlled in dependence on control information, which is extracted from the bitstream 210 by the bitstream payload deformatter 220.

To summarize the overall functionality of the audio decoder 200, a decoded frequency-domain audio representation 232, for example, a set of spectral values associated with an audio frame of the encoded audio information, may be obtained on the basis of the encoded frequency-domain representation 222 using the arithmetic decoder 230. Subsequently, the set of, for example, 1024 spectral values, which may be MDCT coefficients, are inversely quantized, resealed and pre-processed. Accordingly, an inversely-quantized, resealed and spectrally pre-processed set of spectral values (e.g., 1024 MDCT coefficients) is obtained. Afterwards, a time-domain representation of an audio frame is derived from the inversely-quantized, resealed and spectrally pre-processed set of frequency-domain values (e.g. MDCT coefficients). Accordingly, a time-domain representation of an audio frame is obtained. The time-domain representation of a given audio frame may be combined with time-domain representations of previous and/or subsequent audio frames. For example, an overlap-and-add between time-domain representations of subsequent audio frames may be performed in order to smoothen the transitions between the time-domain representations of the adjacent audio frames and in order to obtain an aliasing cancellation. For details regarding the reconstruction of the decoded audio information 212 on the basis of the decoded time-frequency domain audio representation 232, reference is made, for example, to the International Standard ISO/IEC 14496-3, part 3, sub-part 4 where a detailed discussion is given. However, other more elaborate overlapping and aliasing-cancellation schemes may be used.

In the following, some details regarding the arithmetic decoder 230 will be described. The arithmetic decoder 230 comprises a most-significant bit-plane determinator 284, which is configured to receive the arithmetic codeword acod_m[pki][m] describing the most-significant bit-plane value m. The most-significant bit-plane determinator 284 may be configured to use a cumulative-frequencies table out of a set comprising a plurality of 96 cumulative-frequencies-tables for deriving the most-significant bit-plane value m from the arithmetic codeword "acod_m[pki][m]".

The most-significant bit-plane determinator 284 is configured to derive values 286 of a most-significant bit-plane of one of more spectral values on the basis of the codeword acod_m. The arithmetic decoder 230 further comprises a less-significant bit-plane determinator 288, which is configured to receive one or more codewords "acod_r" representing one or more less-significant bit-planes of a spectral value. Accordingly, the less-significant bit-plane determinator 288 is configured to provide decoded values 290 of one or more less-significant bit-planes. The audio decoder 200 also comprises a bit-plane combiner 292, which is configured to receive the decoded values 286 of the most-significant bit-plane of one or more spectral values and the decoded values 290 of one or more less-significant bit-planes of the spectral values if such less-significant bit-planes are available for the current spectral values. Accordingly, the bit-plane combiner 292 provides decoded spectral values, which are part of the decoded frequency-domain audio representation 232. Naturally, the arithmetic decoder 230 is typically configured to provide a plurality of spectral values in order to obtain a full set of decoded spectral values associated with a current frame of the audio content.

The arithmetic decoder 230 further comprises a cumulative-frequencies-table selector 296, which is configured to select one of the 96 cumulative-frequencies tables in dependence on a state index 298 describing a state of the arithmetic decoder. The arithmetic decoder 230 further comprises a state tracker 299, which is configured to track a state of the arithmetic decoder in dependence on the previously-decoded spectral values. The state information may optionally be reset to a default state information in response to the state reset information 224. Accordingly, the cumulative-frequencies-table selector 296 is configured to provide an index (e.g. pki) of a selected cumulative-frequencies-table, or a selected cumulative-frequencies-table or sub-table itself, for application in the decoding of the most-significant bit-plane value m in dependence on the codeword "acod_m".

To summarize the functionality of the audio decoder 200, the audio decoder 200 is configured to receive a bitrate-efficiently-encoded frequency-domain audio representation 222 and to obtain a decoded frequency-domain audio representation on the basis thereof. In the arithmetic decoder 230, which is used for obtaining the decoded frequency-domain audio representation 232 on the basis of the encoded frequency-domain audio representation 222, a probability of different combinations of values of the most-significant bit-plane of adjacent spectral values is exploited by using an arithmetic decoder 280, which is configured to apply a cumulative-frequencies-table. In other words, statistic dependencies between spectral values are exploited by selecting different cumulative-frequencies-tables out of a set comprising 96 different cumulative-frequencies-tables in dependence on a state index 298, which is obtained by observing the previously-computed decoded spectral values.

It should be noted that the state tracker 299 may be identical to, or may take the functionality of, the state tracker 826, the state tracker 1126, or the state tracker 1326. The cumulative-frequencies-table selector 296 may be identical to, or may take the functionality of, the mapping rule selector 828, the mapping rule selector 1128, or the mapping rule selector 1328. The most significant bit-plane determinator 284 may be identical to, or may take the functionality of, the spectral value determinator 824.

10. Overview of the Tool of Spectral Noiseless Coding

In the following, details regarding the encoding and decoding algorithm, which is performed, for example, by the arithmetic encoder 170 and the arithmetic decoder 230, will be explained.

Focus is placed on the description of the decoding algorithm. It should be noted, however, that a corresponding encoding algorithm can be performed in accordance with the teachings of the decoding algorithm, wherein mappings between encoded and decoded spectral values are inversed, and wherein the computation of the mapping rule index value is substantially identical. In an encoder, the encoded spectral values take over the place of the decoded spectral values. Also, the spectral values to be encoded take over the place of the spectral values to be decoded.

It should be noted that the decoding, which will be discussed in the following, is used in order to allow for a so-called "spectral noiseless coding" of typically post-processed, scaled and quantized spectral values. The spectral noiseless coding is used in an audio encoding/decoding concept (or in any other encoding/decoding concept) to further reduce the redundancy of the quantized spectrum, which is obtained, for example, by an energy compacting time-domain-to-frequency-domain transformer. The spectral noiseless coding scheme, which is used in embodiments of the invention, is based on an arithmetic coding in conjunction with a dynamically adapted context.

Figure 4:
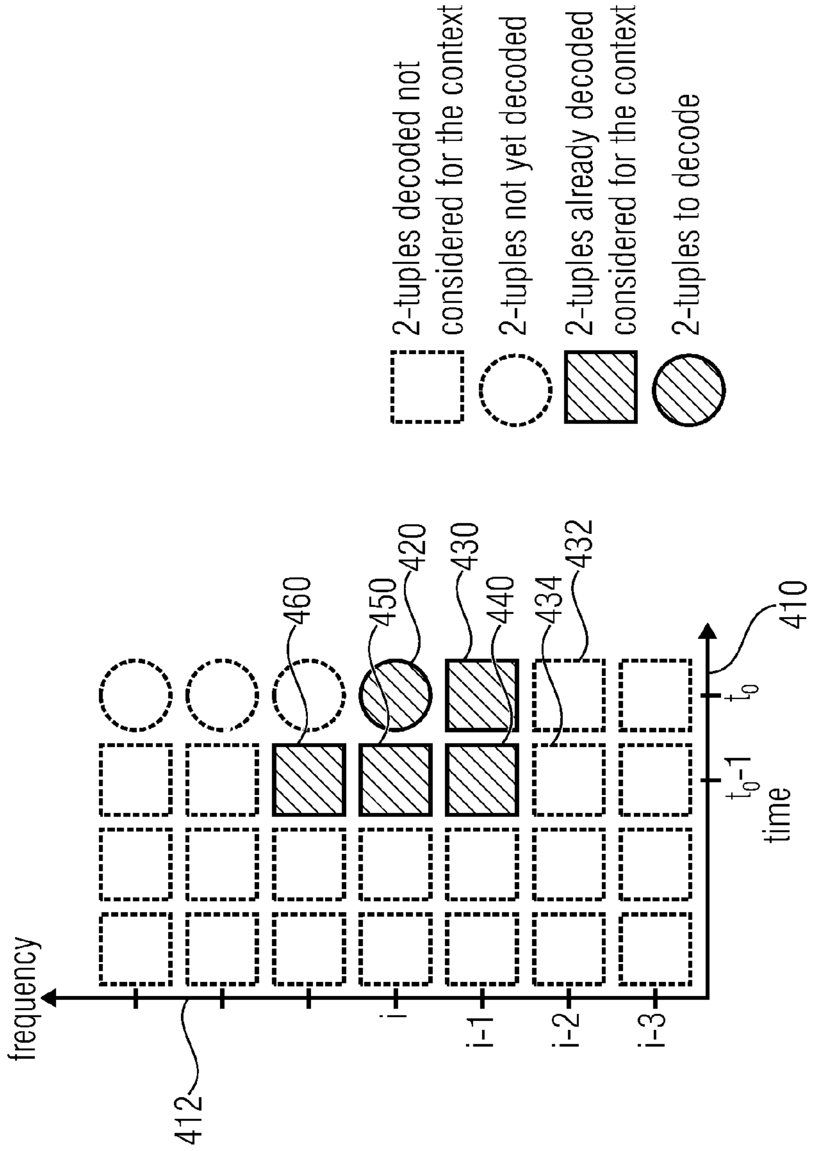
FIG. 4 shows a schematic representation of a context for a state calculation.

In some embodiments according to the invention, the spectral noiseless coding scheme is based on 2-tuples, that is, two neighbored spectral coefficients are combined. Each 2-tuple is split into the sign, the most-significant 2-bits-wise-plane, and the remaining less-significant bit-planes. The noiseless coding for the most-significant 2-bits-wise-plane m uses context dependent cumulative-frequencies-tables derived from four previously decoded 2-tuples. The noiseless coding is fed by the quantized spectral values and uses context dependent cumulative-frequencies-tables derived from four previously decoded neighboring 2-tuples. Here, neighborhood in both time and frequency is taken into account, as illustrated in FIG. 4. The cumulative-frequencies-tables (which will be explained below) are then used by the arithmetic coder to generate a variable-length binary code (and by the arithmetic decoder to derive decoded values from a variable-length binary code).

For example, the arithmetic coder 170 produces a binary code for a given set of symbols and their respective probabilities (i.e. in dependence on the respective probabilities). The binary code is generated by mapping a probability interval, where the set of symbols lie, to a codeword.

The noiseless coding of the remaining less-significant bit-plane r uses a single cumulative-frequencies-table. The cumulative frequencies correspond for example to a uniform distribution of the symbols occurring in the less-significant bit-planes, i.e. it is expected there is the same probability that a 0 or a 1 occurs in the less-significant bit-planes.

In the following, another short overview of the tool of spectral noiseless coding will be given. Spectral noiseless coding is used to further reduce the redundancy of the quantized spectrum.

The spectral noiseless coding scheme is based on an arithmetic coding, in conjunction with a dynamically adapted context. The noiseless coding is fed by the quantized spectral values and uses context dependent cumulative-frequencies-tables derived from, for example, four previously decoded neighboring 2-tuples of spectral values. Here, neighborhood, in both time and frequency, is taken into account as illustrated in FIG. 4. The cumulative-frequencies-tables are then used by the arithmetic coder to generate a variable length binary code.

The arithmetic coder produces a binary code for a given set of symbols and their respective probabilities. The binary code is generated by mapping a probability interval, where the set of symbols lies, to a codeword.

11. Decoding Process

11.1 Decoding Process Overview

In the following, an overview of the process of the coding of a spectral value will be given taking reference to FIG. 3, which shows a pseudo-program code representation of the process of decoding a plurality of spectral values.

The process of decoding a plurality of spectral values comprises an initialization 310 of a context. Initialization 310 of the context comprises a derivation of the current context from a previous context, using the function "arith_map_context(N, arith_reset_flag)". The derivation of the current context from a previous context may selectively comprise a reset of the context. Both the reset of the context and the derivation of the current context from a previous context will be discussed below.

The decoding of a plurality of spectral values also comprises an iteration of a spectral value decoding 312 and a context update 313, which context update 313 is performed by a function "arith_update_context(i, a,b)" which is described below. The spectral value decoding 312 and the context update 312 are repeated 1 g/2 times, wherein 1 g/2 indicates the number of 2-tuples of spectral values to be decoded (e.g., for an audio frame), unless a so-called "ARITH_STOP" symbol is detected. Moreover, the decoding of a set of 1 g spectral values also comprises a signs decoding 314 and a finishing step 315.

The decoding 312 of a tuple of spectral values comprises a context-value calculation **312*a*, a most-significant bit-plane decoding 312*b*, an arithmetic stop symbol detection 312*c*, a less-significant bit-plane addition 312*d*, and an array update 312*e***.

The state value computation **312*a* comprises a call of the function "arith_get_context(c,i,N)" as shown, for example, in FIG. 5*c* or 5*d***. Accordingly, a numeric current context (state) value c is provided as a return value of the function call of the function "arith_get_context(c,i,N)". As can be seen, the numeric previous context value (also designated with "c"), which serves as an input variable to the function "arith_get_context(c,i,N)", is updated to obtain, as a return value, the numeric current context value c.

The most-significant bit-plane decoding **312*b* comprises an iterative execution of a decoding algorithm 312*ba*, and a derivation 312*bb* of values a,b from the result value m of the algorithm 312*ba*. In preparation of the algorithm 312*ba*, the variable lev is initialized to zero. The algorithm 312*ba* is repeated, until a "break" instruction (or condition) is reached. The algorithm 312*ba* comprises a computation of a state index "pki" (which also serves as a cumulative-frequencies-table index) in dependence on the numeric current context value c, and also in dependence on the level value "esc_nb" using a function "arith_get_pk( )", which is discussed below (and embodiments of which are shown, for example, in FIGS. 5*e* and 5*f*). The algorithm 312*ba*** also comprises the selection of a cumulative-frequencies-table in dependence on the state index "pki", which is retuned by the call of the function "arith_get_pk", wherein a variable "cum_freq" may be set to a starting address of one out of 96 cumulative-frequencies-tables (or sub-tables) in dependence on the state index "pki". A variable "cfl" may also be initialized to a length of the selected cumulative-frequencies-table (or a sub-table), which is, for example, equal to a number of symbols in the alphabet, i.e. the number of different values which can be decoded. The length of all the cumulative-frequencies-tables (or sub-tables) from "ari_cf_m[pki=0][17]" to "ari_cf_m[pki=95][17]" available for the decoding of the most-significant bit-plane value m is 17, as 16 different most-significant bit-plane values and an escape symbol ("ARITH_ESCAPE") can be decoded.

Subsequently, a most-significant bit-plane value m may be obtained by executing a function "arith_decode( )", taking into consideration the selected cumulative-frequencies-table (described by the variable "cum_freq" and the variable "cfl"). When deriving the most-significant bit-plane value m, bits named "acod_m" of the bitstream 210 may be evaluated (see, for example, FIG. 6*g* or FIG. 6*h*).

The algorithm 312*ba* also comprises checking whether the most-significant bit-plane value m is equal to an escape symbol "ARITH_ESCAPE", or not. If the most-significant bit-plane value m is not equal to the arithmetic escape symbol, the algorithm 312*ba* is aborted ("break" condition) and the remaining instructions of the algorithm 312*ba* are then skipped.

Accordingly, execution of the process is continued with the setting of the value b and of the value a at step 312*bb*. In contrast, if the decoded most-significant bit-plane value m is identical to the arithmetic escape symbol, or "ARITH_ESCAPE", the level value "lev" is increased by one. The level value "esc_nb" is set to be equal to the level value "lev", unless the variable "lev" is larger than seven, in which case, the variable "esc_nb" is set to be equal to seven. As mentioned, the algorithm 312*ba* is then repeated until the decoded most-significant bit-plane value m is different from the arithmetic escape symbol, wherein a modified context is used (because the input parameter of the function "arith_get_pk( )" is adapted in dependence on the value of the variable "esc_nb").

As soon as the most-significant bit-plane is decoded using the one time execution or iterative execution of the algorithm 312*ba*, i.e. a most-significant bit-plane value m different from the arithmetic escape symbol has been decoded, the spectral value variable "b" is set to be equal to a plurality of (e.g. 2) more significant bits of the most-significant bit-plane value m, and the spectral value variable "a" is set to the (e.g. 2) lowermost bits of the most-significant bit-plane value m. Details regarding this functionality can be seen, for example, at reference numeral 312*bb*.

Subsequently, it is checked in step 312*c*, whether an arithmetic stop symbol is present. This is the case if the most-significant bit-plane value m is equal to zero and the variable "lev" is larger than zero. Accordingly, an arithmetic stop condition is signaled by an "unusual" condition, in which the most-significant bit-plane value m is equal to zero, while the variable "lev" indicates that an increased numeric weight is associated to the most-significant bit-plane value m. In other words, an arithmetic stop condition is detected if the bitstream indicates that an increased numeric weight, higher than a minimum numeric weight, should be given to a most-significant bit-plane value which is equal to zero, which is a condition that does not occur in a normal encoding situation. In other words, an arithmetic stop condition is signaled if an encoded arithmetic escape symbol is followed by an encoded most significant bit-plane value of 0.

After the evaluation whether there is an arithmetic stop condition, which is performed in the step 212*c*, the less-significant bit planes are obtained, for example, as shown at reference numeral 212*d* in FIG. 3. For each less-significant bit plane, two binary values are decoded. One of the binary values is associated with the variable a (or the first spectral value of a tuple of spectral values) and one of the binary values is associated with the variable b (or a second spectral value of a tuple of spectral values). A number of less-significant bit planes is designated by the variable lev.

In the decoding of the one or more least-significant bit planes (if any) an algorithm 212*da* is iteratively performed, wherein a number of executions of the algorithm 212*da* is determined by the variable "lev". It should be noted here that the first iteration of the algorithm 212*da* is performed on the basis of the values of the variables a, b as set in the step 212*bb*. Further iterations of the algorithm 212*da* are be performed on the basis of updated variable values of the variable a, b.

At the beginning of an iteration, a cumulative-frequencies table is selected. Subsequently, an arithmetic decoding is performed to obtain a value of a variable r, wherein the value of the variable r describes a plurality of less-significant bits, for example one less-significant bit associated with the variable a and one less-significant bit associated with the variable b. The function "ARITH_DECODE" is used to obtain the value r, wherein the cumulative frequencies table "arith_cf_r" is used for the arithmetic decoding.

Subsequently, the values of the variables a and b are updated. For this purpose, the variable a is shifted to the left by one bit, and the least-significant bit of the shifted variable a is set the value defined by the least-significant bit of the value r. The variable b is shifted to the left by one bit, and the least-significant bit of the shifted variable b is set the value defined by bit 1 of the variable r, wherein bit 1 of the variable r has a numeric weight of 2 in the binary representation of the variable r. The algorithm 412*ba* is then repeated until all least-significant bits are decoded.

After the decoding of the less-significant bit-planes, an array "x_ac_dec" is updated in that the values of the variables a,b are stored in entries of said array having array indices 2*i and 2*i+1.

Subsequently, the context state is updated by calling the function "arith_update_context(i,a,b)", details of which will be explained below taking reference to FIG. 5*g*.

Subsequent to the update of the context state, which is performed in step 313, algorithms 312 and 313 are repeated, until running variable i reaches the value of 1 g/2 or an arithmetic stop condition is detected.

Subsequently, a finish algorithm "arith_finish( )" is performed, as can be seen at reference number 315. Details of the finishing algorithm "arith_finish( )" will be described below taking reference to FIG. 5*m*.

Subsequent to the finish algorithm 315, the signs of the spectral values are decoded using the algorithm 314. As can be seen, the signs of the spectral values which are different from zero are individually coded. In the algorithm 314, signs are read for all of the spectral values having indices i between i=0 and i=1 g−1 which are non-zero. For each non-zero spectral value having a spectral value index i between i=0 and i=1 g−1, a value (typically a single bit) s is read from the bitstream. If the value of s, which is read from the bit stream is equal to 1, the sign of said spectral value is inverted. For this purpose, access is made to the array "x_ac_dec", both to determine whether the spectral value having the index i is equal to zero and for updating the sign of the decoded spectral values. However, it should be noted that the signs of the variables a, b are left unchanged in the sign decoding 314.

By performing the finish algorithm 315 before the signs decoding 314, it is possible to reset all bins that may be used after an ARITH_STOP symbol.

It should be noted here that the concept for obtaining the values of the less-significant bit-planes is not of particular relevance in some embodiments according to the present invention. In some embodiments, the decoding of any less-significant bit-planes may even be omitted. Alternatively, different decoding algorithms may be used for this purpose.

11.2 Decoding Order According to FIG. 4

In the following, the decoding order of the spectral values will be described.

The quantized spectral coefficients "x_ac_dec[ ]" are noiselessly encoded and transmitted (e.g. in the bitstream) starting from the lowest-frequency coefficient and progressing to the highest-frequency coefficient.

Consequently, the quantized spectral coefficients "x_ac_dec[ ]" are noiselessly decoded starting from the lowest-frequency coefficient and progressing to the highest-frequency coefficient. The quantized spectral coefficients are decoded by groups of two successive (e.g. adjacent in frequency) coefficients a and b gathering in a so-called 2-tuple (a,b) (also designated with {a,b}). It should be noted here that the quantized spectral coefficients are sometimes also designated with "qdec".

The decoded coefficients "x_ac_dec[ ]" for a frequency-domain mode (e.g., decoded coefficients for an advanced audio coding, for example, obtained using a modified-discrete-cosine transform, as discussed in ISO/IEC 14496, part 3, sub-part 4) are then stored in an array "x_ac_quant[g][win][sfb][bin]". The order of transmission of the noiseless coding codewords is such that when they are decoded in the order received and stored in the array, "bin" is the most rapidly incrementing index, and "g" is the most slowly incrementing index. Within a codeword, the order of decoding is a,b.

The decoded coefficients "x_ac_dec[ ]" for the transform coded-excitation (TCX) are stored, for example, directly in an array "x_tcx_invquant[win][bin]", and the order of the transmission of the noiseless coding codeword is such that when they are decoded in the order received and stored in the array "bin" is the most rapidly incrementing index, and "win" is the most slowly incrementing index. Within a codeword, the order of the decoding is a, b. In other words, if the spectral values describe a transform-coded-excitation of the linear-prediction filter of a speech coder, the spectral values a, b are associated to adjacent and increasing frequencies of the transform-coded-excitation. Spectral coefficients associated to a lower frequency are typically encoded and decoded before a spectral coefficient associated with a higher frequency.

Notably, the audio decoder 200 may be configured to apply the decoded frequency-domain representation 232, which is provided by the arithmetic decoder 230, both for a "direct" generation of a time-domain audio signal representation using a frequency-domain-to-time-domain signal transform and for an "indirect" provision of a time-domain audio signal representation using both a frequency-domain-to-time-domain decoder and a linear-prediction-filter excited by the output of the frequency-domain-to-time-domain signal transformer.

In other words, the arithmetic decoder, the functionality of which is discussed here in detail, is well-suited for decoding spectral values of a time-frequency-domain representation of an audio content encoded in the frequency-domain, and for the provision of a time-frequency-domain representation of a stimulus signal for a linear-prediction-filter adapted to decode (or synthesize) a speech signal encoded in the linear-prediction-domain. Thus, the arithmetic decoder is well-suited for use in an audio decoder which is capable of handling both frequency-domain encoded audio content and linear-predictive-frequency-domain encoded audio content (transform-coded-excitation-linear-prediction-domain mode).

11.3 Context Initialization According to FIGS. 5*a* and 5*b*

In the following, the context initialization (also designated as a "context mapping"), which is performed in a step 310, will be described.

The context initialization comprises a mapping between a past context and a current context in accordance with the algorithm "arith_map_context( )", a first example of which is shown in FIG. 5*a* and a second example of which is shown in FIG. 5*b*.

As can be seen, the current context is stored in a global variable "q[2][n_context]" which takes the form of an array having a first dimension of 2 and a second dimension of "n_context". A past context may optionally (but not necessarily) be stored in a variable "qs[n_context]" which takes the form of a table having a dimension of "n_context" (if it is used).

Taking reference to the example algorithm "arith_map_context" in FIG. 5*a*, the input variable N describes a length of a current window and the input variable "arith_reset_flag" indicates whether the context should be reset. Moreover, the global variable "previous_N" describes a length of a previous window. It should be noted here that typically a number of spectral values associated with a window is, at least approximately, equal to half a length of the said window in terms of time-domain samples. Moreover, it should be noted that a number of 2-tuples of spectral values is, consequently, at least approximately equal to a quarter of a length of said window in terms of time-domain samples.

Taking reference to the example of FIG. 5*a*, mapping of the context may be performed in accordance with the algorithm "arith_map_context( )". It should be noted here that the function "arith_map_context( )" sets the entries "q[0][j]" of the current context array q to zero for j=0 to j=N/4−1, if the flag "arith_reset_flag" is active and consequently indicates that the context should be reset. Otherwise, i.e. if the flag "arith_reset_flag" is inactive, the entries "q[0][j]" of the current context array q are derived from the entries "q[1][k]" of the current context array q. It should be noted that the function "arith_map_context( )" according to FIG. 5*a* sets the entries "q[0][j]" of the current context array q to the values "q[1][k]" of the current context array q, if the number of spectral values associated with the current (e.g., frequency-domain-encoded) audio frame is identical to the number of spectral values associated with the previous audio frame for j=k=0 to j=k=N/4−1.

A more complicated mapping is performed if the number of spectral values associated to the current audio frame is different from the number of spectral values associated to the previous audio frame. However, details regarding the mapping in this case are not particularly relevant for the key idea of the present invention, such that reference is made to the pseudo program code of FIG. 5*a* for details.

Moreover, an initialization value for the numeric current context value c is returned by the function "arith_map_context( )". This initialization value is, for example, equal to the value of the entry "q[0][0]" shifted to the left by 12-bits. Accordingly, the numeric (current) context value c is properly initialized for an iterative update.

Moreover, FIG. 5*b* shows another example of an algorithm "arith_map_context( )" which may alternatively be used. For details, reference is made to the pseudo program code in FIG. 5*b*.

To summarize the above, the flag "arith_reset_flag" determines if the context may be reset. If the flag is true, a reset sub-algorithm 500*a* of the algorithm "arith_map_context( )" is called. Alternatively, however, if the flag "arith_reset_flag" is inactive (which indicates that no reset of the context should be performed), the decoding process starts with an initialization phase where the context element vector (or array) q is updated by copying and mapping the context elements of the previous frame stored in q[1][ ] into q[0][ ]. The context elements within q are stored on 4-bits per 2-tuple. The copying and/or mapping of the context element are performed in a sub-algorithm 500*b*.

In the example of FIG. 5*b*, the decoding process starts with an initialization phase where a mapping is done between the saved past context stored in qs and the context of the current frame q. The past context qs is stored on 2-bits per frequency line.

11.4 State Value Computation According to FIGS. 5*c* and 5*d*

In the following, the state value computation 312*a* will be described in more detail.

A first example algorithm will be described taking reference to FIG. 5*c* and a second example algorithm will be described taking reference to FIG. 5*d*.

It should be noted that the numeric current context value c (as shown in FIG. 3) can be obtained as a return value of the function "arith_get_context(c,i,N)", a pseudo program code representation of which is shown in FIG. 5*c*. Alternatively, however, the numeric current context value c can be obtained as a return value of the function "arith_get_context(c,i)", a pseudo program code representation of which is shown in FIG. 5*d*.

Regarding the computation of the state value, reference is also made to FIG. 4, which shows the context used for a state evaluation, i.e. for the computation of a numeric current context value c. FIG. 4 shows a 2-dimensional representation of spectral values, both over time and frequency. An abscissa 410 describes the time, and an ordinate 412 describes the frequency. As can be seen in FIG. 4, a tuple 420 of spectral values to decode (advantageously using the numeric current context value), is associated with a time-index t0 and a frequency index i. As can be seen, for the time index t0, the tuples having frequency indices i−1, i−2, and i−3 are already decoded at the time at which the spectral values of the tuple 120, having the frequency index i, is to be decoded. As can be seen from FIG. 4, a spectral value 430 having a time index t0 and a frequency index i−1 is already decoded before the tuple 420 of spectral values is decoded, and the tuple 430 of spectral values is considered for the context which is used for the decoding of the tuple 420 of spectral values. Similarly, a tuple 440 of spectral values having a time index t0−1 and a frequency index of i−1, a tuple 450 of spectral values having a time index t0−1 and a frequency index of i, and a tuple 460 of spectral values having a time index t0−1 and a frequency index of i+1, are already decoded before the tuple 420 of spectral values is decoded, and are considered for the determination of the context, which is used for decoding the tuple 420 of spectral values. The spectral values (coefficients) already decoded at the time when the spectral values of the tuple 420 are decoded and considered for the context are shown by a shaded square. In contrast, some other spectral values already decoded (at the time when the spectral values of the tuple 420 are decoded) but not considered for the context (for the decoding of the spectral values of the tuple 420) are represented by squares having dashed lines, and other spectral values (which are not yet decoded at the time when the spectral values of the tuple 420 are decoded) are shown by circles having dashed lines. The tuples represented by squares having dashed lines and the tuples represented by circles having dashed lines are not used for determining the context for decoding the spectral values of the tuple 420.

However, it should be noted that some of these spectral values, which are not used for the "regular" or "normal" computation of the context for decoding the spectral values of the tuple 420 may, nevertheless, be evaluated for the detection of a plurality of previously-decoded adjacent spectral values which fulfill, individually or taken together, a predetermined condition regarding their magnitudes. Details regarding this issue will be discussed below.

Taking reference now to FIG. 5*c*, details of the algorithm "arith_get_context(c,i,N)" will be described. FIG. 5*c* shows the functionality of said function "arith_get_context(c,i,N)" in the form of a pseudo program code, which uses the conventions of the well-known C-language and/or C++ language. Thus, some more details regarding the calculation of the numeric current context value "c" which is performed by the function "arith_get_context(c,i,N)" will be described.

It should be noted that the function "arith_get_context(c,i,N)" receives, as input variables, an "old state context", which may be described by a numeric previous context value c. The function "arith_get_context(c,i,N)" also receives, as an input variable, an index i of a 2-tuple of spectral values to decode. The index i is typically a frequency index. An input variable N describes a window length of a window, for which the spectral values are decoded.

The function "arith_get_context(c,i,N)" provides, as an output value, an updated version of the input variable c, which describes an updated state context, and which may be considered as a numeric current context value. To summarize, the function "arith_get_context(c,i,N)" receives a numeric previous context value c as an input variable and provides an updated version thereof, which is considered as a numeric current context value. In addition, the function "arith_get_context" considers the variables i, N, and also accesses the "global" array qHH.

Regarding the details of the function "arith_get_context(c,i,N)", it should be noted that the variable c, which initially represents the numeric previous context value in a binary form, is shifted to the right by 4-bits in a step 504*a*. Accordingly, the four least significant bits of the numeric previous context value (represented by the input variable c) are discarded. Also, the numeric weights of the other bits of the numeric previous context values are reduced, for example, a factor of 16.

Moreover, if the index i of the 2-tuple is smaller than N/4−1, i.e. does not take a maximum value, the numeric current context value is modified in that the value of the entry q[0][i+1] is added to bits 12 to 15 (i.e. to bits having a numeric weight of $2^{12}$, $2^{13}$, $2^{14}$, and $2^{15}$) of the shifted context value which is obtained in step 504*a*. For this purpose, the entry q[0][i+1] of the array q[ ][ ] (or, more precisely, a binary representation of the value represented by said entry) is shifted to the left by 12-bits. The shifted version of the value represented by the entry q[0][i+1] is then added to the context value c, which is derived in the step 504*a*, i.e. to a bit-shifted (shifted to the right by 4-bits) number representation of the numeric previous context value. It should be noted here that the entry q[0][i+1] of the array q[ ][ ] represents a sub-region value associated with a previous portion of the audio content (e.g., a portion of the audio content having time index t0−1, as defined with reference to FIG. 4), and with a higher frequency (e.g. a frequency having a frequency index i+1, as defined with reference to FIG. 4) than the tuple of spectral values to be currently decoded (using the numeric current context value c output by the function "arith_get_context(c,i,N)"). In other words, if the tuple 420 of spectral values is to be decoded using the numeric current context value, the entry q[0][i+1] may be based on the tuple 460 of previously-decoded spectral values.

A selective addition of the entry q[0][i+1] of the array q[ ][ ] (shifted to the left by 12-bits) is shown at reference numeral 504*b*. As can be seen, the addition of the value represented by the entry q[0][i+1] is naturally only performed if the frequency index i does not designate a tuple of spectral values having the highest frequency index i=N/4−1.

Subsequently, in a step 504*c*, a Boolean AND-operation is performed, in which the value of the variable c is AND-combined with a hexadecimal value of 0xFFF0 to obtain an updated value of the variable c. By performing such an AND-operation, the four least-significant bits of the variable c are effectively set to zero.

In a step 504*d*, the value of the entry q[1][i−1] is added to the value of the variable c, which is obtained by step 504*c*, to thereby update the value of the variable c. However, said update of the variable c in step 504*d* is only performed if the frequency index i of the 2-tuple to decode is larger than zero. It should be noted that the entry q[1][i−1] is a context sub-region value based on a tuple of previously-decoded spectral values of the current portion of the audio content for frequencies smaller than the frequencies of the spectral values to be decoded using the numeric current context value. For example, the entry q[1][i−1] of the array q[ ][ ] may be associated with the tuple 430 having time index t0 and frequency index i−1, if it is assumed that the tuple 420 of spectral values is to be decoded using the numeric current context value returned by the present execution of the function "arith_get_context(c,i,N)".

To summarize, bits 0, 1, 2, and 3 (i.e. a portion of four least-significant bits) of the numeric previous context value are discarded in step 504*a* by shifting them out of the binary number representation of the numeric previous context value. Moreover, bits 12, 13, 14, and 15 of the shifted variable c (i.e. of the shifted numeric previous context value) are set to take values defined by the context sub-region value q[0][i+1] in the step 504*b*. Bits 0, 1, 2, and 3 of the shifted numeric previous context value (i.e. bits 4, 5, 6, and 7 of the original numeric previous context value) are overwritten by the context sub-region value q[1][i−1] in steps 504*c* and 504*d*.

Consequently, it can be said that bits 0 to 3 of the numeric previous context value represent the context sub-region value associated with the tuple 432 of spectral values, bits 4 to 7 of the numeric previous context value represent the context sub-region value associated with a tuple 434 of previously decoded spectral values, bits 8 to 11 of the numeric previous context value represent the context sub-region value associated with the tuple 440 of previously-decoded spectral values and bits 12 to 15 of the numeric previous context value represent a context sub-region value associated with the tuple 450 of previously-decoded spectral values. The numeric previous context value, which is input into the function "arith_get_context(c,i,N)", is associated with a decoding of the tuple 430 of spectral values.

The numeric current context value, which is obtained as an output variable of the function "arith_get_context(c,i,N)", is associated with a decoding of the tuple 420 of spectral values. Accordingly, bits 0 to 3 of the numeric current context values describe the context sub-region value associated with the tuple 430 of the spectral values, bits 4 to 7 of the numeric current context value describe the context sub-region value associated with the tuple 440 of spectral values, bits 8 to 11 of the numeric current context value describe the numeric sub-region value associated with the tuple 450 of spectral value and bits 12 to 15 of the numeric current context value described the context sub-region value associated with the tuple 460 of spectral values. Thus, it can be seen that a portion of the numeric previous context value, namely bits 8 to 15 of the numeric previous context value, are also included in the numeric current context value, as bits 4 to 11 of the numeric current context value. In contrast, bits 0 to 7 of the current numeric previous context value are discarded when deriving the number representation of the numeric current context value from the number representation of the numeric previous context value.

In a step 504*e*, the variable c which represents the numeric current context value is selectively updated if the frequency index i of the 2-tuple to decode is larger than a predetermined number of, for example, 3. In this case, i.e. if i is larger than 3, it is determined whether the sum of the context sub-region values q[1][i−3], q[1][i−2], and q[1][i−1] is smaller than (or equal to) a predetermined value of, for example, 5. If it is found that the sum of said context sub-region values is smaller than said predetermined value, a hexadecimal value of, for example, 0x10000, is added to the variable c. Accordingly, the variable c is set such that the variable c indicates if there is a condition in which the context sub-region values q[1][i−3], q[1][i−2], and q[1][i−1] comprise a particularly small sum value. For example, bit 16 of the numeric current context value may act as a flag to indicate such a condition.

To conclude, the return value of the function "arith_get_context(c,i,N)" is determined by the steps 504*a*, 504*b*, 504*c*, 504*d*, and 504*e*, where the numeric current context value is derived from the numeric previous context value in steps 504*a*, 504*b*, 504*c*, and 504*d*, and wherein a flag indicating an environment of previously decoded spectral values having, on average, particularly small absolute values, is derived in step 504*e* and added to the variable c. Accordingly, the value of the variable c obtained steps 504*a*, 504*b*, 504*c*, 504*d* is returned, in a step 504*f*, as a return value of the function "arith_get_context(c,i,N)", if the condition evaluated in step 504*e* is not fulfilled. In contrast, the value of the variable c, which is derived in steps 504*a*, 504*b*, 504*c*, and 504*d*, is incremented by the hexadecimal value of 0x10000 and the result of this increment operation is returned, in the step 504*e*, if the condition evaluated in step 540*e* is fulfilled.

To summarize the above, it should be noted that the noiseless decoder outputs 2-tuples of unsigned quantized spectral coefficients (as will be described in more detail below). At first the state c of the context is calculated based on the previously decoded spectral coefficients "surrounding" the 2-tuple to decode. In an embodiment, the state (which is, for example, represented by a numeric context value) is incrementally updated using the context state of the last decoded 2-tuple (which is designated as a numeric previous context value), considering only two new 2-tuples (for example, 2-tuples 430 and 460). The state is coded on 17-bits (e.g., using a number representation of a numeric current context value) and is returned by the function "arith_get_context( )". For details, reference is made to the program code representation of FIG. 5*c*.

Moreover, it should be noted that a pseudo program code of an alternative embodiment of a function "arith_get_context( )" is shown in FIG. 5*d*. The function "arith_get_context(c,i)" according to FIG. 5*d* is similar to the function "arith_get_context(c,i,N)" according to FIG. 5*c*.

However, the function "arith_get_context(c,i)" according to FIG. 5*d* does not comprise a special handling or decoding of tuples of spectral values comprising a minimum frequency index of i=0 or a maximum frequency index of i=N/4−1.

11.5 Mapping Rule Selection

In the following, the selection of a mapping rule, for example, a cumulative-frequencies-table which describes a mapping of a codeword value onto a symbol code, will be described. The selection of the mapping rule is made in dependence on a context state, which is described by the numeric current context value c.

11.5.1 Mapping Rule Selection Using the Algorithm According to FIG. 5*e*

In the following, the selection of a mapping rule using the function "arith_get_pk(c)" will be described. It should be noted that the function "arith_get_pk( )" is called at the beginning of the sub-algorithm 312*ba* when decoding a code value "acod_m" for providing a tuple of spectral values. It should be noted that the function "arith_get_pk(c)" is called with different arguments in different iterations of the algorithm 312*b*. For example, in a first iteration of the algorithm 312*b*, the function "arith_get_pk(c)" is called with an argument which is equal to the numeric current context value c, provided by the previous execution of the function "arith_get_context(c, i,N)" at step 312*a*. In contrast, in further iterations of the sub-algorithm 312*ba*, the function "arith_get_pk(c)" is called with an argument which is the sum of the numeric current context value c provided by the function "arith_get_context (c,i,N)" in step 312*a*, and a bit-shifted version of the value of the variable "esc_nb", wherein the value of the variable "esc_nb" is shifted to the left by 17-bits. Thus, the numeric current context value c provided by the function "arith_get_context(c,i,N)" is used as an input value of the function "arith_ get_pk( )" in the first iteration of the algorithm 312*ba*, i.e. in the decoding of comparatively small spectral values. In contrast, when decoding comparatively larger spectral values, the input variable of the function "arith_get_pk( )" is modified in that the value of the variable "esc_nb", is taken into consideration, as is shown in FIG. 3.

Taking reference now to FIG. 5*e*, which shows a pseudo program code representation of a first embodiment of the function "arith_get_pk(c)", it should be noted that the function "arith_get_pk( )" receives the variable c as an input value, wherein the variable c describes the state of the context, and wherein the input variable c of the function "arith_get_pk( )" is equal to the numeric current context value provided as a return variable by the function "arith_get_context( )" at least in some situations. Moreover, it should be noted that the function "arith_get_pk( )" provides, as an output variable, the variable "pki", which describes an index of a probability model and which may be considered as a mapping rule index value.

Taking reference to FIG. 5*e*, it can be seen that the function "arith_get_pk( )" comprises a variable initialization 506*a*, wherein the variable "i_min" is initialized to take the value of −1. Similarly, the variable i is set to be equal to the variable "i_min", such that the variable i is also initialized to a value of −1. The variable "i_max" is initialized to take a value which is smaller, by 1, than the number of entries of the table "ari_lookup_m[ ]" (details of which will be described taking reference to FIGS. 21(1) and 21(2)). Accordingly, the variables "i_min" and "i_max" define an interval.

Subsequently, a search 506*b* is performed to identify an index value which designates an entry of the table "ari_hash_m", such that the value of the input variable c of the function "arith_get_pk( )" lies within an interval defined by said entry and an adjacent entry.

In the search 506*b*, a sub-algorithm 506*ba* is repeated, while a difference between the variables "i_max" and "i_min" is larger than 1. In the sub-algorithm 506*ba*, the variable i is set to be equal to an arithmetic mean of the values of the variables "i_min" and "i_max". Consequently, the variable i designates an entry of the table "ari_hash_m[ ]" in a middle of a table interval defined by the values of the variables "i_min" and "i_max". Subsequently, the variable j is set to be equal to the value of the entry "ari_hash_m[i]" of the table "ari_hash_m[ ]". Thus, the variable j takes a value defined by an entry of the table "ari_hash_m[ ]", which entry lies in the middle of a table interval defined by the variables "i_min" and "i_max". Subsequently, the interval defined by the variables "i_min" and "i_max" is updated if the value of the input variable c of the function "arith_get_pk( )" is different from a state value defined by the uppermost bits of the table entry "j=ari_hash_m[i]" of the table "ari_hash_m[ ]". For example, the "upper bits" (bits 8 and upward) of the entries of the table "ari_hash_m[ ]" describe significant state values. Accordingly, the value "j>>8" describes a significant state value represented by the entry "j=ari_hash_m[i]" of the table "ari_hash_m[ ]" designated by the hash-table-index value i. Accordingly, if the value of the variable c is smaller than the value "j>>8", this means that the state value described by the variable c is smaller than a significant state value described by the entry "ari_hash_m[i]" of the table "ari_hash_m[ ]". In this case, the value of the variable "i_max" is set to be equal to the value of the variable i, which in turn has the effect that a size of the interval defined by "i_min" and "i_max" is reduced, wherein the new interval is approximately equal to the lower half of the previous interval. If it found that the input variable c of the function "arith_get_pk( )" is larger than the value "j>>8", which means that the context value described by the variable c is larger than a significant state value described by the entry "ari_hash_m[i]" of the array "ari_hash_m[ ]", the value of the variable "i_min" is set to be equal to the value of the variable i. Accordingly, the size of the interval defined by the values of the variables "i_min" and "i_max" is reduced to approximately a half of the size of the previous interval, defined by the previous values of the variables "i_min" and "i_max". To be more precise, the interval defined by the updated value of the variable "i_min" and by the previous (unchanged) value of the variable "i_max" is approximately equal to the upper half of the previous interval in the case that the value of the variable c is larger than the significant state value defined by the entry "ari_hash_m[i]".

If, however, it is found that the context value described by the input variable c of the algorithm "arith_get_pk( )" is equal to the significant state value defined by the entry "ari_hash_m [i]" (i.e. c==(j>>8)), a mapping rule index value defined by the lower most 8-bits of the entry "ari_hash_m[i]" is returned as the return value of the function "arith_get_pk( )" (instruction "return (j&0xFF)").

To summarize the above, an entry "ari_hash_m[i]", the uppermost bits (bits 8 and upward) of which describe a significant state value, is evaluated in each iteration 506*ba*, and the context value (or numeric current context value) described by the input variable c of the function "arith_get_pk( )" is compared with the significant state value described by said table entry "ari_hash_m[i]". If the context value represented by the input variable c is smaller than the significant state value represented by the table entry "ari_hash_m[i]", the upper boundary (described by the value "i_max") of the table interval is reduced, and if the context value described by the input variable c is larger than the significant state value described by the table entry "ari_hash_m[i]", the lower boundary (which is described by the value of the variable "i_min") of the table interval is increased. In both of said cases, the sub-algorithm 506*ba* is repeated, unless the size of the interval (defined by the difference between "i_max" and "i_min") is smaller than, or equal to, 1. If, in contrast, the context value described by the variable c is equal to the significant state value described by the table entry "ari_hash_m[i]", the function "arith_get_pk( )" is aborted, wherein the return value is defined by the lower most 8-bits of the table entry "ari_hash_m[i]".

If, however, the search 506*b* is terminated because the interval size reaches its minimum value ("i_max–"i_min" is smaller than, or equal to, 1), the return value of the function "arith_get_pk( )" is determined by an entry "ari_lookup_m [i_max]" of a table "ari_lookup_m[ ]", which can be seen at reference numeral 506*c*. Accordingly, the entries of the table "ari_hash_m[ ]" define both significant state values and boundaries of intervals. In the sub-algorithm 506*ba*, the search interval boundaries "i_min" and "i_max" are iteratively adapted such that the entry "ari_hash_m[i]" of the table "ari_hash_m[ ]", a hash table index i of which lies, at least approximately, in the center of the search interval defined by the interval boundary values "i_min" and "i_max", at least approximates a context value described by the input variable c. It is thus achieved that the context value described by the input variable c lies within an interval defined by "ari_hash_m[i_min]" and "ari_hash_mli_maxl" after the completion of the iterations of the sub-algorithm 506*ba*, unless the context value described by the input variable c is equal to a significant state value described by an entry of the table "ari_hash_m[ ]".

If, however, the iterative repetition of the sub-algorithm 506*ba* is terminated because the size of the interval (defined by "i_max–i_min") reaches or exceeds its minimum value, it is assumed that the context value described by the input variable c is not a significant state value. In this case, the index "i_max", which designates an upper boundary of the interval, is nevertheless used. The upper value "i_max" of the interval, which is reached in the last iteration of the sub-algorithm 506*ba*, is re-used as a table index value for an access to the table "ari_lookup_m". The table "ari_lookup_m[ ]" describes mapping rule index values associated with intervals of a plurality of adjacent numeric context values. The intervals, to which the mapping rule index values described by the entries of the table "ari_lookup_m[ ]" are associated, are defined by the significant state values described by the entries of the table "ari_hash_m[ ]". The entries of the table "ari_hash_m" define both significant state values and interval boundaries of intervals of adjacent numeric context values. In the execution of the algorithm 506*b*, it is determined whether the numeric context value described by the input variable c is equal to a significant state value, and if this is not the case, in which interval of numeric context values (out of a plurality of intervals, boundaries of which are defined by the significant state values) the context value described by the input variable c is lying. Thus, the algorithm 506*b* fulfills a double functionality to determine whether the input variable c describes a significant state value and, if it is not the case, to identify an interval, bounded by significant state values, in which the context value represented by the input variable c lies. Accordingly, the algorithm 506*e* is particularly efficient and involves only a comparatively small number of table accesses.

To summarize the above, the context state c determines the cumulative-frequencies-table used for decoding the most-significant 2-bits-wise plane m. The mapping from c to the corresponding cumulative-frequencies-table index "pki" as performed by the function "arith_get_pk( )". A pseudo program code representation of said function "arith_get_pk( )" has been explained taking reference to FIG. 5*e*.

To further summarize the above, the value m is decoded using the function "arith_decode( )" (which is described in more detail below) called with the cumulative-frequencies-table "arith_cf_m[pkil][ ]", where "pki" corresponds to the index (also designated as mapping rule index value) returned by the function "arith_get_pk( )", which is described with reference to FIG. 5*e*.

11.5.2 Mapping Rule Selection Using the Algorithm According to FIG. 5*f*

In the following, another embodiment of a mapping rule selection algorithm "arith_get_pk( )" will be described with reference to FIG. 5*f* which shows a pseudo program code representation of such an algorithm, which may be used in the decoding of a tuple of spectral values. The algorithm according to FIG. 5*f* may be considered as an optimized version (e.g., speed optimized version) of the algorithm, "get_pk( )" or of the algorithm "arith_get_pk( )".

The algorithm "arith_get_pk( )" according to FIG. 5*f* receives, as an input variable, a variable c which describes the state of the context. The input variable c may, for example, represent a numeric current context value.

The algorithm "arith_get_pk( )" provides, as an output variable, a variable "pki", which describes and index of a probability distribution (or probability model) associated to a state of the context described by the input variable c. The variable "pki" may, for example, be a mapping rule index value.

The algorithm according to FIG. 5*f* comprises a definition of the contents of the array "i_diff[ ]". As can be seen, a first entry of the array "i_diff[ ]" (having an array index 0) is equal to 299 and the further array entries (having array indices 1 to 8) take the values of 149, 74, 37, 18, 9, 4, 2, and 1. Accordingly, the step size for the selection of a hash-table index value "i_min" is reduced with each iteration, as the entries of the arrays "i_diff[ ]" define said step sizes. For details, reference is made to the below discussion.

However, different step sizes, e.g. different contents of the array "i_diff[ ]" may actually be chosen, wherein the contents of the array "i_diff[ ]" may naturally be adapted to a size of the hash-table "ari_hash_m[i]".

It should be noted that the variable "i_min" is initialized to take a value of 0 right at the beginning of the algorithm "arith_get_pk( )".

In an initialization step 508*a*, a variable s is initialized in dependence on the input variable c, wherein a number representation of the variable c is shifted to the left by 8 bits in order to obtain the number representation of the variable s.

Subsequently, a table search 508*b* is performed, in order to identify a hash-table-index-value "i_min" of an entry of the hash-table "ari_hash_m[ ]", such that the context value described by the context value c lies within an interval which is bounded by the context value described by the hash-table entry "ari_hash_m[i_min]" and a context value described by another hash-table entry "ari_hash_m" which other entry "ari_hash_m" is adjacent (in terms of its hash-table index value) to the hash-table entry "ari_hash_m[i_min]" Thus, the algorithm 508*b* allows for the determining of a hash-table-index-value "i_min" designating an entry "j=ari_hash_m [i_min]" of the hash-table "ari_hash_m[ ]", such that the hash-table entry "ari_hash_m[i_min]" at least approximates the context value described by the input variable c.

The table search 508*b* comprises an iterative execution of a sub-algorithm 508*ba*, wherein the sub-algorithm 508*ba* is executed for a predetermined number of, for example, nine iterations. In the first step of the sub-algorithm 508*ba*, the variable i is set to a value which is equal to a sum of a value of a variable "i_min" and a value of a table entry "i_diff[k]". It should be noted here that k is a running variable, which is incremented, starting from an initial value of k=0, with each iteration of the sub-algorithm 508*ba*. The array "i_diff[ ]" defines predetermine increment values, wherein the increment values decrease with increasing table index k, i.e. with increasing numbers of iterations.

In a second step of the sub-algorithm 508*ba*, a value of a table entry "ari_hash_m[ ]" is copied into a variable j. Advantageously, the uppermost bits of the table-entries of the table "ari_hash_m[ ]" describe a significant state values of a numeric context value, and the lowermost bits (bits 0 to 7) of the entries of the table "ari_hash_m[ ]" describe mapping rule index values associated with the respective significant state values.

In a third step of the sub-algorithm 508*ba*, the value of the variable S is compared with the value of the variable j, and the variable "i_min" is selectively set to the value "i+1" if the value of the variable s is larger than the value of the variable j. Subsequently, the first step, the second step, and the third step of the sub-algorithm 508*ba* are repeated for a predetermined number of times, for example, nine times. Thus, in each execution of the sub-algorithm 508*ba*, the value of the variable "i_min" is incremented by i_diff[ ]+1, if, and only if, the context value described by the currently valid hash-table-index i_min+i_diff[ ] is smaller than the context value described by the input variable c. Accordingly, the hash-table-index-value "i_min" is (iteratively) increased in each execution of the sub-algorithm 508*ba* if (and only if) the context value described by the input variable c and, consequently, by the variable s, is larger than the context value described by the entry "ari_hash_m[i=i_min+diff[k]]".

Moreover, it should be noted that only a single comparison, namely the comparison as to whether the value of the variable s is larger than the value of the variable j, is performed in each execution of the sub-algorithm 508*ba*. Accordingly, the algorithm 508*ba* is computationally particularly efficient. Moreover, it should be noted that there are different possible outcomes with respect to the final value of the variable "i_min" For example, it is possible that the value of the variable "i_min" after the last execution of the sub-algorithm 512*ba* is such that the context value described by the table entry "ari_hash_m[i_min]" is smaller than the context value described by the input variable c, and that the context value described by the table entry "ari_hash_m[i_min+1]" is larger than the context value described by the input variable c. Alternatively, it may happen that after the last execution of the sub-algorithm 508*ba*, the context value described by the hash-table-entry "ari_hash_m[i_min−1]" is smaller than the context value described by the input variable c, and that the context value described by the entry "ari_hash_m[i_min]" is larger than the context value described by the input variable c. Alternatively, however, it may happen that the context value described by the hash-table-entry "ari_hash_m[i_min]" is identical to the context value described by the input variable c.

For this reason, a decision-based return value provision 508*c* is performed. The variable j is set to take the value of the hash-table-entry "ari_hash_m[i_min]" Subsequently, it is determined whether the context value described by the input variable c (and also by the variable s) is larger than the context value described by the entry "ari_hash_m[i_min]" (first case defined by the condition "s>j"), or whether the context value described by the input variable c is smaller than the context value described by the hash-table-entry "ari_hash_m[i_min]" (second case defined by the condition "c<j>>8"), or whether the context value described by the input variable c is equal to the context value described by the entry "ari_hash_m[i_min]" (third case).

In the first case, (s>j), an entry "ari_lookup_m[i_min+1]" of the table "ari_lookup_m[ ]" designated by the table index value "i_min+1" is returned as the output value of the function "arith_get_pk( )". In the second case (c<(j>>8)), an entry "ari_lookup_m[i_min]" of the table "ari_lookup_m[ ]" designated by the table index value "i_min" is returned as the return value of the function "arith_get_pk( )". In the third case (i.e. if the context value described by the input variable c is equal to the significant state value described by the table entry "ari_hash_m[i_min]"), a mapping rule index value described by the lowermost 8-bits of the hash-table entry "ari_hash_m[i_min]" is returned as the return value of the function "arith_get_pk( )".

To summarize the above, a particularly simple table search is performed in step 508*b*, wherein the table search provides a variable value of a variable "i_min" without distinguishing whether the context value described by the input variable c is equal to a significant state value defined by one of the state entries of the table "ari_hash_m[ ]" or not. In the step 508*c*, which is performed subsequent to the table search 508*b*, a magnitude relationship between the context value described by the input variable c and a significant state value described by the hash-table-entry "ari_hash_m[i_min]" is evaluated, and the return value of the function "arith_get_pk( )" is selected in dependence on a result of said evaluation, wherein the value of the variable "i_min", which is determined in the table evaluation 508*b*, is considered to select a mapping rule index value even if the context value described by the input variable c is different from the significant state value described by the hash-table-entry "ari_hash_m[i_min]".

It should further be noted that the comparison in the algorithm should advantageously (or alternatively) be done between the context index (numeric context value) c and j=ari_hash_m[i]>>8. Indeed, each entry of the table "ari_hash_m[ ]" represents a context index, coded beyond the 8th bits, and its corresponding probability model coded on the 8 first bits (least significant bits). In the current implementation, we are mainly interested in knowing whether the present context c is greater than ari_hash_m[i]>>8, which is equivalent to detecting if s=c<<8 is also greater than ari_hash_m[i].

To summarize the above, once the context state is calculated (which may, for example, be achieved using the algorithm "arith_get_context(c,i,N)" according to FIG. 5*c*, or the algorithm "arith_get_context(c,i)" according to FIG. 5*d*, the most significant 2-bit-wise-plane is decoded using the algorithm "arith_decode" (which will be described below) called with the appropriate cumulative-frequencies-table corresponding to the probability model corresponding to the context state. The correspondence is made by the function "arith_get_pk( )", for example, the function "arith_get_pk( )" which has been discussed with reference to FIG. 5*f*.

11.6 Arithmetic Decoding 11.6.1 Arithmetic Decoding Using the Algorithm According to FIG. 5*g*

In the following, the functionality of the function "arith_decode( )" will be discussed in detail with reference to FIG. 5*g*.

It should be noted that the function "arith_decode( )" uses the helper function "arith_first_symbol (void)", which returns TRUE, if it is the first symbol of the sequence and FALSE otherwise. The function "arith_decode( )" also uses the helper function "arith_get_next_bit(void)", which gets and provides the next bit of the bitstream.

In addition, the function "arith_decode( )" uses the global variables "low", "high" and "value". Further, the function "arith_decode( )" receives, as an input variable, the variable "cum_freq[ ]", which points towards a first entry or element (having element index or entry index 0) of the selected cumulative-frequencies-table or cumulative-frequencies sub-table. Also, the function "arith_decode( )" uses the input variable "cfl", which indicates the length of the selected cumulative-frequencies-table or cumulative-frequencies sub-table designated by the variable "cum_freq[ ]".

The function "arith_decode( )" comprises, as a first step, a variable initialization 570_a_, which is performed if the helper function "arith_first_symbol( )" indicates that the first symbol of a sequence of symbols is being decoded. The value initialization 550_a_ initializes the variable "value" in dependence on a plurality of, for example, 16 bits, which are obtained from the bitstream using the helper function "arith_get_next_bit", such that the variable "value" takes the value represented by said bits. Also, the variable "low" is initialized to take the value of 0, and the variable "high" is initialized to take the value of 65535.

In a second step 570_b_, the variable "range" is set to a value, which is larger, by 1, than the difference between the values of the variables "high" and "low". The variable "cum" is set to a value which represents a relative position of the value of the variable "value" between the value of the variable "low" and the value of the variable "high". Accordingly, the variable "cum" takes, for example, a value between 0 and $2^{16}$ in dependence on the value of the variable "value".

The pointer p is initialized to a value which is smaller, by 1, than the starting address of the selected cumulative-frequencies-table.

The algorithm "arith_decode( )" also comprises an iterative cumulative-frequencies-table-search 570_c_. The iterative cumulative-frequencies-table-search is repeated until the variable cfl is smaller than or equal to 1. In the iterative cumulative-frequencies-table-search 570_c_, the pointer variable q is set to a value, which is equal to the sum of the current value of the pointer variable p and half the value of the variable "cfl". If the value of the entry *q of the selected cumulative-frequencies-table, which entry is addressed by the pointer variable q, is larger than the value of the variable "cum", the pointer variable p is set to the value of the pointer variable q, and the variable "cfl" is incremented. Finally, the variable "cfl" is shifted to the right by one bit, thereby effectively dividing the value of the variable "cfl" by 2 and neglecting the modulo portion.

Accordingly, the iterative cumulative-frequencies-table-search 570_c_ effectively compares the value of the variable "cum" with a plurality of entries of the selected cumulative-frequencies-table, in order to identify an interval within the selected cumulative-frequencies-table, which is bounded by entries of the cumulative-frequencies-table, such that the value cum lies within the identified interval. Accordingly, the entries of the selected cumulative-frequencies-table define intervals, wherein a respective symbol value is associated to each of the intervals of the selected cumulative-frequencies-table. Also, the widths of the intervals between two adjacent values of the cumulative-frequencies-table define probabilities of the symbols associated with said intervals, such that the selected cumulative-frequencies-table in its entirety defines a probability distribution of the different symbols (or symbol values). Details regarding the available cumulative-frequencies-tables will be discussed below taking reference to FIG. 23.

Taking reference again to FIG. 5_g_, the symbol value is derived from the value of the pointer variable p, wherein the symbol value is derived as shown at reference numeral 570_d_. Thus, the difference between the value of the pointer variable p and the starting address "cum_freq" is evaluated in order to obtain the symbol value, which is represented by the variable "symbol".

The algorithm "arith_decode" also comprises an adaptation 570_e_ of the variables "high" and "low". If the symbol value represented by the variable "symbol" is different from 0, the variable "high" is updated, as shown at reference numeral 570_e_. Also, the value of the variable "low" is updated, as shown at reference numeral 570_e_. The variable "high" is set to a value which is determined by the value of the variable "low", the variable "range" and the entry having the index "symbol−1" of the selected cumulative-frequencies-table. The variable "low" is increased, wherein the magnitude of the increase is determined by the variable "range" and the entry of the selected cumulative-frequencies-table having the index "symbol". Accordingly, the difference between the values of the variables "low" and "high" is adjusted in dependence on the numeric difference between two adjacent entries of the selected cumulative-frequencies-table.

Accordingly, if a symbol value having a low probability is detected, the interval between the values of the variables "low" and "high" is reduced to a narrow width. In contrast, if the detected symbol value comprises a relatively large probability, the width of the interval between the values of the variables "low" and "high" is set to a comparatively large value. Again, the width of the interval between the values of the variable "low" and "high" is dependent on the detected symbol and the corresponding entries of the cumulative-frequencies-table.

The algorithm "arith_decode( )" also comprises an interval renormalization 570_f_, in which the interval determined in the step 570_e_ is iteratively shifted and scaled until the "break"-condition is reached. In the interval renormalization 570_f_, a selective shift-downward operation 570_fa_ is performed. If the variable "high" is smaller than 32768, nothing is done, and the interval renormalization continues with an interval-size-increase operation 570_fb_. If, however, the variable "high" is not smaller than 32768 and the variable "low" is greater than or equal to 32768, the variables "values", "low" and "high" are all reduced by 32768, such that an interval defined by the variables "low" and "high" is shifted downwards, and such that the value of the variable "value" is also shifted downwards. If, however, it is found that the value of the variable "high" is not smaller than 32768, and that the variable "low" is not greater than or equal to 32768, and that the variable "low" is greater than or equal to 16384 and that the variable "high" is smaller than 49152, the variables "value", "low" and "high" are all reduced by 16384, thereby shifting down the interval between the values of the variables "high" and "low" and also the value of the variable "value". If, however, neither of the above conditions is fulfilled, the interval renormalization is aborted.

If, however, any of the above-mentioned conditions, which are evaluated in the step 570_fa_, is fulfilled, the interval-increase-operation 570_fb_ is executed. In the interval-increase-operation 570_fb_, the value of the variable "low" is doubled. Also, the value of the variable "high" is doubled, and the result of the doubling is increased by 1. Also, the value of the variable "value" is doubled (shifted to the left by one bit), and a bit of the bitstream, which is obtained by the helper function "arith_get_next_bit" is used as the least-significant bit. Accordingly, the size of the interval between the values of the variables "low" and "high" is approximately doubled, and the precision of the variable "value" is increased by using a new bit of the bitstream. As mentioned above, the steps 570_fa_ and 570_fb_ are repeated until the "break" condition is reached, i.e. until the interval between the values of the variables "low" and "high" is large enough.

Regarding the functionality of the algorithm "arith_decode( )", it should be noted that the interval between the values of the variables "low" and "high" is reduced in the step 570_e_ in dependence on two adjacent entries of the cumulative-frequencies-table referenced by the variable "cum_freq". If an interval between two adjacent values of the selected cumulative-frequencies-table is small, i.e. if the adjacent values are comparatively close together, the interval between the values of the variables "low" and "high", which is obtained in the step 570*e*, will be comparatively small. In contrast, if two adjacent entries of the cumulative-frequencies-table are spaced further, the interval between the values of the variables "low" and "high", which is obtained in the step 570*e*, will be comparatively large.

Consequently, if the interval between the values of the variables "low" and "high", which is obtained in the step 570*e*, is comparatively small, a large number of interval renormalization steps will be executed to re-scale the interval to a "sufficient" size (such that neither of the conditions of the condition evaluation 570*fa* is fulfilled). Accordingly, a comparatively large number of bits from the bitstream will be used in order to increase the precision of the variable "value". If, in contrast, the interval size obtained in the step 570*e* is comparatively large, only a smaller number of repetitions of the interval normalization steps 570*fa* and 570*fb* will be used in order to renormalize the interval between the values of the variables "low" and "high" to a "sufficient" size. Accordingly, only a comparatively small number of bits from the bitstream will be used to increase the precision of the variable "value" and to prepare a decoding of a next symbol.

To summarize the above, if a symbol is decoded, which comprises a comparatively high probability, and to which a large interval is associated by the entries of the selected cumulative-frequencies-table, only a comparatively small number of bits will be read from the bitstream in order to allow for the decoding of a subsequent symbol. In contrast, if a symbol is decoded, which comprises a comparatively small probability and to which a small interval is associated by the entries of the selected cumulative-frequencies-table, a comparatively large number of bits will be taken from the bitstream in order to prepare a decoding of the next symbol.

Accordingly, the entries of the cumulative-frequencies-tables reflect the probabilities of the different symbols and also reflect a number of bits that may be used for decoding a sequence of symbols. By varying the cumulative-frequencies-table in dependence on a context, i.e. in dependence on previously-decoded symbols (or spectral values), for example, by selecting different cumulative-frequencies-tables in dependence on the context, stochastic dependencies between the different symbols can be exploited, which allows for a particular bitrate-efficient encoding of the subsequent (or adjacent) symbols.

To summarize the above, the function "arith_decode( )", which has been described with reference to FIG. 5*g*, is called with the cumulative-frequencies-table "arith_cf_m[pki][ ]", corresponding to the index "pki" returned by the function "arith_get_pk( )" to determine the most-significant bit-plane value m (which may be set to the symbol value represented by the return variable "symbol").

To summarize the above, the arithmetic decoder is an integer implementation using the method of tag generation with scaling. For details, reference is made to the book "Introduction to Data Compression" of K. Sayood, Third Edition, 2006, Elsevier Inc.

The computer program code according to FIG. 5*g* describes the used algorithm according to an embodiment of the invention.

11.6.2 Arithmetic Decoding Using the Algorithm According to FIGS. 5*h* and 5*i*

FIGS. 5*h* and 5*i* show a pseudo program code representation of another embodiment of the algorithm "arith_ decode( )", which can be used as an alternative to the algorithm "arith_ decode" described with reference to FIG. 5*g*.

It should be noted that both the algorithms according to FIG. 5*g* and FIGS. 5*h* and 5*i* may be used in the algorithm "values_decode( )" according to FIG. 3.

To summarize, the value m is decoded using the function "arith_decode( )" called with the cumulative-frequencies-table "arith_cf_m[pki][ ]" wherein "pki" corresponds to the index returned by the function "arith_get_pk( )". The arithmetic coder (or decoder) is an integer implementation using the method of tag generation with scaling. For details, reference is made to the Book "Introduction to Data Compression" of K. Sayood, Third Edition, 2006, Elsevier Inc. The computer program code according to FIGS. 5*h* and 5*i* describes the used algorithm.

11.7 Escape Mechanism

In the following, the escape mechanism, which is used in the decoding algorithm "values_decode( )" according to FIG. 3, will briefly be discussed.

When the decoded value m (which is provided as a return value of the function "arith_decode( )") is the escape symbol "ARITH_ESCAPE", the variables "lev" and "esc_nb" are incremented by 1, and another value m is decoded. In this case, the function "arith_get_pk( )" is called once again with the value "c+esc_nb<<17" as input argument, where the variable "esc_nb" describes the number of escape symbols previously decoded for the same 2-tuple and bounded to 7.

To summarize, if an escape symbol is identified, it is assumed that the most-significant bit-plane value m comprises an increased numeric weight. Moreover, current numeric decoding is repeated, wherein a modified numeric current context value "c+esc_nb<<17" is used as an input variable to the function "arith_get_pk( )". Accordingly, a different mapping rule index value "pki" is typically obtained in different iterations of the sub-algorithm 312*ba*.

11.8 Arithmetic Stop Mechanism

In the following, the arithmetic stop mechanism will be described. The arithmetic stop mechanism allows for the reduction of the number of bits that may be used in the case that the upper frequency portion is entirely quantized to 0 in an audio encoder.

In an embodiment, an arithmetic stop mechanism may be implemented as follows: Once the value m is not the escape symbol, "ARITH_ESCAPE", the decoder checks if the successive m forms an "ARITH_ESCAPE" symbol. If the condition "esc_nb>0&&m==0" is true, the "ARITH_STOP" symbol is detected and the decoding process is ended. In this case, the decoder jumps directly to the "arith_finish( )" function which will be described below. The condition means that the rest of the frame is composed of 0 values.

11.9 Less-Significant Bit-Plane Decoding

In the following, the decoding of the one or more less-significant bit-planes will be described. The decoding of the less-significant bit-plane, is performed, for example, in the step 312*d* shown in FIG. 3. Alternatively, however, the algorithms as shown in FIGS. 5*j* and 5*n* may be used.

11.9.1 Less-Significant Bit-Plane Decoding According to FIG. 5*j*

Taking reference now to FIG. 5*j*, it can be seen that the values of the variables a and b are derived from the value m. For example, the number representation of the value m is shifted to the right by 2-bits to obtain the number representation of the variable b. Moreover, the value of the variable a is obtained by subtracting a bit-shifted version of the value of variable b, bit-shifted to the left by 2-bits, from the value of the variable m.

Subsequently, an arithmetic decoding of the least-significant bit-plane values r is repeated, wherein the number of repetitions is determined by the value of the variable "lev". A least-significant bit-plane value r is obtained using the function "arith_decode", wherein a cumulative-frequencies-table adapted to the least-significant bit-plane decoding is used (cumulative-frequencies-table "arith_cf_r"). A least-significant bit (having a numeric weight of 1) of the variable r describes a less-significant bit-plane of the spectral value represented by the variable a, and a bit having a numeric weight of 2 of the variable r describes a less-significant bit of the spectral value represented by the variable b. Accordingly, the variable a is updated by shifting the variable a to the left by 1 bit and adding the bit having the numeric weight of 1 of the variable r as the least significant bit. Similarly, the variable b is updated by shifting the variable b to the left by one bit and adding the bit having the numeric weight of 2 of the variable r.

Accordingly, the two most-significant information carrying bits of the variables a,b are determined by the most-significant bit-plane value m, and the one or more least-significant bits (if any) of the values a and b are determined by one or more less-significant bit-plane values r.

To summarize the above, it the "ARITH_STOP" symbol is not met, the remaining bit planes are then decoded, if any exist, for the present 2-tuple. The remaining bit-planes are decoded from the most-significant to the least-significant level by calling the function "arith_decode( )" lev number of times with the cumulative frequencies table "arith_cf_r[ ]". The decoded bit-planes r permit the refining of the previously-decoded value m in accordance with the algorithm, a pseudo program code of which is shown in FIG. 5*j*.

11.9.2 Less-Significant Bit Band Decoding According to FIG. 5*n*

Alternatively, however, the algorithm a pseudo program code representation of which is shown in FIG. 5*n* can also be used for the less-significant bit-plane decoding. In this case, if the "ARITH_STOP" symbol is not met, the remaining bit-planes are then decoded, if any exist, for the present 2-tuple. The remaining bit-planes are decoded from the most-significant to the least-significant level by calling "lev" times "arith_decode( )" with the cumulative-frequencies-table "arith_cf_r( )". The decoded bit-planes r permits for the refining of the previously-decoded value m in accordance with the algorithm shown in FIG. 5*n*.

11.10 Context Update 11.10.1 Context Update According to FIGS. 5*k*, 5*l*, and 5*m*

In the following, operations used to complete the decoding of the tuple of spectral values will be described, taking reference to FIGS. 5*k* and 5*k*. Moreover, an operation will be described which is used to complete a decoding of a set of tuples of spectral values associated with a current portion (for example, a current frame) of an audio content.

Taking reference now to FIG. 5*k*, it can be seen that the entry having entry index 2*i of the array "x_ac_dec[ ]" is set to be equal to a, and that the entry having entry index "2*i+1" of the array "x_ac_dec[ ]" is set to be equal to b after the less significant bit decoding 312*d*. In other words, at the point after the less-significant bit decoding 312*d*, the unsigned value of the 2-tuple (a,b), is completely decoded. It is saved into the element (for example the array "x_ac_dec[ ]") holding the spectral coefficients in accordance with the algorithm shown in FIG. 5*k*.

Subsequently, the context "q" is also updated for the next 2-tuple. It should be noted that this context update also has to be performed for the last 2-tuple. This context update is performed by the function "arith_update_context( )", a pseudo program code representation of which is shown in FIG. 5*l*.

Taking reference now to FIG. 5*l*, it can be seen that the function "arith_update_context(i,a,b)" receives, as input variables, decoded unsigned quantized spectral coefficients (or spectral values) a, b of the 2-tuple. In addition, the function "arith_update_context" also receives, as an input variable, an index i (for example, a frequency index) of the quantized spectral coefficient to decode. In other words, the input variable i may, for example, be an index of the tuple of spectral values, absolute values of which are defined by the input variables a, b. As can be seen, the entry "q[1][i]" of the array "q[ ][ ]" may be set to a value which is equal to a+b+1. In addition, the value of the entry "q[1][i]" of the array "q[ ][ ]" may be limited to a hexadecimal value of "0xF". Thus, the entry "q[1][i]" of the array "q[ ][ ]" is obtained by computing a sum of absolute values of the currently decoded tuple {a,b} of spectral values having frequency index i, and adding 1 to the result of said sum.

It should be noted here that the entry "q[1][i]" of the array "q[ ][ ]" may be considered as a context sub-region value, because it describes a sub-region of the context which is used for a subsequent decoding of additional spectral values (or tuples of spectral values).

It should be noted here that the summation of the absolute values a and b of the two currently decoded spectral values (signed versions of which are stored in the entries "x_ac_dec[2*i]" and "x_ac_dec[2*i+1]" of the array "x_ac_dec[ ]"), may be considered as the computation of a norm (e.g. a L1 norm) of the decoded spectral values.

It has been found that context sub-region values (i.e. entries of the array "q[ ][ ]"), which describe a norm of a vector formed by a plurality of previously decoded spectral values are particularly meaningful and memory efficient. It has been found that such a norm, which is computed on the basis of a plurality of previously decoded spectral values, comprises meaningful context information in a compact form. It has been found that the sign of the spectral values is typically not particularly relevant for the choice of the context. It has also been found that the formation of a norm across a plurality of previously decoded spectral values typically maintains the most important information, even though some details are discarded. Moreover, it has been found that a limitation of the numeric current context value to a maximum value typically does not result in a severe loss of information. Rather, it has been found that it is more efficient to use the same context state for significant spectral values which are larger than a predetermined threshold value. Thus, the limitation of the context sub-region values brings along a further improvement of the memory efficiency. Furthermore, it has been found that the limitation of the context sub-region values to a certain maximum value allows for a particularly simple and computationally efficient update of the numeric current context value, which has been described, for example, with reference to FIGS. 5*c* and 5*d*. By limiting the context sub-region values to a comparatively small value (e.g. to a value of 15), a context state which is based on a plurality of context sub-region values can be represented in the efficient form, which has been discussed taking reference to FIGS. 5*c* and 5*d*.

Moreover, it has been found that a limitation of the context sub-region values to values between 1 and 15, brings along a particularly good compromise between accuracy and memory efficiency, because 4 bits are sufficient in order to store such a context sub-region value.

However, it should be noted that in some other embodiments, a context sub-region value may be based on a single decoded spectral value only. In this case, the formation of a norm may optionally be omitted.

The next 2-tuple of the frame is decoded after the completion of the function "arith_update_context" by incrementing i by 1 and by redoing the same process as described above, starting from the function "arith_get_context( )".

When 1 g/2 2-tuples are decoded within the frame, or with the stop symbol according to "ARITH_ESCAPE" occurs, the decoding process of the spectral amplitude terminates and the decoding of the signs begins.

Details regarding the decoding of the signs have been discussed with reference to FIG. 3, wherein the decoding of the signs is shown in reference numeral 314.

Once all unsigned quantized spectral coefficients are decoded, the according sign is added. For each non-null quantized value of "x_ac_dec" a bit is read. If the read bit value is equal to 0, the quantized value is positive, nothing is done and the signed value is equal to the previously-decoded unsigned value. Otherwise (i.e. if the read bit value is equal to 1), the decoded coefficient (or spectral value) is negative and the two's complement is taken from the unsigned value. The sign bits are read from the low to the higher frequencies. For details, reference is made to FIG. 3 and to the explanations regarding the signs decoding 314.

The decoding is finished by calling the function "arith_finish( )". The remaining spectral coefficients are set to 0. The respective context states are updated correspondingly.

For details, reference is made to FIG. 5*m*, which shows a pseudo program code representation of the function "arith_finish( )". As can be seen, the function "arith_finish( )" receives an input variable 1 g which describes the decoded quantized spectral coefficients. Advantageously, the input variable 1 g of the function "arith_finish" describes a number of actually-decoded spectral coefficients, leaving spectral coefficients unconsidered, to which a O-value has been allocated in response to the detection of an "ARITH_STOP" symbol. An input variable N of the function "arith_finish" describes a window length of a current window (i.e. a window associated with the current portion of the audio content). Typically, a number of spectral values associated with a window of length N is equal to N/2 and a number of 2-tuples of spectral values associated with a window of window length N is equal to N/4.

The function "arith_finish" also receives, as an input value, a vector "x_ac_dec" of decoded spectral values, or at least a reference to such a vector of decoded spectral coefficients.

The function "arith_finish" is configured to set the entries of the array (or vector) "x_ac_dec", for which no spectral values have been decoded due to the presence of an arithmetic stop condition, to 0. Moreover, the function "arith_finish" sets context sub-region values "q[1][i]", which are associated with spectral values for which no value has been decoded due to the presence of an arithmetic stop condition, to a predetermined value of 1. The predetermined value of 1 corresponds to a tuple of the spectral values wherein both spectral values are equal to 0.

Accordingly, the function "arith_finish( )" allows to update the entire array (or vector) "x_ac_dec[ ]" of spectral values and also the entire array of context sub-region values "q[1][i]", even in the presence of an arithmetic stop condition.

11.10.2 Context Update According to FIGS. 5*o* and 5*p*

In the following, another embodiment of the context update will be described taking reference to FIGS. 5*o* and 5*p*. At the point at which the unsigned value of the 2-tuple (a,b) is completely decoded, the context q is then updated for the next 2-tuple. The update is also performed if the present 2-tuple is the last 2-tuple. Both updates are made by the function "arith_update_context( )", a pseudo program code representation of which is shown in FIG. 5*o*.

The next 2-tuple of the frame is then decoded by incrementing i by 1 and calling the function arith_decodeQ. If the 1 g/2 2-tuples were already decoded with the frame, or if the stop symbol "ARITH_STOP" occurred, the function "arith_finish( )" is called. The context is saved and stored in the array (or vector) "qs" for the next frame. A pseudo program code of the function "arith_save_context( )" is shown in FIG. 5*p*.

Once all unsigned quantized spectral coefficients are decoded, the sign is then added. For each non-quantized value of "qdec", a bit is read. If the read bit value is equal to 0, the quantized value is positive, nothing is done and the signed value is equal to the previously-decoded unsigned value. Otherwise, the decoded coefficient is negative and the two's complement is taken from the unsigned vale. The signed bits are read from the low to the high frequencies.

11.11 Summary of Decoding Process

In the following, the decoding process will briefly be summarized. For details, reference is made to the above discussion and also to FIGS. 3, 4, 5*a*, 5*c*, 5*e*, 5*g*, 5*j*, 5*k*, 5*l*, and 5*m*. The quantized spectral coefficients "x_ac_dec[ ]" are noiselessly decoded starting from the lowest-frequency coefficient and progressing to the highest-frequency coefficient. They are decoded by groups of two successive coefficients a,b gathering in a so-called 2-tuple (a,b).

The decoded coefficients "x_ac_dec [ ]" for the frequency-domain (i.e. for a frequency-domain mode) are then stored in the array "x_ac_quant[g][win][sfb][bin]". The order of transmission of the noiseless coding codewords is such that when they are decoded in the order received and stored in the array, "bin" is the most rapidly incrementing index and "g" is the most slowly incrementing index. Within a codeword, the order of decoding is a, then b. The decoded coefficients "x_ac_dec[ ]" for the "TCX" (i.e. for an audio decoding using a transform-coded excitation) are stored (for example, directly) in the array "x_tcx_invquant[win][bin]" and the order of the transmission of the noiseless coding codewords is such that when they are decoded in the order received and stored in the array, "bin" is the most rapidly incrementing index and "win" is the most slowly incrementing index. Within a codeword, the order of decoding is a, then b.

First, the flag "arith_reset_flag" determines if the context may be reset. If the flag is true, this is considered in the function "arith_map_context".

The decoding process starts with an initialization phase where the context element vector "q" is updated by copying and mapping the context elements of the previous frame stored in "q[1][ ]" into "q[ ][ ]". The context elements within "q" are stored on a 4-bits per 2-tuple. For details, reference is made to the pseudo program code of FIG. 5*a*.

The noiseless decoder outputs 2-tuples of unsigned quantized spectral coefficients. At first, the state c of the context is calculated based on the previously-decoded spectral coefficients surrounding the 2-tuple to decode. Therefore, the state is incrementally updated using the context state of the last decoded 2-tuple considering only two new 2-tuples. The state is decoded on 17-bits and is returned by the function "arith_get_context". A pseudo program code representation of the set function "arith_get_context" is shown in FIG. 5*c*.

The context state c determines the cumulative-frequencies-table used for decoding the most significant 2-bit-wise-plane m. The mapping from c to the corresponding cumulative-frequencies-table index "pki" is performed by the function "arith_get_pk( )". A pseudo program code representation of the function "arith_get_pk( )" is shown in FIG. 5*e.*

The value m is decoded using the function "arith_decode( )" called with the cumulative-frequencies-table, "arith_cf_m[pki][ ]", where "pki" corresponds to the index returned by "arith_get_pk( )". The arithmetic coder (and decoder) is an integer implementation using a method of tag generation with scaling. The pseudo program code according to FIG. 5*g* describes the used algorithm.

When the decoded value m is the escape symbol "ARITH_ESCAPE", the variables "lev" and "esc_nb" are incremented by 1 and another value m is decoded. In this case, the function "get_pk( )" is called once again with the value "c+esc_nb<<17" as input argument, where "esc_nb" is the number of escape symbols previously decoded for the same 2-tuple and bounded to 7.

Once the value m is not the escape symbol "ARITH_ESCAPE", the decoder checks if the successive m forms an "ARITH_STOP" symbol. If the condition "(esc_nb>0&&m==0)" is true, the "ARITH_STOP" symbol is detected and the decoding process is ended. The decoder jumps directly to the sign decoding described afterwards. The condition means that the rest of the frame is composed of 0 values.

If the "ARITH_STOP" symbol is not met, the remaining bit-planes are then decoded, if any exist, for the present 2-tuple. The remaining bit-planes are decoded from the most-significant to the least-significant level, by calling "arith_decode( )" lev number of times with the cumulative-frequencies-table "arith_cf_r[ ]". The decoded bit-planes r permit the refining of the previously-decoded value m, in accordance with the algorithm a pseudo program code of which is shown in FIG. 5*j*. At this point, the unsigned value of the 2-tuple (a,b) is completely decoded. It is saved into the element holding the spectral coefficients in accordance with the algorithm, a pseudo program code representation of which is shown in FIG. 5*k.*

The context "q" is also updated for the next 2-tuple. It should be noted that this context update has to also be performed for the last 2-tuple. This context update is performed by the function "arith_update_context( )", a pseudo program code representation of which is shown in FIG. 5*l.*

The next 2-tuple of the frame is then decoded by incrementing i by 1 and by redoing the same process as described as above, starting from the function "arith_get_context( )". When 1 g/2 2-tuples are decoded within the frame, or when the stop symbol "ARITH_STOP" occurs, the decoding process of the spectral amplitude terminates and the decoding of the signs begins.

The decoding is finished by calling the function "arith_finish( )". The remaining spectral coefficients are set to 0. The respective context states are updated correspondingly. A pseudo program code representation of the function "arith_finish" is shown in FIG. 5*m.*

Once all unsigned quantized spectral coefficients are decoded, the according sign is added. For each non-null quantized value of "x_ac_dec", a bit is read. If the read bit value is equal to 0, the quantized value is positive, and nothing is done, and the signed value is equal to the previously decoded unsigned value. Otherwise, the decoded coefficient is negative and the two's complement is taken from the unsigned value. The signed bits are read from the low to the high frequencies.

11.12 Legends

FIG. 5*q* shows a legend of the definitions which is related to the algorithms according to FIGS. 5*a*, 5*c*, 5*e*, 5*f*, 5*g*, 5*j*, 5*k*, 5*l*, and 5*m.*

FIG. 5*r* shows a legend of the definitions which is related to the algorithms according to FIGS. 5*b*, 5*d*, 5*f*, 5*h*, 5*i*, 5*n*, 5*o*, and 5*p*.

12. Mapping Tables

In an embodiment according to the invention, particularly advantageous tables "ari_lookup_m", "ari_hash_m", and "ari_cf_m" are used for the execution of the function "arith_get_pk( )" according to FIG. 5*e* or FIG. 5*f*, and for the execution of the function "arith_decode( )" which was discussed with reference to FIGS. 5*g*, 5*h* and 5*i*. However, it should be noted that different tables may be used in some embodiments according to the invention.

12.1 Table "ari_hash_m[600]" According to FIG. 22

A content of a particularly advantageous implementation of the table "ari_hash_m", which is used by the function "arith_get_pk", a first embodiment of which was described with reference to FIG. 5*e*, and a second embodiment of which was described with reference to FIG. 5*f*, is shown in the table of FIG. 22. It should be noted that the table of FIG. 22 lists the 600 entries of the table (or array) "ari_hash_m[600]". It should also be noted that the table representation of FIG. 22 shows the elements in the order of the element indices, such that the first value "0x000000100UL" corresponds to a table entry "ari_hash_m[0]" having an element index (or table index) 0, and such that the last value "0x7fffffff4fUL" corresponds to a table entry "ari_hash_m[599]" having element index or table index 599. It should further be noted here that "0x" indicates that the table entries of the table "ari_hash_m[ ]" are represented in a hexadecimal format. Moreover, it should be noted here that the suffix "UL" indicates that the table entries of the table "ari_hash_m[ ]" are represented as unsigned "long" integer values (having a precision of 32-bits).

Furthermore, it should be noted that the table entries of the table "ari_hash_m[ ]" according to FIG. 22 are arranged in a numeric order, in order to allow for the execution of the table search 506*b*, 508*b*, 510*b* of the function "arith_get_pk( )".

It should further be noted that the most-significant 24-bits of the table entries of the table "ari_hash_m" represent certain significant state values, while the least-significant 8-bits represent mapping rule index values "pki". Thus, the entries of the table "ari_hash_m[ ]" describe a "direct hit" mapping of a context value onto a mapping rule index value "pki".

However, the uppermost 24-bits of the entries of the table "ari_hash_m[ ]" represent, at the same time, interval boundaries of intervals of numeric context values, to which the same mapping rule index value is associated. Details regarding this concept have already been discussed above.

12.2 Table "ari_lookup_m" According to FIG. 21

A content of a particularly advantageous embodiment of the table "ari_lookup_m" is shown in the table of FIG. 21. It should be noted here that the table of FIG. 21 lists the entries of the table "ari_lookup_m". The entries are referenced by a 1-dimensional integer-type entry index (also designated as "element index" or "array index" or "table index") which is, for example, designated with "i_max" or "i_min" It should be noted that the table "ari_lookup_m", which comprises a total of 600 entries, is well-suited for the use by the function "arith_get_pk" according to FIG. 5*e* or FIG. 5*f*. It should also be noted that the table "ari_lookup_m" according to FIG. 21 is adapted to cooperate with the table "ari_hash_m" according to FIG. 22.

It should be noted that the entries of the table "ari_lookup_m[600]" are listed in an ascending order of the table index "i" (e.g. "i_min" or "i_max") between 0 and 599. The term "0x" indicates that the table entries are described in a hexadecimal format. Accordingly, the first table entry "0x02" corresponds to the table entry "ari_lookup_m[0]" having table index 0 and the last table entry "0x5E" corresponds to the table entry "ari_lookup_m[599]" having table index 599.

It should also be noted that the entries of the table "ari_lookup_m[ ]" are associated with intervals defined by adjacent entries of the table "arith_hash_m[ ]". Thus, the entries of the table "ari_lookup_m" describe mapping rule index values associated with intervals of numeric context values, wherein the intervals are defined by the entries of the table "arith_hash_m".

12.3. Table "ari_cf_m[96][17]" According to FIG. 23

FIG. 23 shows a set of 96 cumulative-frequencies-tables (or sub-tables) "ari_cf_m[pki][17]", one of which is selected by and audio encoder 100, 700 or an audio decoder 200, 800, for example, for the execution of the function "arith_ decode( )", i.e. for the decoding of the most-significant bit-plane value. The selected one of the 96 cumulative-frequencies-tables (or sub-tables) shown in FIG. 23 takes the function of the table "cum_freq[ ]" in the execution of the function "arith_ decode( )".

As can be seen from FIG. 23, each sub-block represents a cumulative-frequencies-table having 17 entries. For example, a first sub-block 2310 represents the 17 entries of a cumulative-frequencies-table for "pki=0". A second sub-block 2312 represents the 17 entries of a cumulative-frequencies-table for "pki=1". Finally, a 96th sub-block 2396 represents the 17 entries of a cumulative-frequencies-table for "pki=95". Thus, FIG. 23 effectively represents 96 different cumulative-frequencies-tables (or sub-tables) for "pki=0" to "pki=95", wherein each of the 96 cumulative-frequencies-tables is represented by a sub-block (enclosed by curled brackets), and wherein each of said cumulative-frequencies-tables comprises 17 entries.

Within a sub-block (e.g. a sub-block 2310 or 2312, or a sub-block 2396), a first value describes a first entry of a cumulative-frequencies-table (having an array index or table index of 0), and a last value describes a last entry of a cumulative-frequencies-table (having an array index or table index of 16).

Accordingly, each sub-block 2310, 2312, 2396 of the table representation of FIG. 23 represents the entries of a cumulative-frequencies-table for use by the function "arith_decode" according to FIG. 5*g*, or according to FIGS. 5*h* and 5*i*. The input variable "cum_freqll" of the function "arith_decode" describes which of the 96 cumulative-frequencies-tables (represented by individual sub-blocks of 17 entries of the table "arith_cf_m") should be used for the decoding of the current spectral coefficients.

12.4 Table "ari_cf_r[ ]" According to FIG. 24

FIG. 24 shows a content of the table "ari_cf_r[ ]".

The four entries of said table are shown in FIG. 24. However, it should be noted that the table "ari_cf_r" may eventually be different in other embodiments.

13. Performance Evaluation and Advantages

The embodiments according to the invention use updated functions (or algorithms) and an updated set of tables, as discussed above, in order to obtain an improved tradeoff between computational complexity, memory requirement, and coding efficiency.

Generally speaking, the embodiments according to the invention create an improved spectral noiseless coding. Embodiments according to the present invention describe an enhancement of the spectral noiseless coding in USAC (unified speech and audio encoding).

Embodiments according to the invention create an updated proposal for the CE on improved spectral noiseless coding of spectral coefficients, based on the schemes as presented in the MPEG input papers m16912 and m17002. Both proposals were evaluated, potential short-comings eliminated and the strengths combined.

As in m16912 and m17002, the resulting proposal is based on the original context based arithmetic coding scheme as the working draft 5 USAC (the draft standard on unified speech and audio coding), but can significantly reduce memory requirements (random access memory (RAM) and read-only memory (ROM)) without increasing the computational complexity, while maintaining coding efficiency. In addition, a lossless transcoding of bitstreams according to the working draft 3 of the USAC Draft Standard and according to the working draft 5 of the USAC Draft Standard was proven to be possible. Embodiments according to the invention aim at replacing the spectral noiseless coding scheme as used in working draft 5 of the USAC Draft Standard.

The arithmetic coding scheme described herein is based on the scheme as in the reference model 0 (RM0) or the working draft 5 (WD) of the USAC Draft Standard. Spectral coefficients in frequency or in time model a context. This context is used for the selection of cumulative-frequencies-tables for the arithmetic encoder. Compared to the working draft 5 (WD), the context modeling is further improved and the tables holding the symbol probabilities were re-trained. The number of different probability models was increased from 32 to 96.

Embodiments according to the invention reduce the table sizes (data ROM demand) to 1518 words of length 32-bits or 6072-bytes (WD 5: 16, 894.5 words or 67,578-bytes). The static RAM demand is reduced from 666 words (2,664 bytes) to 72 words (288 bytes) per core coder channel. At the same time, it fully preserves the coding performance and can even reach a gain of approximately 1.29 to 1.95% compared to the overall data rate over all 9 operating points. All working draft 3 and working draft 5 bitstreams can be transcoded in a lossless manner, without affecting the bit reservoir constraints.

In the following, a brief discussion of the coding concepts according to working draft 5 of the USAC Draft Standard will be provided to facilitate the understanding of the advantages of the concept described herein. Subsequently, some advantageous embodiments according to the invention will be described.

Figure 14A:
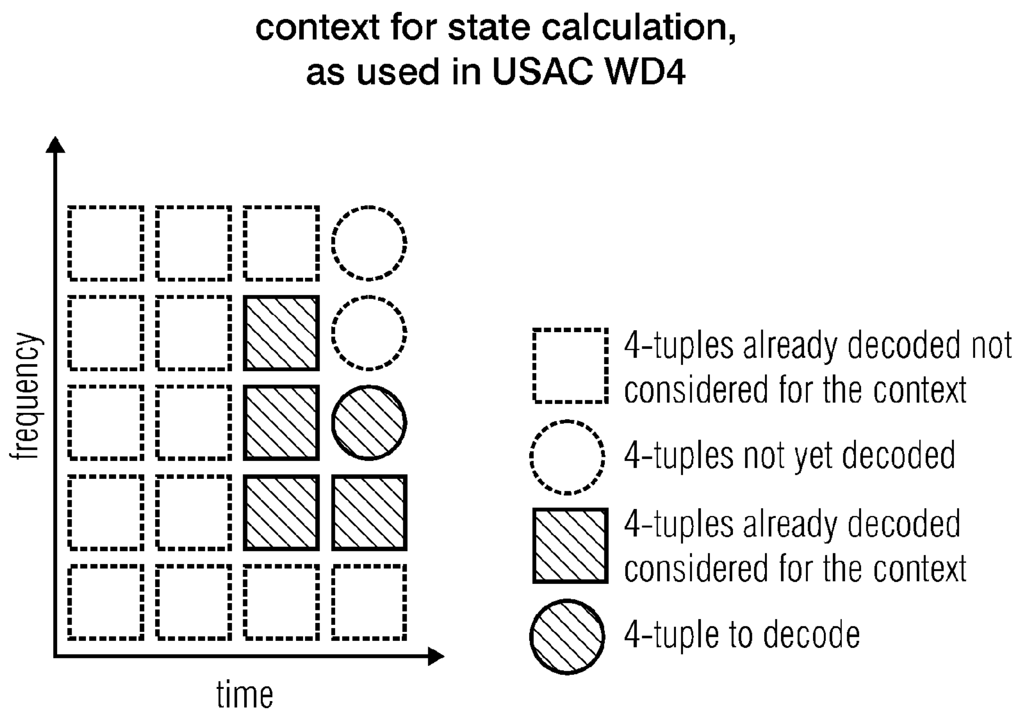
FIG. 14*a* shows a schematic representation of a context for a state calculation, as it is used in accordance with working draft 4 of the USAC Draft Standard.

In USAC working draft 5, a context based arithmetic coding scheme is used for noiseless coding of quantized spectral coefficients. As context, the decoded spectral coefficients are used, which are previous in frequency and time. In working draft 5, a maximum number of 16 spectral coefficients are used as context, 12 of them being previous in time. Also, spectral coefficients used for the context and to be decoded, are grouped as 4-tuples (i.e. 4 spectral coefficients neighbored in frequency, see FIG. 14*a*). The context is reduced and mapped on a cumulative-frequencies-table, which is then used to decode the next 4-tuple of spectral coefficients.

For the complete working draft 5 noiseless coding scheme, a memory demand (read-only memory (ROM)) of 16894.5 words (67578 byte) may be used. Additionally, 666 words (2664 byte) of static RAM per core-coder channel may be used for storing the states for the next frame. The table representation of FIG. 14*b* describes the tables as used in the USAC WD4 arithmetic coding scheme.

It should be noted here that in regards to the noiseless coding, working drafts 4 and 5 of the USAC draft standard are the same. Both use the same noiseless coder.

A total memory demand of a complete USAC WD5 decoder is estimated to be 37000 words (148000-byte) for data ROM without program code and 10000 to 17000 words for the static RAM. It can clearly be seen that the noiseless coder tables consume approximately 45% of the total data ROM demand. The largest individual table already consumes 4096 words (16384-byte).

It has been found that both, the size of the combination of all of the tables and the large individual tables exceed typical cache sizes as provided by a fixed point processors used in consumer portable devices, which is in a typical range of 8 to 32 Kbyte (e.g. ARM9e, TI C64XX, etc). This means that the set of tables can probably not be stored in the fast data RAM, which enables a quick random access to the data. This causes the whole decoding process to slow down.

Moreover, it has been found that current successful audio coding technology such as HE-AAC has been proven to be implementable on most mobile devices. HE-AAC uses a Huffman entropy coding scheme with a table size of 995 words. For details, reference is made to ISO/IEC JTC1/SC29/WG11 N2005, MPEG98, February 1998, San Jose, "Revised Report on Complexity of MPEG-2 AAC2".

At the 90$^{th}$ MPEG Meeting, in MPEG input papers m16912 and m17002, two proposals were presented which aimed at reducing the memory requirements and improving the encoding efficiency of the noiseless coding scheme. By analyzing both proposals, the following conclusions could be drawn.

- A significant reduction of memory demand is possible by reducing the code-word dimension. As shown in MPEG input document m17002, by reducing the dimension from 4-tuples to 1-tuples, the memory demand could be reduced from 16984.5 to 900 words without infringing on the coding efficiency; and
- Additional redundancy could be removed by applying a code-book of non-uniform probability distribution for the LSB coding, instead of using uniform probability distribution.

In the course of these evaluations, it was identified that moving from a 4-tuple to a 1-tuple coding scheme had a significant impact on the computational complexity: a reduction of the coding dimension increases by the same factor the number of symbols to code. This means for the reduction from 4-tuples to 1-tuples that the operations needed to determine the context, access the hash-tables and decode the symbol have to be performed four times more often than before. Together with a more sophisticated algorithm for the context determination, this led to an increment in computational complexity by a factor of 2.5 or x.xxPCU.

In the following, the proposed new scheme according to the embodiments of the present invention will briefly be described.

To overcome the issue of memory footprint and the computational complexity, an improved noiseless coding scheme is proposed to replace the scheme as in working draft 5 (WD5). The main focus in the development was put on reducing memory demand, while maintaining the compression efficiency and not increasing the computational complexity. More specifically, the target was to reach a good (or even the best) trade-off in the multi-dimension complexity space of compression performance, complexity and memory requirements.

The new coding scheme proposal borrows the main feature of the WD5 noiseless encoder, namely the context adaptation. The context is derived using previously-decoded spectral coefficients, which come as in WD5 from both, the past and the present frame (wherein a frame may be considered as a portion of the audio content). However, the spectral coefficients are now coded by combining two coefficients together to form a 2-tuple. Another difference lays in the fact that the spectral coefficients are now split into three parts, the sign, the more-significant bits or most-significant bits (MSBs) and the less-significant bits or least-significant bits (LSBs). The sign is coded independently from the magnitude which is further divided into two parts, the most-significant bits (or more significant bits) and the rest of the bits (or less-significant bits), if they exist. The 2-tuples for which the magnitude of the two elements is lower or equal to 3 are coded directly by the MSBs coding. Otherwise, an escape codeword is transmitted first for signaling any additional bit-plane. In the base version, the missing information, the LSBs and the sign, are both coded using uniform probability distribution. Alternatively, a different probability distribution may be used.

The table size reduction is still possible, since:

- only probabilities for 17 symbols need to be stored: {[0; +3], [0; +3]}+ESC symbol;
- there is no need to store a grouping table (egroups, dgroups, dgvectors);
- the size of the hash-table could be reduced with an appropriate training.

Figure 15A:
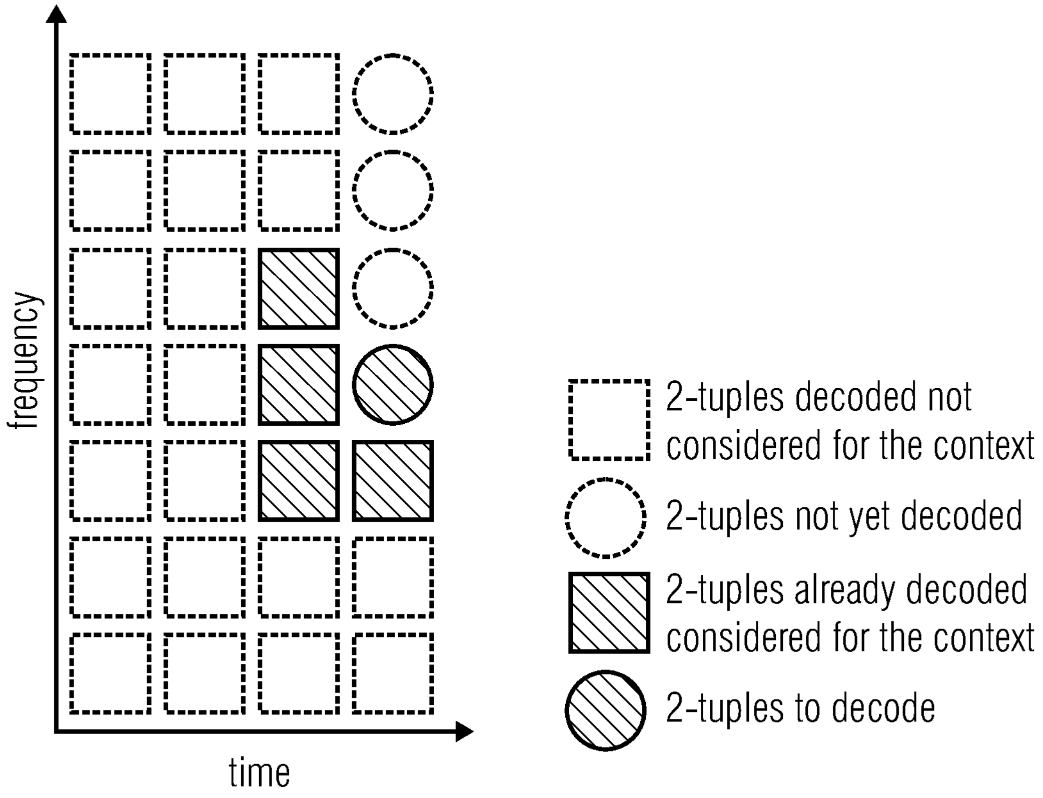
FIG. 15*a* shows a schematic representation of a context for a state calculation, as it is used in embodiments according to the invention.

In the following, some details regarding the MSBs coding will be described. As already mentioned, one of the main differences between WD5 of the USAC Draft Standard, a proposal submitted at the 90$^{th}$ MPEG Meeting and the current proposal is the dimension of the symbols. In WD5 of the USAC Draft Standard, 4-tuples were considered for the context generation and the noiseless coding. In a proposal submitted at the 90$^{th}$ MPEG Meeting, 1-tuples were used instead for reducing the ROM requirements. In the course of development, the 2-tuples were found to be the best compromise for reducing the ROM requirements, without increasing the computational complexity. Instead of considering four 4-tuples for the context innovation, now four 2-tuples are considered. As shown in FIG. 15*a*, three 2-tuples come from the past frame (also designated as a previous portion of the audio content) and one comes from the present frame (also designated as the current portion of the audio content).

The table size reduction is due to three main factors. First, only probabilities for 17 symbols need to be stored (i.e. {[0; +3], [0; +3]}+ESC symbol). Grouping tables (i.e. egroups, dgroups, and dgvectors) are no longer required. Finally, the size of the hash-table was reduced by performing an appropriate training.

Although the dimension was reduced from four to two, the complexity was maintained to the range as in WD5 of the USAC Draft Standard. It was achieved by simplifying both the context generation and the hash-table access.

The different simplifications and optimizations were done in a manner that the coding performance was not affected, and even slightly improved. It was achieved mainly by increasing the number of probability models from 32 to 96.

In the following, some details regarding the LSBs coding will be described. The LSBs are coded with a uniform probability distribution in some embodiments. Compared to WD5 of the USAC Draft Standard, the LSBs are now considered within 2-tuples instead of 4-tuples.

In the following some details regarding the sign coding will be explained. The sign is coded without using the arithmetic core-coder for the sake of complexity reduction. The sign is transmitted on 1-bit only when the corresponding magnitude is non-null. 0 means a positive value and 1 means a negative value.

Figure 16A:
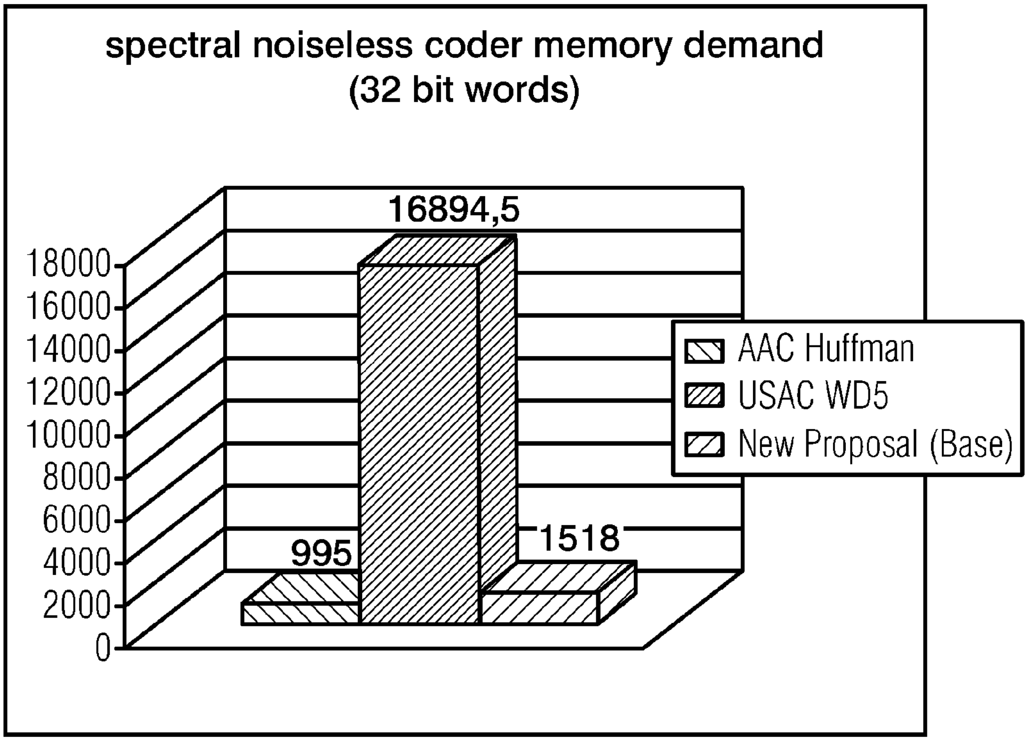
FIG. 16*a* shows a graphical representation of a read-only memory demand for the noiseless coding scheme according to the present invention, and according to working draft 5 of the USAC Draft Standard, and according to the AAC (advanced audio coding) Huffman Coding.
Figure 16B:
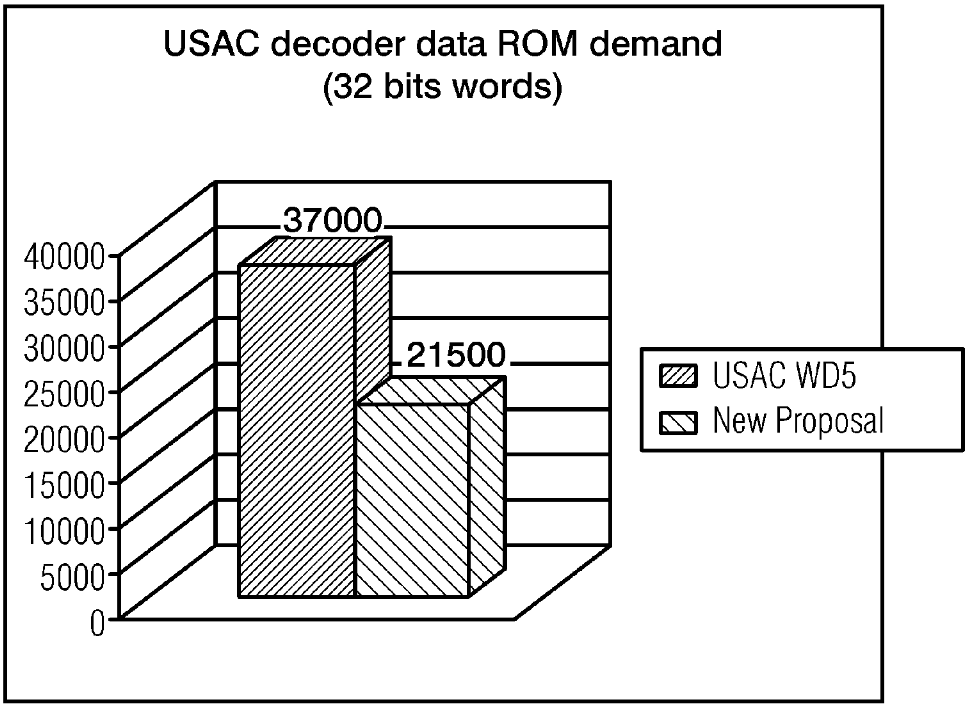
FIG. 16*b* shows a graphical representation of a total USAC decoder data read-only memory demand in accordance with the present invention and in accordance with the concept according to working draft 5 of the USAC Draft Standard.

In the following, some details regarding the memory demand will be explained. The proposed new scheme exhibits a total ROM demand of at most 1522.5 new words (6090-bytes). For details, reference is made to the table of FIG. 15*b*, which describes the tables as used in the proposed coding scheme. Compared to the ROM demand of the noiseless coding scheme in WD 5 of the USAC Draft Standard, the ROM demand is reduced by at least 15462 words (61848 bytes). It now ends up in the same order of magnitude as the memory requirement needed for the AAC Huffman decoder in HE-AAC (995 words or 3980-bytes). For details, reference is made to ISO/IEC JTC1/SC29/WG11 N2005, MPEG98, February 1998, San Jose, "Revised Report on Complexity of MPEG-2 AAC2", and also to FIG. 16*a*. This reduces the overall ROM demand of the noiseless coder by more than 92% and a complete USAC decoder from approximately 37000 words to approximately 21500 words, or by more than 41%. For details, reference is again made to FIGS. 16*a* and 16*b*, wherein FIG. 16*a* shows a ROM demand of a noiseless coding scheme as proposed, and of a noiseless coding scheme in accordance with WD4 of the USAC Draft Standard, and wherein FIG. 16*b* shows a total USAC decoder data ROM demand in accordance with the proposed scheme and in accordance with WD4 of the USAC Draft Standard.

Further on, the amount of information that may be used for the context derivation in the next frame (static ROM) is also reduced. In WD5 of the USAC Draft Standard, the complete set of coefficients (a maximum of 1152 coefficients) with a resolution of typically 16-bits additional to a group index per 4-tuple of a resolution 10-bits needed to be stored, which sums up to 666 words (2664-bytes) per core-coder channel (complete USAC WD4 decoder: approximately 10000 to 17000 words). The new scheme reduces the persistent information to only 2-bits per spectral coefficient, which sums up to 72 words (288-byte) in total per core-coder channel. The demand on the static memory can be reduced by 594 words (2376-byte).

Figure 17:
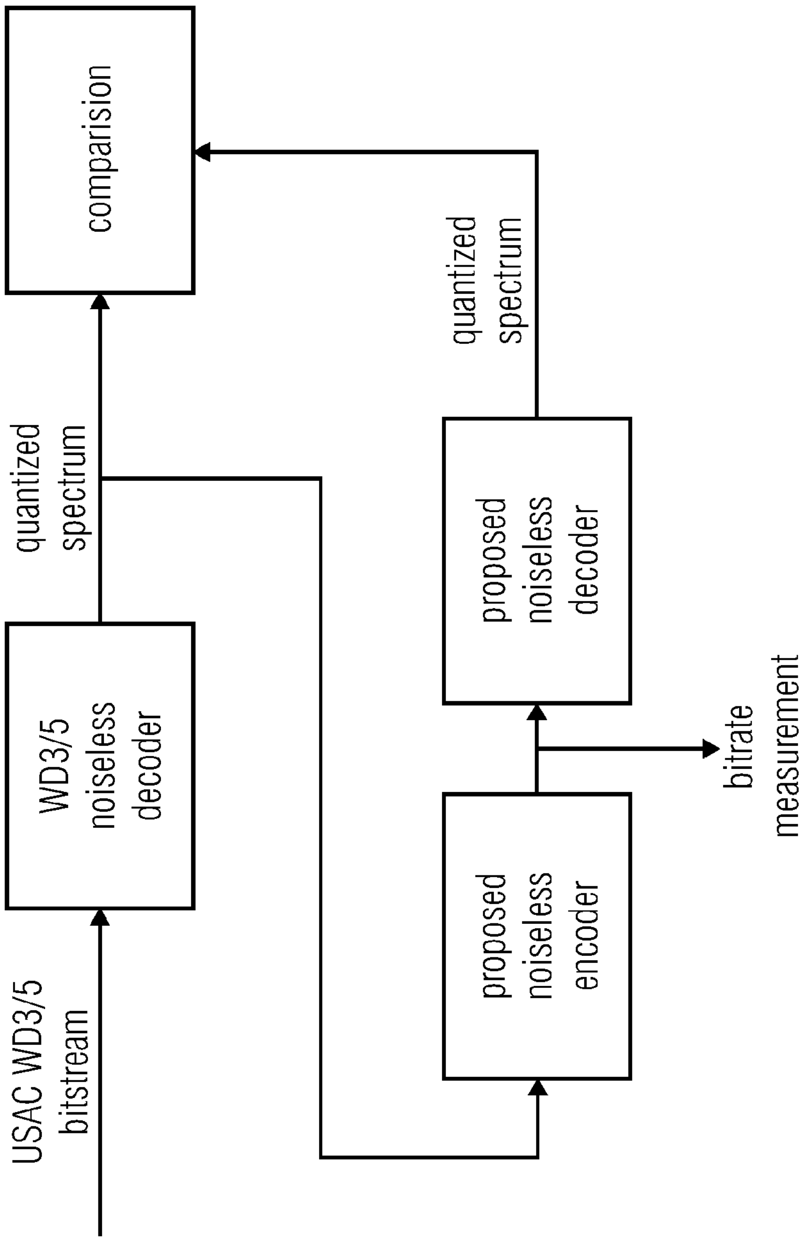
FIG. 17 shows a schematic representation of an arrangement for a comparison of a noiseless coding according to working draft 3 or working draft 5 of the USAC Draft Standard with a coding scheme according to the present invention.

In the following, some details regarding the possible increase of coding efficiency will be described. Decoding efficiency of embodiments according to the new proposal was compared against the reference quality bitstreams according to working draft 3 (WD3) and WD5 of the USAC Draft Standard. The comparison was performed by means of a transcoder, based on a reference software decoder. For details regarding said comparison of the noiseless coding according to WD3 or WD5 of the USAC Draft Standard and the proposed coding scheme, reference is made to FIG. 17, which shows a schematic representation of a test arrangement for a comparison of WD3/5 noiseless coding with the proposed coding scheme.

Also, the memory demand in embodiments according to the invention was compared to embodiments according to the WD3 (or WD5) of the USAC Draft Standard.

The coding efficiency is not only maintained, but slightly increased. For details, reference is made to the table of FIG. 18, which shows a table representation of average bit rates produced by the WD3 arithmetic coder (or a USAC audio coder using a WD3 arithmetic coder), and an audio coder (e.g. USAC audio coder) according to an embodiment of the invention.

Details on average bit rates per operating mode can be found in the table of FIG. 18.

Moreover, FIG. 19 shows a table representation of minimum and maximum bit reservoir levels for the WD3 arithmetic coder (or an audio coder using the WD3 arithmetic coder) and an audio coder in accordance with an embodiment of the present invention.

In the following, some details regarding the computational complexity will be described. The reduction of the dimensionality of the arithmetic coding usually leads to an increase of the computational complexity. Indeed, reducing the dimension by a factor of two will make the arithmetic coder routines call twice.

However, it has been found that this increase of complexity can be limited by several optimizations introduced in the proposed new coding scheme according to the embodiments of the present invention. The context generation was greatly simplified in some embodiments according to the invention. For each 2-tuple, the context can be incrementally updated from the last generated context. The probabilities are stored now on 14 bits instead of 16 bits which avoids 64-bits operations during the decoding process. Moreover, the probability model mapping was greatly optimized in some embodiments according to the invention. The worst case was drastically reduced and is limited to 10 iterations instead of 95.

As a result, the computational complexity of the proposed noiseless coding scheme was kept in the same range as in WD 5. A "pen and paper" estimate was performed by different versions of the noiseless coding and is recorded in the table of FIG. 20. It shows that the new coding scheme is only about 13% less complex than a WD5 arithmetic coder.

To summarize the above, it can be seen that embodiments according to the present invention provide a particularly good trade-off between computational complexity, memory requirements and coding efficiency.

14. Bitstream Syntax

14.1 Payloads of the Spectral Noiseless Coder

In the following, some details regarding the payloads of the spectral noiseless coder will be described. In some embodiments, there is a plurality of different coding modes, such as, for example, a so-called "linear-prediction-domain" coding mode and a "frequency-domain" coding mode. In the linear-prediction-domain coding mode, a noise shaping is performed on the basis of a linear-prediction analysis of the audio signal, and a noise-shaped signal is encoded in the frequency-domain. In the frequency-domain coding mode a noise shaping is performed on the basis of a psychoacoustic analysis and a noise shaped version of the audio content is encoded in the frequency-domain.

Spectral coefficients from both the "linear-prediction-domain" coded signal and the "frequency-domain" coded signal are scalar quantized and then noiselessly coded by an adaptively context dependent arithmetic coding. The quantized coefficients are gathered together into 2-tuples before being transmitted from the lowest frequency to the highest frequency. Each 2-tuple is split into a sign s, the most significant 2-bits-wise-plane m, and the remaining one or more less-significant bit-planes r (if any). The value m is coded according to a context defined by the neighboring spectral coefficients. In other words, m is coded according to the coefficients neighborhood. The remaining less-significant bit-planes r are entropy coded without considering the context. By means of m and r, the amplitude of these spectral coefficients can be reconstructed on the decoder side. For all non-null symbols, the signs s is coded outside the arithmetic coder using 1-bit. In other words, the values m and r form the symbols of the arithmetic coder. Finally, the signs s, are coded outside of the arithmetic coder using 1-bit per non-null quantized coefficient.

A detailed arithmetic coding procedure is described herein.

14.2 Syntax Elements

In the following, the bitstream syntax of a bitstream carrying the arithmetically-encoded spectral information will be described taking reference to FIGS. 6*a* to 6*j*.

FIG. 6*a* shows a syntax representation of so-called USAC raw data block ("usac_raw_data_block( )").

The USAC raw data block comprises one or more single channel elements ("single_channel_element( )") and/or one or more channel pair elements ("channel_pair_element( )").

Taking reference now to FIG. 6*b*, the syntax of a single channel element is described. The single channel element comprises a linear-prediction-domain channel stream ("lpd_channel_stream 0") or a frequency-domain channel stream ("fd_channel_stream ( )") in dependence on the core mode.

FIG. 6*c* shows a syntax representation of a channel pair element. A channel pair element comprises core mode information ("core_mode0", "core_mode1"). In addition, the channel pair element may comprise a configuration information "ics_info( )". Additionally, depending on the core mode information, the channel pair element comprises a linear-prediction-domain channel stream or a frequency-domain channel stream associated with a first of the channels, and the channel pair element also comprises a linear-prediction-domain channel stream or a frequency-domain channel stream associated with a second of the channels.

The configuration information "ics_info( )", a syntax representation of which is shown in FIG. 6*d*, comprises a plurality of different configuration information items, which are not of particular relevance for the present invention.

A frequency-domain channel stream ("fd_channel_stream ( )"), a syntax representation of which is shown in FIG. 6*e*, comprises a gain information ("global_gain") and a configuration information ("ics_info ( )"). In addition, the frequency-domain channel stream comprises scale factor data ("scale_factor_data ( )"), which describes scale factors used for the scaling of spectral values of different scale factor bands, and which is applied, for example, by the scaler 150 and the rescaler 240. The frequency-domain channel stream also comprises arithmetically-coded spectral data ("ac_spectral_data ( )"), which represents arithmetically-encoded spectral values.

The arithmetically-coded spectral data ("ac_spectral_data( )"), a syntax representation of which is shown in FIG. 6*f*, comprises an optional arithmetic reset flag ("arith_reset_flag"), which is used for selectively resetting the context, as described above. In addition, the arithmetically-coded spectral data comprise a plurality of arithmetic-data blocks ("arith_data"), which carry the arithmetically-coded spectral values. The structure of the arithmetically-coded data blocks depends on the number of frequency bands (represented by the variable "num_bands") and also on the state of the arithmetic reset flag, as will be discussed in the following.

In the following, the structure of the arithmetically encoded data-block will be described taking reference to FIG. 6*g*, which shows a syntax representation of said arithmetically-coded data-blocks. The data representation within the arithmetically-coded data-block depends on the number 1 g of spectral values to be encoded, the status of the arithmetic reset flag and also on the context, i.e. the previously-encoded spectral values.

The context for the encoding of the current set (e.g., 2-tuple) of spectral values is determined in accordance with the context determination algorithm shown at reference numeral 660.

Details with respect to the context determination algorithm have been explained above, taking reference to FIGS. 5*a* and 5*b*. The arithmetically-encoded data-block comprises 1 g/2 sets of codewords, each set of codewords representing a plurality (e.g., a 2-tuple) of spectral values. A set of codewords comprises an arithmetic codeword "acod_m[pki][m]" representing a most-significant bit-plane value m of the tuple of spectral values using between 1 and 20 bits.

In addition, the set of codewords comprises one or more codewords "acod_r[r]" if the tuple of spectral values involves more bit-planes than the most-significant bit-plane for a correct representation. The codeword "acod_r[r]" represents a less-significant bit-plane using between 1 and 14 bits.

If, however, one or more less-significant bit-planes may be used (in addition to the most-significant bit-plane) for a proper representation of the spectral values, this is signaled by using one or more arithmetic escape codewords ("ARITH_ESCAPE"). Thus, it can be generally said that for a spectral value, it is determined how many bit-planes (the most-significant bit-plane and, possibly, one or more additional less-significant bit-planes) may be used. If one or more less-significant bit-planes may be used, this is signaled by one or more arithmetic escape codewords "acod_m[pki][ARITH_ESCAPE]", which are encoded in accordance with a currently selected cumulative-frequencies-table, a cumulative-frequencies-table-index of which is given by the variable "pki". In addition, the context is adapted, as can be seen at reference numerals 664, 662, if one or more arithmetic escape codewords are included in the bitstream. Following the one or more arithmetic escape codewords, an arithmetic codeword "acod_m[pki][m]" is included in the bitstream, as shown at reference numeral 663, wherein "pki" designates the currently valid probability model index (taking the context adaptation caused by the inclusion of the arithmetic escape codewords into consideration) and wherein m designates the most-significant bit-plane value of the spectral value to be encoded or decoded (wherein m is different from the "ARITH_ESCAPE" codeword).

As discussed above, the presence of any less-significant bit-plane results in the presence of one or more codewords "acod_[r]", each of which represents 1 bit of a least-significant bit-plane of a first spectral value and each of which also represents 1 bit of a least-significant bit-plane of a second spectral value. The one or more codewords "acod_[r]" are encoded in accordance with a corresponding cumulative-frequencies-table, which may, for example, be constant and context-independent. However, different mechanisms for the selection of the cumulative-frequencies-table for the decoding of the one or more codewords "acod_r[r]" are possible.

In addition, it should be noted that the context is updated after the encoding of each tuple of spectral values, as shown at reference numeral 668, such that the context is typically different for encoding and decoding two subsequent tuples of spectral values.

FIG. 6*i* shows a legend of definitions and help elements defining the syntax of the arithmetically encoded data-block.

Moreover, an alternative syntax of the arithmetic data "arith_data( )" is shown in FIG. 6*h*, with a corresponding legend of definitions and help elements shown in FIG. 6*j*.

To summarize the above, a bitstream format has been described, which may be provided by the audio encoder 100 and which may be evaluated by the audio decoder 200. The bitstream of the arithmetically encoded spectral values is encoded such that it fits the decoding algorithm discussed above.

In addition, it should be generally noted that the encoding is the inverse operation of the decoding, such that it can generally be assumed that the encoder performs a table lookup using the above-discussed tables, which is approximately inverse to the table lookup performed by the decoder.

Generally, it can be said that a man skilled in the art who knows the decoding algorithm and/or the desired bitstream syntax will easily be able to design an arithmetic encoder, which provides the data which is defined in the bitstream syntax and may be used by an arithmetic decoder.

Moreover, it should be noted that the mechanisms for determining the numeric current context value and for deriving a mapping rule index value may be identical in an audio encoder and an audio decoder, because it is typically desired that the audio decoder uses the same context as the audio encoder, such that the decoding is adapted to the encoding.

15. Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

16. Conclusions

To conclude, embodiments according to the invention comprise one or more of the following aspects, wherein the aspects may be used individually or in combination.

a) Context State Hashing Mechanism

According to an aspect of the invention, the states in the hash table are considered as significant states and group boundaries. This permits to significantly reduce the size of the tables that may be used.

b). Incremental Context Update

According to an aspect, some embodiments according to the invention comprise a computationally efficient manner for updating the context. Some embodiments use an incremental context update in which a numeric current context value is derived from a numeric previous context value.

c). Context Derivation

According to an aspect of the invention, using the sum of two spectral absolute values is association of a truncation. It is a kind of gain vector quantization of the spectral coefficients (as opposition to the conventional shape-gain vector quantization). It aims to limit the context order, while conveying the most meaningful information from the neighborhood.

Some other technologies, which are applied in embodiments according to the invention, are described in non-prepublished patent applications PCT EP2101/065725, PCT EP2010/065726, and PCT EP 2010/065727. Moreover, in some embodiments according to the invention, a stop symbol is used. Moreover, in some embodiments, only the unsigned values are considered for the context.

However, the above-mentioned non-pre-published International patent applications disclose aspects which are still in use in some embodiments according to the invention.

For example, an identification of a zero-region is used in some embodiments of the invention. Accordingly, a so-called "small-value-flag" is set (e.g., bit 16 of the numeric current context value c).

In some embodiments, the region-dependent context computation may be used. However, in other embodiments, a region-dependent context computation may be omitted in order to keep the complexity and the size of the tables reasonably small.

Moreover, the context hashing using a hash function is an important aspect of the invention. The context hashing may be based on the two-table concept which is described in the above-referenced non-pre-published International patent applications. However, specific adaptations of the context hashing may be used in some embodiments in order to increase the computational efficiency. Nevertheless, in some other embodiments according to the invention, the context hashing which is described in the above-referenced non-pre-published International patent applications may be used.

Moreover, it should be noted that the incremental context hashing is rather simple and computationally efficient. Also, the context-independence from the sign of the values, which is used in some embodiments of the invention, helps to simplify the context, thereby keeping the memory requirements reasonably low.

In some embodiments of the invention, a context derivation using the sum of two spectral values and a context limitation is used. These two aspects can be combined. Both aim to limit the context order by conveying the most meaningful information from the neighborhood.

In some embodiments, a small-value-flag is used which may be similar to an identification of a group of a plurality of zero values.

In some embodiments according to the invention, an arithmetic stop mechanism is used. The concept is similar to the usage of a symbol "end-of-block" in JPEG, which has a comparable function. However, in some embodiments of the invention, the symbol ("ARITH_STOP") is not included explicitly in the entropy coder. Instead, a combination of already existing symbols, which could not occur previously, is used, i.e. "ESC+0". In other words, the audio decoder is configured to detect a combination of existing symbols, which are not normally used for representing a numeric value, and to interpret the occurrence of such a combination of already existing symbols as an arithmetic stop condition.

An embodiment according to the invention uses a two-table context hashing mechanism.

To further summarize, some embodiments according to the invention may comprise one or more of the following four main aspects.

- extended context for detecting either zero-regions or small amplitude regions in the neighborhood;
- context hashing;
- context state generation: incremental update of the context state; and
- context derivation: specific quantization of the context values including summation of the amplitudes and limitation.

To further conclude, one aspect of embodiments according to the present invention lies in an incremental context update. Embodiments according to the invention comprise an efficient concept for the update of the context, which avoids the extensive calculations of the working draft (for example, of the working draft 5). Rather, simple shift operations and logic operations are used in some embodiments. The simple context update facilitates the computation of the context significantly.

In some embodiments, the context is independent from the sign of the values (e.g., the decoded spectral values). This independence of the context from the sign of the values brings along a reduced complexity of the context variable. This concept is based on the finding that a neglect of the sign in the context does not bring along a severe degradation of the coding efficiency.

According to an aspect of the invention, the context is derived using the sum of two spectral values. Accordingly, the memory requirements for storage of the context are significantly reduced. Accordingly, the usage of a context value, which represents the sum of two spectral values, may be considered as advantageous in some cases.

Also, the context limitation brings along a significant improvement in some cases. In addition to the derivation of the context using the sum of two spectral values, the entries of the context array "q" are limited to a maximum value of "0xF" in some embodiments, which in turn results in a limitation of the memory requirements. This limitation of the values of the context array "q" brings along some advantages.

In some embodiments, a so-called "small value flag" is used. In obtaining the context variable c (which is also designated as a numeric current context value), a flag is set if the values of some entries "q[1][i−3]" to "q[1][i−1]" are very small. Accordingly, the computation of the context can be performed with high efficiency. A particularly meaningful context value (e.g. numeric current context value) can be obtained.

In some embodiments, an arithmetic stop mechanism is used. The "ARITH_STOP" mechanism allows for an efficient stop of the arithmetic encoding or decoding if there are only zero values left. Accordingly, the coding efficiency can be improved at moderate costs in terms of complexity.

According to an aspect of the invention, a two-table context hashing mechanism is used. The mapping of the context is performed using an interval-division algorithm evaluating the table "ari_hash_m" in combination with a subsequent lookup table evaluation of the table "ari_lookup_m". This algorithm is more efficient than the WD3 algorithm.

In the following, some additional details will be discussed.

It should be noted here that the tables "arith_hash_m[600]" and "arith_lookup_m[600]" are two distinct tables. The first is used to map a single context index (e.g. numeric context value) to a probability model index (e.g., mapping rule index value) and the second is used for mapping a group of consecutive contexts, delimited by the context indices in "arith_hash_m[ ]", into a single probability model.

It should further be noted that table "arith_cf_msb[96][16]" may be used as an alternative to the table "ari_cf_m[96][17]", even though the dimensions are slightly different.

"ari_cf_m[ ][ ]" and "ari_cf_msb[ ][ ]" may refer to the same table, as the $17^{th}$ coefficients of the probability models are zero. It is sometimes not taken into account when counting the space that may be used for storing the tables.

To summarize the above, some embodiments according to the invention provide a proposed new noiseless coding (encoding or decoding), which engenders modifications in the MPEG USAC working draft (for example, in the MPEG USAC working draft 5). Said modifications can be seen in the enclosed figures and also in the related description.

As a concluding remark, it should be noted that the prefix "ari" and the prefix "arith" in names of variables, arrays, functions, and so on, are used interchangeably.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An audio decoder for providing a decoded audio information on the basis of an encoded audio information, the audio decoder comprising:

an arithmetic decoder for providing a plurality of decoded spectral values on the basis of an arithmetically encoded representation of the spectral values comprised in the encoded audio information; and a frequency-domain-to-time-domain converter for providing a time-domain audio representation using the decoded spectral values, in order to acquire the decoded audio information;

wherein the arithmetic decoder is configured to select a mapping rule describing a mapping of a code value of the arithmetically-encoded representation of spectral values onto a symbol code representing one or more of the decoded spectral values, or at least a portion of one or more of the decoded spectral values in dependence on a context state described by a numeric current context value;

wherein the arithmetic decoder is configured to determine the numeric current context value in dependence on a plurality of previously decoded spectral values;

wherein the arithmetic decoder is configured to evaluate a hash table, entries of which define both significant state values amongst the numeric context values and boundaries of intervals of non-significant state values amongst the numeric context values, in order to select the mapping rule, wherein a mapping rule index value is individually associated to a numeric context value being a significant state value, and wherein a common mapping rule index value is associated to different numeric context values laying within one of said intervals bounded by said interval boundaries;

wherein the audio decoder is implemented by a hardware apparatus, or by a computer, or by a combination of a hardware apparatus and a computer.

2. The audio signal decoder according to claim 1, wherein the arithmetic decoder is configured to compare the numeric current context value, or a scaled version of the numeric current context value, with a plurality of numerically ordered entries of the hash table, to acquire a hash table index value of a hash table entry, such that the numeric current context value lies within an interval defined by the hash table entry designated by the acquired hash table index value and an adjacent hash table entry; and wherein the arithmetic decoder is configured to determine whether the numeric current context value equals to a value defined by an entry of the hash table designated by the acquired hash table index value, and to selectively provide, in dependence on a result of the determination, a mapping rule index value individually associated to a numeric current context value defined by the entry of the hash table designated by the acquired hash table index value, or a mapping rule index value designated by the acquired hash table index value and associated to different numeric current context values within an interval bounded, at one side, by a state value defined by the entry of the hash table designated by the acquired hash table index value.

3. The audio decoder according to claim 1, wherein the arithmetic decoder is configured to determine, using the hash table, whether the numeric current context value is equal to an interval boundary state value defined by an entry of the hash table, or lies within an interval defined by two entries of the hash table;

wherein the arithmetic decoder is configured to provide a mapping rule index value associated with an entry of the hash table, if it is found that the numeric current context value is equal to an interval boundary state value, and to provide a mapping rule index value associated with an interval between state values defined by two adjacent entries of the hash table, if it is found that the numeric current context value lies within an interval between state values defined by two adjacent entries of the hash table; and wherein the arithmetic decoder is configured to select a cumulative frequencies table for the arithmetic decoder in dependence on the mapping rule index value.

4. The audio decoder according to claim 1, wherein a mapping rule index value associated with a first given entry of the hash table is different from a mapping rule index value associated with a first interval of context values, an upper boundary of which is defined by the first given entry of the hash table, and also different from a mapping rule index value associated with a second interval of context values, a lower boundary of which is defined by the first given entry of the hash table, such that the first given entry of the hash tables defines, by a single value, boundaries of two intervals of the numeric current context value and a significant state value of the numeric current context value.

5. The audio decoder according to claim 4, wherein the mapping rule index value associated with the first interval of context values is equal to the mapping rule index value associated with the second interval of context values, such that the first given entry of the hash table defines an isolated significant state within a two-sided environment of non-significant state values.

6. The audio decoder according to claim 4, wherein a mapping rule index value associated with a second given entry of the hash table is identical to a mapping rule index value associated with a third interval of context values, a boundary of which is defined by the second given entry of the hash table, and different from a mapping rule index value associated with a fourth interval of context values, a boundary of which is defined by the second given entry of the hash table, such that the second given entry of the hash table defines a boundary between two intervals of the numeric current context value without defining a significant state value of the numeric current context value.

7. The audio decoder according to claim 1, wherein the arithmetic decoder is configured to evaluate a single hash table, numerically ordered entries of which define both significant state values of the numeric current context value and boundaries of intervals of the numeric current context value, to acquire a hash table index value designating an interval, out of the intervals defined by the entries of the hash table, in which the numeric current context value lies, and to subsequently determine, using the table entry designated by the acquired hash table index value, whether the numeric current context value takes a significant state value or a non-significant state value.

8. The audio decoder according to claim 1, wherein the arithmetic decoder is configured to selectively evaluate a mapping table, which maps interval index values onto mapping rule index values, if it is found that the numeric current context value does not take a significant state value, to acquire a mapping rule index value associated with an interval of non-significant state values within which the numeric current context value lies.

9. The audio decoder according to claim 1, wherein the entries of the hash table are numerically ordered, wherein the arithmetic decoder is configured to evaluate a sequence of entries of the hash table, to acquire a result hash table index value of a hash table entry, such that the numeric current context value lies within an interval defined by the hash table entry designated by the acquired result hash table index value and an adjacent hash table entry;

wherein the arithmetic decoder is configured to perform a predetermined number of iterations in order to iteratively determine the result hash table index value;

wherein each iteration comprises only a single comparison between a state value represented by a current entry of the hash table and a state value represented by the numeric current context value, and a selective update of a current hash table index value in dependence on a result of said single comparison.

10. The audio decoder according to claim 9, wherein the arithmetic decoder is configured to distinguish between a numeric current context value which comprises a significant state value and a numeric current context value which comprises a non-significant state value only after the execution of the predetermined number of iterations.

11. The audio decoder according to claim 1, wherein the arithmetic decoder is configured to evaluate the hash table using the algorithm:

```
for (k=0;k<kmax;k++)
{
    i=i__min+i__diff[k];
    j=ari__hash__m[i];
    if (s>j)
    {
        i__min=i+1;
    }
}
```

wherein k is a running variable;

wherein kmax designates a predetermined number of iterations;

wherein i is a variable describing a current hash table index value;

wherein i_min is a variable initialized to designate a hash table index value of a first entry of the hash table and selectively updated in dependence on a comparison between s and j;

wherein ari_hash_m designates the hash table;

wherein ari_hash_m[i] designates an entry of the hash table comprising hash table index value i;

wherein s designates a variable representing the numeric current context value or a scaled version thereof; and wherein i_diff[k] designates a step size for an adaptation of the current hash table index value in a k-th iteration.

12. The audio decoder according to claim 11, wherein the arithmetic decoder is further configured to acquire the mapping rule index value as a return value according to:

```
j=ari__hash__m[i__min];
if (s>j)
    return (ari__lookup__m[i__min+1];
else if (c<(j>>8))
    return (ari__lookup__m[i__min]);
else
    return (j&0xFF);
```

wherein i_min is acquired as result of the evaluation of the hash table;

wherein ari_lookup_m is a table describing mapping rule index values associated with different intervals of the numeric current context value for non-significant values of the numeric current context value;

wherein ari_lookup_m[i_min+1] designates an entry of the table "ari_lookup_m" comprising an entry index i_min+1;

wherein ari_lookup_m[i_min] designates an entry of the table "ari_lookup_m" comprising an entry index i_min;

wherein the condition "s>j" defines that a state value described by variable s is larger than a state value described by the table entry ari_hash_m[i_min];

wherein the condition "c<(j>>8)" defines that a state value described by the variable s is smaller than a state value described by the table entry ari_hash_m[i_min]; and wherein "j&0xFF" describes a mapping rule index value described by the table entry ari_hash_m[i_min].

13. The audio decoder according to claim 1, wherein the arithmetic decoder is configured to evaluate the hash table using the algorithm:

```
while ((i__max-i__min)>1) {
    i = i__min+((i__max-i__min)/2);
    j = ari__hash__m[i];
    if (c<(j>>8))
        i__max = i;
    else if (c>(j>>8))
        i__min=i;
    else
        return(j&0xFF);
}
return ari__lookup__m[i__max];
```

wherein c is a variable describing the numeric current context value;

wherein i_min is a variable initialized to take a value which is smaller, by 1, than a hash table index value of a first entry of the hash table and selectively updated in dependence on a comparison between c and a state value j>>8 described by a hash table entry j=ari_hash_m[i];

wherein i_max is a variable initialized to designate a hash table index value of a last entry of the hash table and selectively updated in dependence on a comparison between c and a state value j>>8 described by a hash table entry j=ari_hash_m[i];

wherein i is a variable describing a current hash table index value;

wherein ari_hash_m designates the hash table;

wherein ari_hash_m[i] designates an entry of the hash table comprising hash table index value i;

wherein the condition "c<(j>>8)" defines that a state value described by the variable c is smaller than a state value described by the table entry j=ari_hash_m[i];

wherein the condition "c>(j>>8)" defines that a state value described by the variable c is larger than a state value described by the table entry j=ari_hash_m[i]; and wherein "j&0xFF" describes a mapping rule index value described by the table entry j=ari_hash_m[i].

14. An audio encoder for providing an encoded audio information on the basis of an input audio information, the audio encoder comprising:

an energy-compacting time-domain-to-frequency-domain converter for providing a frequency-domain audio representation on the basis of a time-domain representation of the input audio information, such that the frequency-domain audio representation comprises a set of spectral values; and an arithmetic encoder configured to encode a spectral value or a preprocessed version thereof using a variable length codeword, wherein the arithmetic encoder is configured to map one or more spectral values, or a value of a most significant bit-plane of one or more spectral values, onto a code value, wherein the arithmetic encoder is configured to select a mapping rule describing a mapping of one or more spectral values, or of a most significant bit-plane of one or more spectral values, onto a code value, in dependence on a context state described by a numeric current context value; and wherein the arithmetic encoder is configured to determine the numeric current context value in dependence on a plurality of previously-encoded spectral values; and wherein the arithmetic encoder is configured to evaluate a hash table, entries of which define both significant state values amongst the numeric context values and boundaries of intervals of non-significant state values amongst the numeric context values, wherein a mapping rule index value is individually associated to a numeric context value being a significant state value, and wherein a common mapping rule index value is associated to different numeric context values laying within one of said intervals bounded by said interval boundaries;

wherein the encoded audio information comprises a plurality of variable-length codewords;

wherein the audio encoder is implemented by a hardware apparatus, or by a computer, or by a combination of a hardware apparatus and a computer.

15. A method for providing a decoded audio information on the basis of an encoded audio information, the method comprising:

providing a plurality of decoded spectral values on the basis of an arithmetically-encoded representation of the spectral values comprised in the encoded audio information; and providing a time-domain audio representation using the decoded spectral values, in order to acquire the decoded audio information;

wherein providing the plurality of decoded spectral values comprises selecting a mapping rule describing a mapping of a code value of the arithmetically-encoded representation of spectral values onto a symbol code representing one or more of the decoded spectral values, or a most significant bit-plane of one or more of the decoded spectral values in dependence on a context state described by a numeric current context value; and wherein the numeric current context value is determined in dependence on a plurality of previously decoded spectral values;

wherein a hash table, entries of which define both significant state values amongst the numeric context values and boundaries of intervals of non-significant state values amongst the numeric context values, is evaluated, wherein a mapping rule index value is individually associated to a numeric context value being a significant state value, and wherein a common mapping rule index value is associated to different numeric context values laying within one of said intervals bounded by said interval boundaries;

wherein providing a plurality of decoded spectral values and providing a time-domain audio representation are performed using a hardware apparatus, or using a computer, or using a combination of a hardware apparatus and a computer.

16. A method for providing an encoded audio information on the basis of an input audio information, the method comprising:

providing a frequency-domain audio representation on the basis of a time-domain representation of the input audio information using an energy-compacting time-domain-to-frequency-domain conversion, such that the frequency-domain audio representation comprises a set of spectral values; and arithmetically encoding a spectral value, or a preprocessed version thereof, using a variable-length codeword, wherein one or more spectral values or a value of a most significant bit-plane of one or more spectral values is mapped onto a code value;

wherein a mapping rule describing a mapping of one or more spectral values, or of a most significant bit-plane of one or more spectral values, onto a code value is selected in dependence on a context state described by a numeric current context value;

wherein the numeric current context value is determined in dependence on a plurality of previously-encoded adjacent spectral values;

wherein a hash table, entries of which define both significant state values amongst the numeric context values and boundaries of intervals of non-significant state values amongst the numeric context values, is evaluated, wherein a mapping rule index value is individually associated to a numeric current context value being a significant state value, and wherein a common mapping rule index value is associated to different numeric context values laying within one of said intervals bounded by said interval boundaries;

wherein the encoded audio information comprises a plurality of variable length codewords;

wherein providing a frequency-domain audio representation and arithmetically encoding a spectral value, or a preprocessed version thereof, are performed using a hardware apparatus, or using a computer, or using a combination of a hardware apparatus and a computer.

17. A non-transitory computer readable medium comprising a computer program for performing the method according to claim 15, when the computer program runs on a computer.

18. A non-transitory computer readable medium comprising a computer program for performing the method according to claim 16, when the computer program runs on a computer.

* * * * *

UNITED STATES PATENT AND TRADEMARK OFFICE

CERTIFICATE OF CORRECTION

PATENT NO. : 8,645,145 B2
APPLICATION NO. : 13/547600
DATED : February 4, 2014
INVENTOR(S) : Vignesh Subbaraman et al.

It is certified that error appears in the above-identified patent and that said Letters Patent is hereby corrected as shown below:

Title Page, item (73) Assignee:

Fraunhoffer-Gesellschaft zur Foerderung der Angewandten Forschung E.V.

should be:

Fraunhofer-Gesellschaft zur Foerderung der angewandten Forschung e.V.

Signed and Sealed this
Eleventh Day of November, 2014

Michelle K. Lee

Michelle K. Lee
*Deputy Director of the United States Patent and Trademark Office*